US 6,707,616 B1

(12) United States Patent
Takahashi et al.

(10) Patent No.: US 6,707,616 B1
(45) Date of Patent: Mar. 16, 2004

(54) PROJECTION EXPOSURE APPARATUS, PROJECTION EXPOSURE METHOD AND CATADIOPTRIC OPTICAL SYSTEM

(75) Inventors: Tomowaki Takahashi, Yokohama (JP); Hiroyuki Tsukamoto, Kawasaki (JP)

(73) Assignee: Nikon Corporation, Tokyo (JP)

( * ) Notice: Subject to any disclaimer, the term of this patent is extended or adjusted under 35 U.S.C. 154(b) by 229 days.

(21) Appl. No.: 09/680,316

(22) Filed: Oct. 6, 2000

Related U.S. Application Data

(63) Continuation of application No. PCT/JP99/01807, filed on Apr. 6, 1999.

(30) Foreign Application Priority Data

Apr. 7, 1998 (JP) .......................... 10-111506
Dec. 25, 1998 (JP) .......................... 10-369233

(51) Int. Cl.⁷ .............................................. G02D 13/00
(52) U.S. Cl. .................................... 359/649; 359/726
(58) Field of Search .................................. 359/726, 619

(56) References Cited

U.S. PATENT DOCUMENTS

| | | | | |
|---|---|---|---|---|
| 4,060,312 A | 11/1977 | Linke et al. | ............... | 350/189 |
| 4,688,904 A | 8/1987 | Hirose et al. | ............... | 350/443 |
| 4,812,028 A | 3/1989 | Matsumoto | ................. | 350/444 |
| 4,861,148 A | 8/1989 | Sato et al. | ................... | 350/505 |
| 4,891,663 A | 1/1990 | Hirose | .......................... | 355/53 |
| 4,977,426 A | 12/1990 | Hirose | .......................... | 355/53 |
| 5,063,586 A | * 11/1991 | Jewell et al. | .................. | 378/34 |
| 5,159,172 A | 10/1992 | Goodman et al. | ..... | 219/151.68 |
| 5,559,584 A | 9/1996 | Miyaji et al. | .................. | 355/73 |
| 5,636,066 A | 6/1997 | Takahashi | .................... | 359/726 |
| 5,689,377 A | 11/1997 | Takahashi | .................... | 359/727 |
| 5,691,802 A | 11/1997 | Takahashi | .................... | 355/53 |
| 5,694,241 A | 12/1997 | Ishiyama et al. | ............ | 359/364 |
| 5,805,334 A | 9/1998 | Takahashi | .................... | 359/364 |
| 5,808,805 A | 9/1998 | Takahashi | .................... | 359/651 |
| 5,835,275 A | 11/1998 | Takahashi et al. | ........... | 359/629 |
| 5,835,284 A | 11/1998 | Takahashi et al. | ........... | 359/726 |
| 5,861,997 A | 1/1999 | Takahashi | .................... | 359/727 |
| 5,877,843 A | 3/1999 | Takagi et al. | .................. | 355/30 |
| 5,883,704 A | 3/1999 | Nishi et al. | ..................... | 355/67 |
| 5,969,882 A | 10/1999 | Takahashi | .................... | 359/728 |
| 6,097,537 A | 8/2000 | Takahashi et al. | ........... | 359/364 |
| 6,157,498 A | 12/2000 | Takahashi | .................... | 359/728 |

FOREIGN PATENT DOCUMENTS

| | | |
|---|---|---|
| EP | 0 660 188 B1 | 6/1995 |
| EP | 0 816 892 A2 | 1/1998 |
| JP | 61-129828 | 6/1986 |
| JP | 4-251812 | 9/1992 |
| JP | 6-260385 | 9/1994 |
| JP | 7-209569 | 8/1995 |
| JP | 7-321005 | 12/1995 |
| JP | 8-17720 | 1/1996 |

(List continued on next page.)

OTHER PUBLICATIONS

Owen et al., "A catadioptric Reduction Camera for Deep UV Microlithography", *Microelectronic Engineering*, vol. 11, Apr. 1, 1990, pp. 219–222.

*Primary Examiner*—Scott J. Sugarman
(74) *Attorney, Agent, or Firm*—Miles & Stockbridge P.C.

(57) ABSTRACT

A projection exposure apparatus has an illumination optical system 3 for illuminating a mask formed with a pattern with beams of radiation, and a projection optical system for forming an image of the pattern on a workpiece on the basis of radiation from the mask. The illumination optical system supplies an illumination radiation having a center wavelength of 180 nm or smaller, and the projection optical system includes at least one concave mirror, fifteen or less pieces of refracting lenses, and four or more aspherical surfaces.

104 Claims, 24 Drawing Sheets

FOREIGN PATENT DOCUMENTS

| | | |
|---|---|---|
| JP | 8-279458 | 10/1996 |
| JP | 8-334695 | 12/1996 |
| JP | 9-82625 | 3/1997 |
| JP | 9-134865 | 5/1997 |
| JP | 9-162117 | 6/1997 |
| JP | 9-246130 | 9/1997 |
| JP | 9-246139 | 9/1997 |
| JP | 9-311277 | 12/1997 |
| JP | 10-3039 | 1/1998 |
| JP | 10-10429 | 1/1998 |
| JP | 10-10430 | 1/1998 |
| JP | 10-10431 | 1/1998 |
| JP | 10-20195 | 1/1998 |
| JP | 10-20197 | 1/1998 |
| JP | 10-284365 | 10/1998 |
| JP | 10-308345 | 11/1998 |
| JP | 11-109244 | 4/1999 |

\* cited by examiner

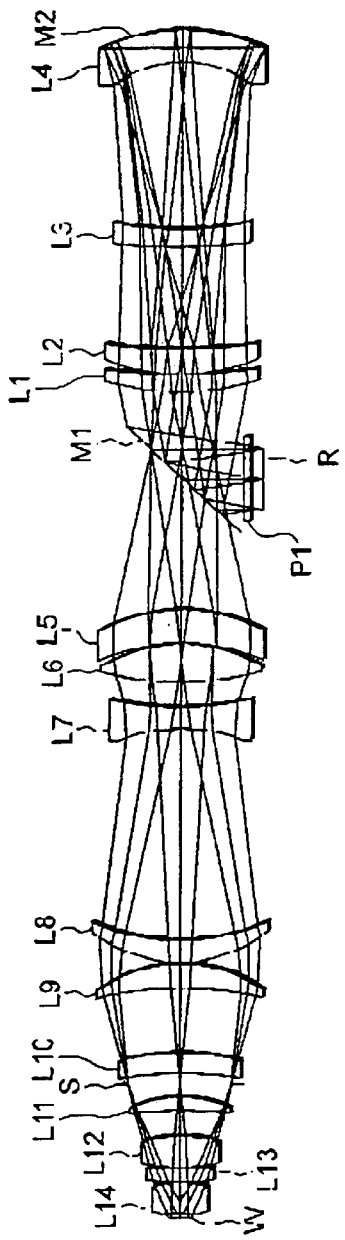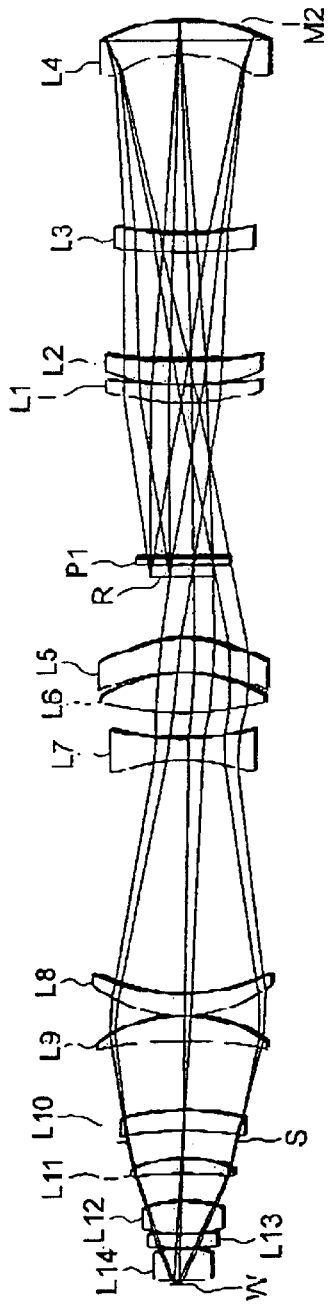
FIG. 4A
FIG. 4B

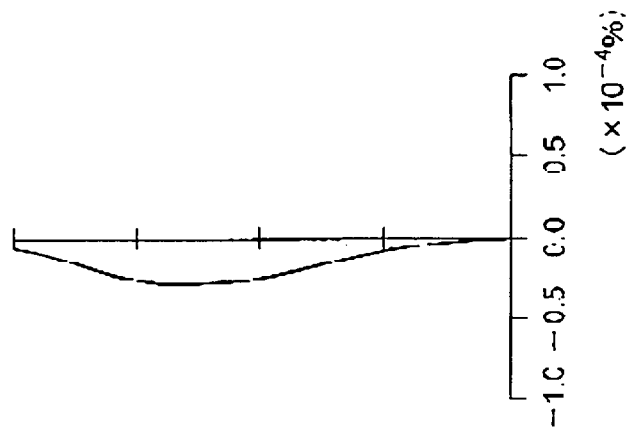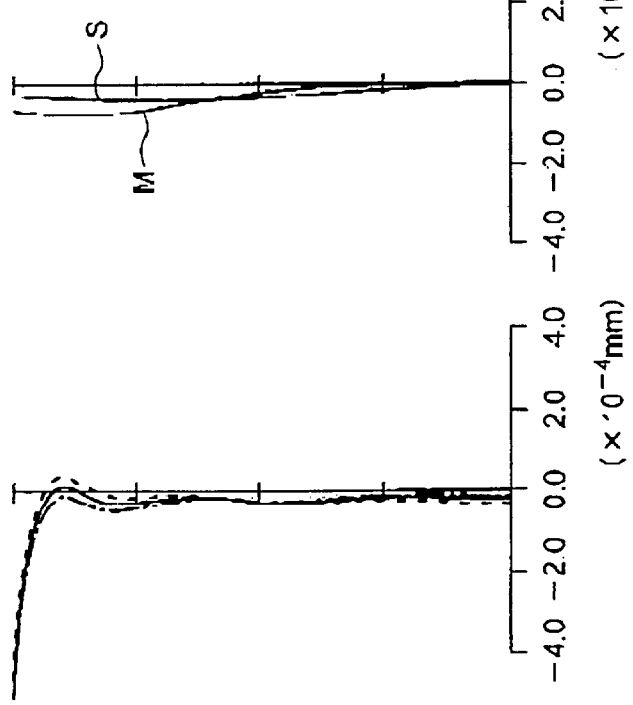

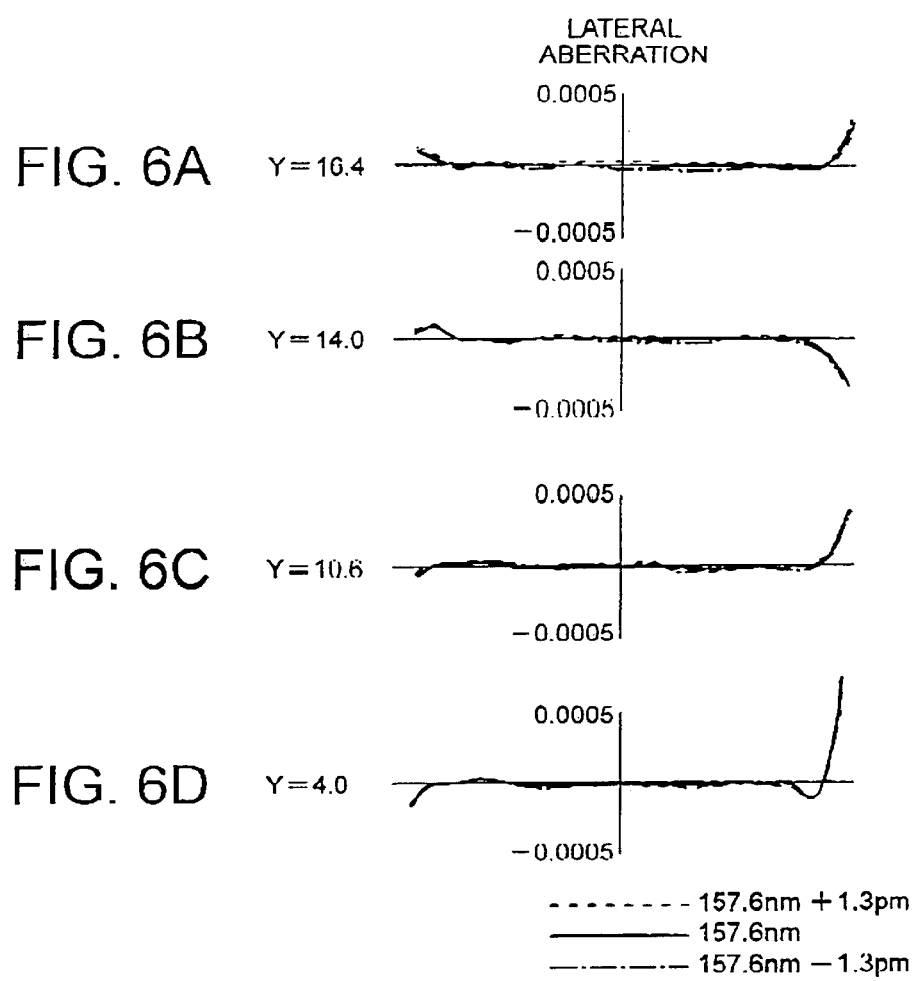

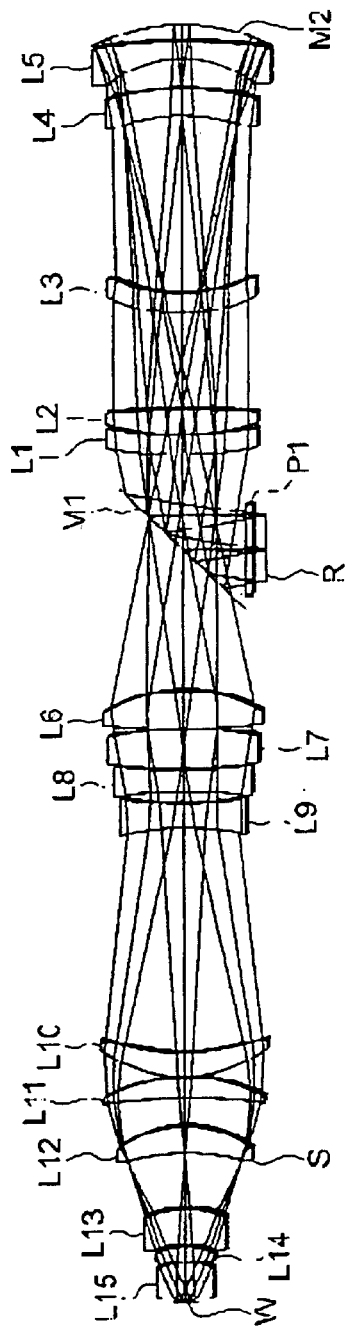
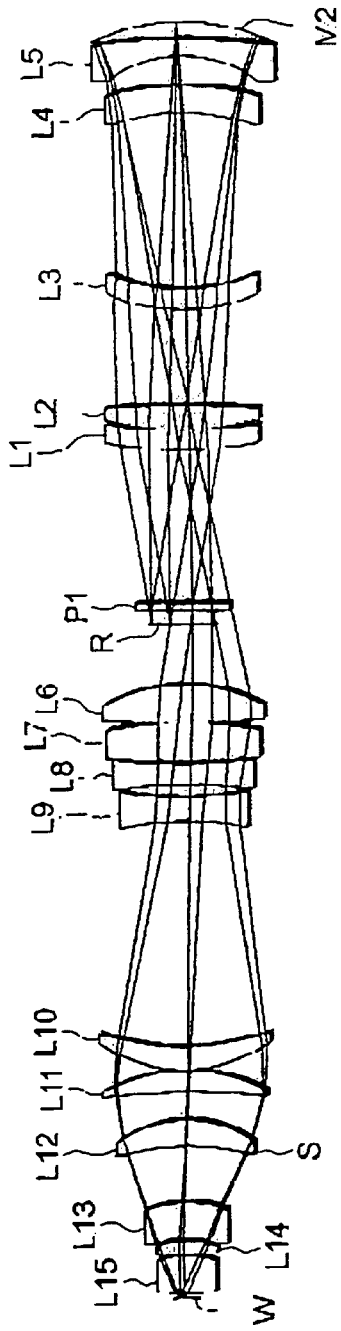
FIG. 7A
FIG. 7B

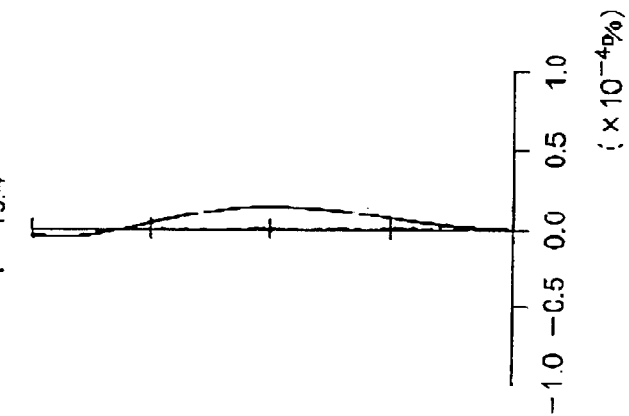
FIG. 8A SPHERICAL ABERRATION NA=0.65
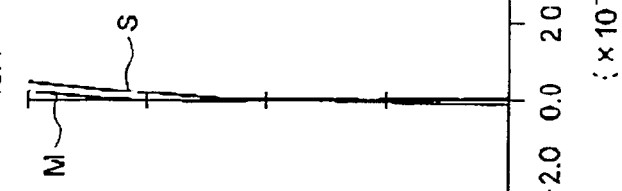
FIG. 8B ASTIGMATISM Y=16.4
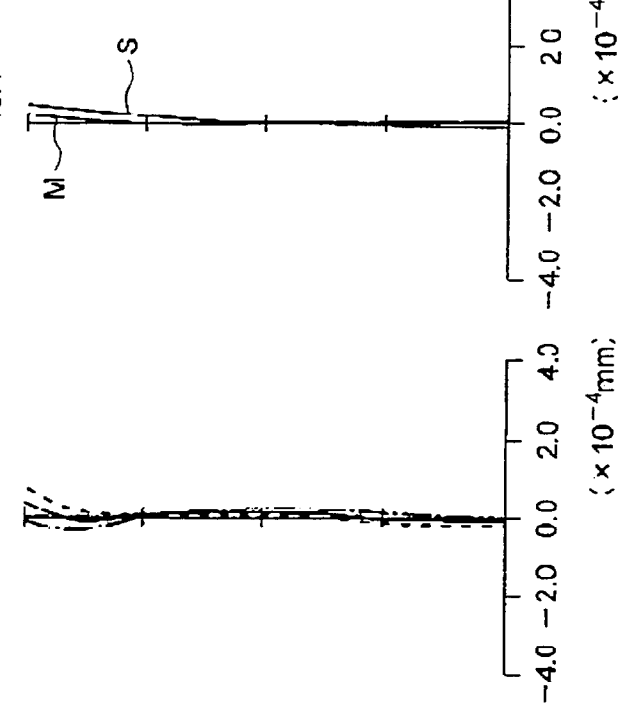
FIG. 8C DISTORTION Y=13.4

LATERAL ABERRATION
FIG. 9A  Y=16.4
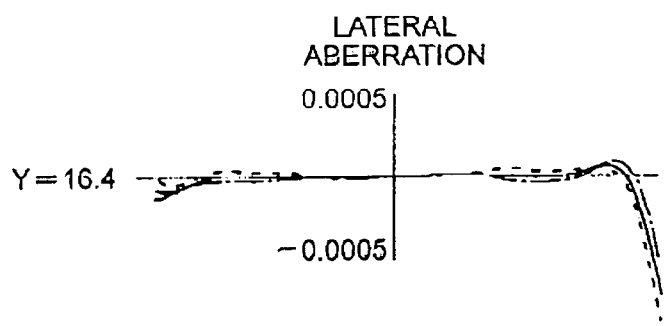
FIG. 9B  Y=14.0
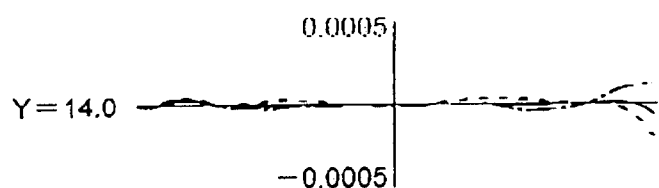
FIG. 9C  Y=10.6
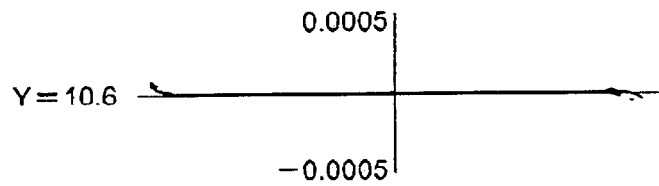
FIG. 9D  Y=4.0
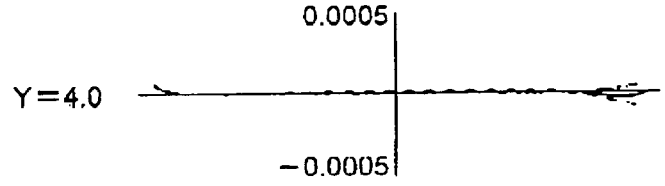
- - - - - - 157.6nm +8.6pm
———— 157.6nm
—·—·— 157.6nm −8.6pm

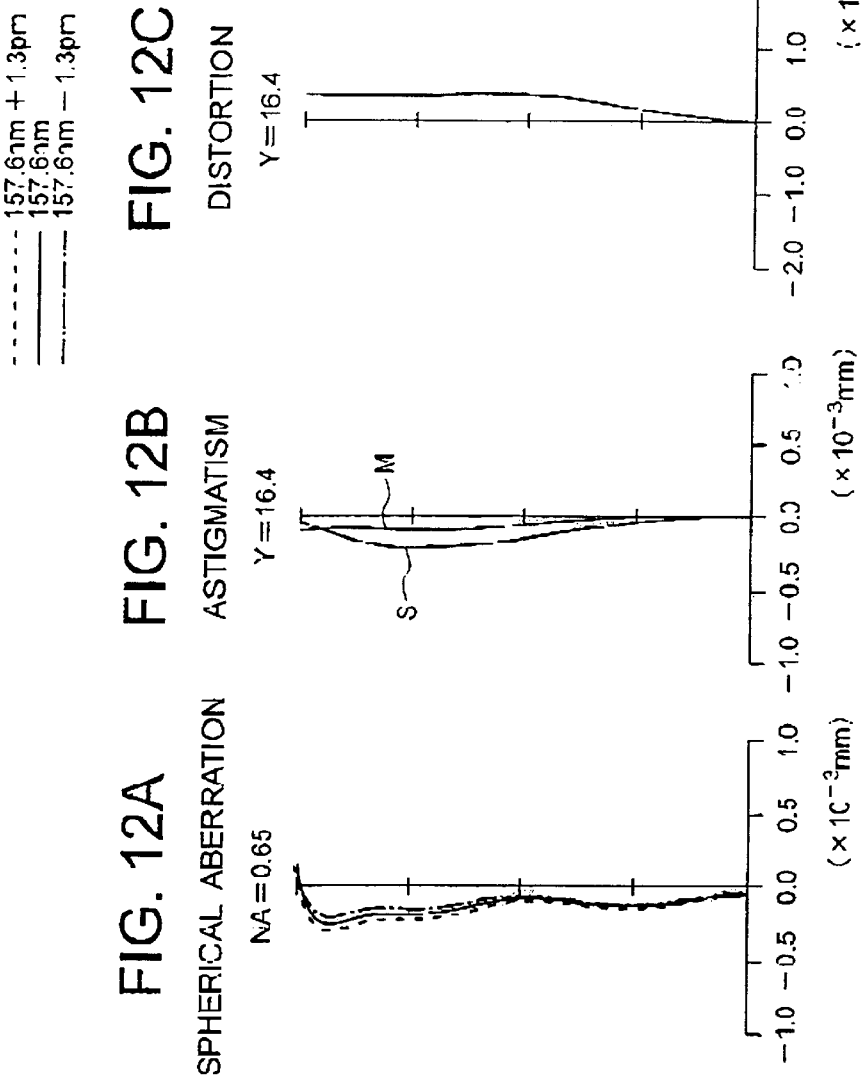

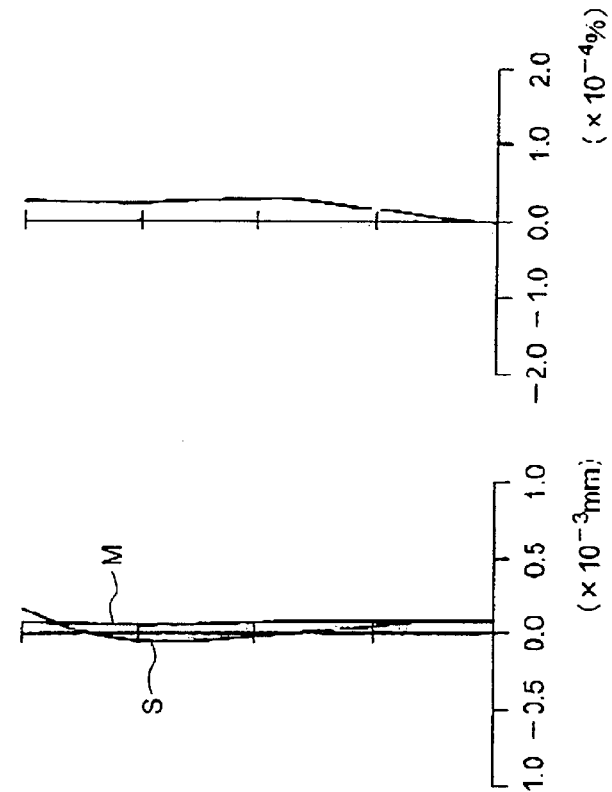
FIG. 15A SPHERICAL ABERRATION
FIG. 15B ASTIGMATISM
FIG. 15C DISTORTION

SPHERICAL ABERRATION
NA=0.5

ASTIGMATISM
Y=13.2

DISTORTION
Y=13.2

Y=13.2

Y=12.0

Y=9.0

Y=4.0

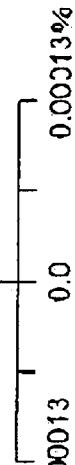
FIG. 21C
DISTORTION
Y=13.2
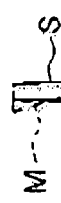
FIG. 21B
ASTIGMATISM
Y=13.2
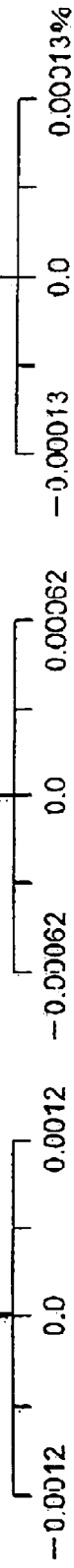
FIG. 21A
SPHERICAL ABERRATION
NA=0.6

Y=13.2

Y=12.0

Y=9.0

Y=3.0

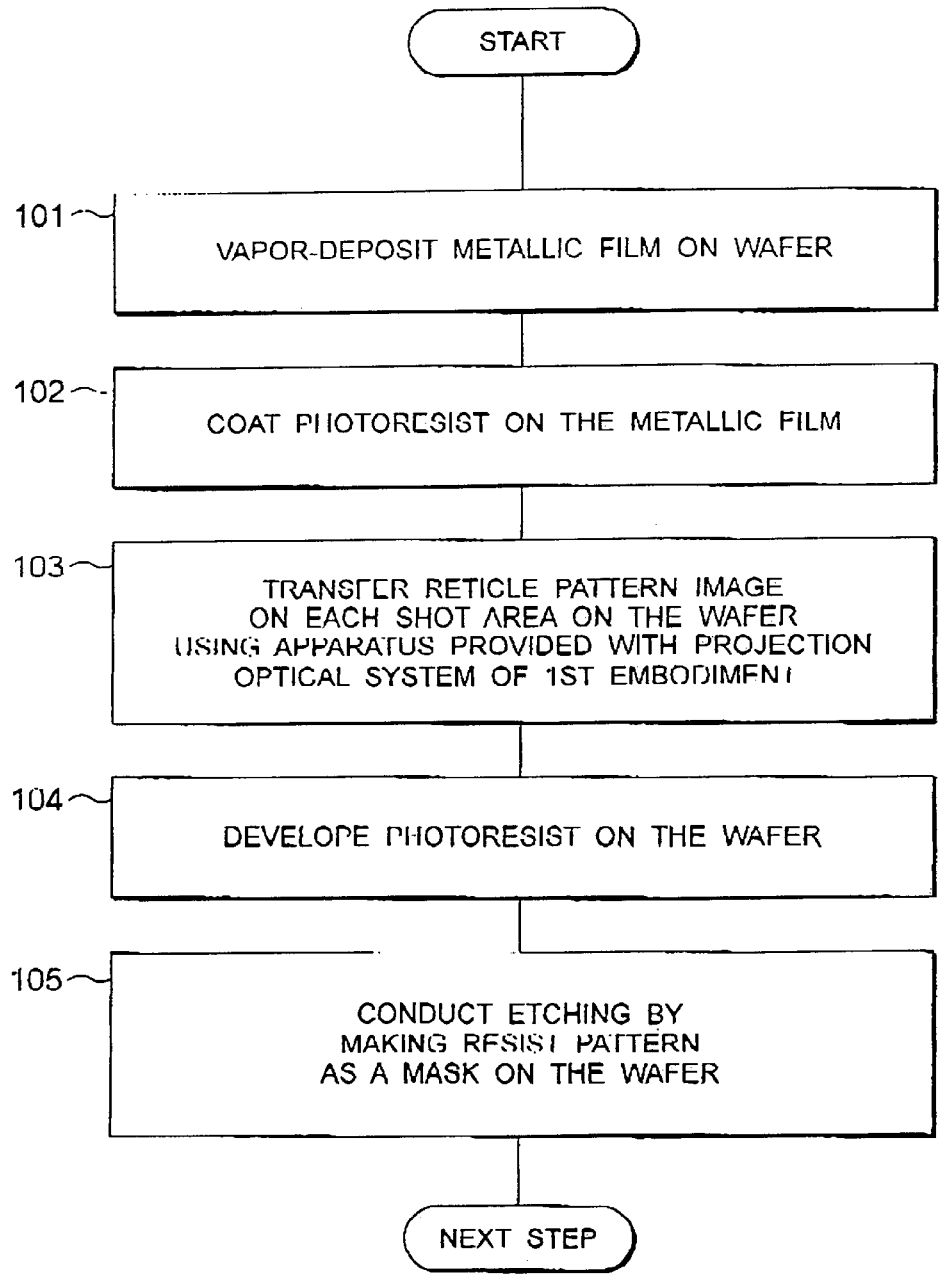

PROJECTION EXPOSURE APPARATUS, PROJECTION EXPOSURE METHOD AND CATADIOPTRIC OPTICAL SYSTEM

This application is a continuation of International application PCT/JP99/01807 and Japanese Patent application Nos. 10-111506 and 10-369233 which are hereby incorporated by reference.

1. Field of the Invention

The present invention relates to a projection exposure apparatus used in a lithography process in a line of manufacturing a semiconductor device, an imaging device such as a CCD etc, a liquid crystal display device, or a device such as a thin-film magnetic head etc. The present invention relates also to a catadioptric optical system used as a projection optical system of the this type of projection exposure apparatus. The present invention relates further to a projection exposure method using this type of projection exposure apparatus in the lithography process.

2. Related Background Art

A reduction type projection exposure apparatus is widely used for manufacturing an integrated circuit such as an LSI. In the reduction type projection exposure apparatus, a reduced image of a mask pattern is formed on a wafer classified as a photosensitive substrate through the projection optical system. Over the recent years, a pattern of the integrated circuit, which is projection-exposed on a semiconductor substrate, has become increasingly hyperfine, and it has been required that a resolution of the projection exposure apparatus be further enhanced.

The further enhancement of the resolution of the projection exposure apparatus entails increasing a numerical aperture (NA) of the projection optical system and decreasing a wavelength of exposure radiation. It is, however, difficult in terms of a geometry of the optical system that the numerical aperture NA of the projection optical system is set to a predetermined value or greater. Further, if NA of the projection optical system is increased, a depth of focus usable decreases. As a result, it is difficult to actualize a theoretically attainable resolution. Therefore, in fact, what is strongly demanded is a reduction in the wavelength of exposure radiation in order to enhance the resolution of the projection exposure apparatus.

A KrF excimer laser of which a wavelength is 248 nm and an ARF excimer laser having a wavelength of 193 nm, have hitherto been proposed as radiation (light) sources for exposure. Further, utilization of a radiation (light) source having a wavelength as short as 180 nm or less is on the examination.

For example, an $F_2$ laser having an oscillation wavelength of 157 nm exists as a radiation source for emitting an exposure radiation of which a wavelength is 180 nm or smaller. In the case of using this type of radiation source, however, the following problems arise. First, there are an extremely limited kind of glasses that transmit beams having the wavelength of 180 nm or under. Second, there are very few substances appropriate to be taken for an anti-reflection film, and hence it is difficult to form a preferable anti-reflection film. Consequently, a radiation reflectance on each lens surface increases, with the result that a sharp drop in radiation quantity occurs especially in a high-resolution projection optical system requiring a larger number of lenses.

Further, there are limited types of refracting optical members usable for short wavelength beams having a wavelength as short as 180 nm. Such being the case, a chromatic aberration occurred depending on a wavelength width of the laser beams must be eliminated (corrected) under such a condition that only the limited types of glass materials (optical materials) can be used for the refracting optical member.

By the way, in the case of the $F_2$ laser, there exist neither a refracting optical member nor a reflecting optical member with a small loss of radiation quantity in its oscillation wavelength band. Consequently, it seems more difficult to narrow the band on a large scale with respect to the $F_2$ laser than in the case of a KrF excimer laser and an ArF excimer laser. An intensity of the $F_2$ laser that has already been utilized is small, and consequently an intensity of the exposure radiation, and more essentially, an exposure speed tend to further decrease by narrowing the band. In other words, the $F_2$ laser has a larger influence caused by the decrease in the exposure speed due to the narrowed band than other types of lasers.

A natural wavelength width of the $F_2$ laser having a wavelength of 157.6 nm is, however, by far smaller than a natural wavelength width of the ARF excimer laser etc, and hence a full width half maximum of the $F_2$ laser can be reduced down to 20 pm or under by slightly narrowing the band. For instance, Lambda Physik, Inc. (Germany) utilized an $F_2$ laser of which a full width half maximum is 10 pm and an output is 10 W as NovaLine TMF500 by comparatively simply narrowing the band. Then, in the projection exposure apparatus using the $F_2$ laser as a radiation source for exposure, it is desired that laser beams having a full width half maximum of this degree in order to increase an exposure efficiency and avoid an intricacy of the laser device due to the narrowed band. In this case, in the projection optical system, the chromatic aberration must be eliminated in a broader band over a wavelength width on the order of 10 pm–20 pm than in the prior art. Note that the band can be narrowed to such a degree that the full width half maximum is approximately 2 pm by adding a band narrowing element with respect to the $F_2$ laser.

As explained above, however, the types of the glass materials utilizable are strictly limited in the wavelength region of 180 nm or under, so that it is difficult to sufficiently eliminate the chromatic aberration in the dioptric optical system. Further, an internal absorption and a surface reflection might occur in the lens elements in this wavelength region, and therefore, if the number of the lens elements increases, a radiation transmittance in the optical system conspicuously declines.

For example, the short wavelength beams of 180 nm or smaller such as the $F_2$ laser beams exhibit a high absorption rate by air (oxygen). Hence, in the projection exposure apparatus using, e.g., the $F_2$ laser as an exposure radiation source, it is required that the air in the optical system be replaced with a gas hard to absorb an exposure radiation (illumination radiation), i.e., an inert gas such as helium etc in order to prevent the decline of the transmittance of the optical system by avoiding the radiation absorption by the air.

SUMMARY OF THE INVENTION

It is a first object of the present invention to restrain a decrease in loss of radiation quantity down to its minimum while attaining a high resolution in the case of using an exposure radiation having a wavelength of 180 nm or smaller.

It is a second object of the present invention to attain a high resolution while restraining a decrease in loss of radiation quantity by correcting well a chromatic aberration with limited kinds of optical materials in the case of using an exposure radiation having a wavelength of 180 nm or smaller.

It is a third object of the present invention to ensure a high transmittance of a projection optical system by avoiding well a radiation absorption with a gas exhibiting a low degree of cleanness in the case of using an exposure radiation having a wavelength of 180 nm or smaller.

It is a fourth object of the present invention to preferably form a hyperfine pattern by restraining a decline of an image forming performance even when trying to increase a numerical aperture and enlarge an exposure area.

To accomplish the first object, according to a first aspect of the present invention, a projection exposure apparatus comprises an illumination optical system for illuminating a mask formed with a pattern with beams of radiation, and a projection optical system for forming an image of the pattern on a workpiece on the basis of beams from the mask. Then, the illumination optical system supplies an illumination radiation having a center wavelength of 180 nm or smaller, and the projection optical system includes at least one concave mirror, fifteen or less pieces of refracting lenses, and four or more aspherical surfaces.

In the projection exposure apparatus according to the first aspect, the refracting lenses may all be form from the same material. In this case, the material of the refracting lenses may be fluorite.

In the projection exposure apparatus according to the first aspect, the illumination optical system may supply the illumination radiation having a center wavelength on the order of 180 nm or smaller and a full width half maximum of 10 pm or smaller.

In the projection exposure apparatus according to the first aspect, the refracting lens may contain fluorite.

In the projection exposure apparatus according to the first aspect, the projection optical system may form an intermediate image of the mask, and include a first image forming optical system disposed on an optical path between the mask and the intermediate image and a second image forming optical system disposed on an optical path between the intermediate image and the workpiece, and
  one of the first and second image forming optical systems may include at least one concave mirror, and the other image forming optical system may include an aperture stop. In this case, said at least one concave mirror may be positioned in the first image forming optical system, and the aperture stop may be positioned in the second image forming optical system.

The projection exposure apparatus described above may further comprise a reflecting mirror for guiding the beams from the first image forming optical system to the second image forming optical system.

In the projection exposure apparatus according to the first aspect, only one of two lens surfaces possessed by the refracting lens may be formed as the aspherical surface.

To accomplish the first object, according to a second aspect of the present invention, a catadioptric optical system comprises a first image forming optical system, including a concave mirror, for forming an intermediate image of a first surface, and a second image forming optical system, including an aperture stop, for re-imaging the intermediate image on a second surface. The catadioptric optical system is provided with a reflecting surface so that the beams from the first image forming optical system are guided to the second image forming optical system. The catadioptric optical system has fifteen or less pieces of refracting lenses and four or more aspherical surfaces.

In the catadioptric optical system according to the second aspect, the refracting lenses may all be form from the same glass material.

Further, to accomplish the second object, according to a third aspect of the present invention, a projection exposure apparatus comprises an illumination optical system for illuminating a mask formed with a pattern with beams of radiation, and a catadioptric type projection optical system for forming an image of the pattern on a workpiece on the basis of beams from the mask. The illumination optical system is constructed to supply an illumination radiation having a center wavelength of 180 nm or smaller and a full width half maximum of 20 pm or smaller. The projection optical system includes lens elements and a concave reflecting mirror, and the lens elements and the concave reflecting mirror are so positioned as to correct substantially a chromatic aberration of the projection optical system with respect to the illumination radiation.

To accomplish the third object, according to a fourth aspect of the present invention, a projection exposure apparatus comprises an illumination optical system for illuminating a mask formed with a pattern with beams of radiation, and a catadioptric type projection optical system for forming an image of the pattern on a workpiece on the basis of beams from the mask. The illumination optical system is constructed to supply an illumination radiation having a center wavelength of 180 nm or smaller and a full width half maximum equal to or smaller than a predetermined value. The projection optical system includes an optical member exhibiting a refracting power, and a radiation transmissive optical member, disposed in close proximity to the mask, for separating the optical member exhibiting the refracting power from an outside atmosphere, and a spacing between the mask along a direction parallel to the optical axis of the projection optical system and the radiation transmissive optical member, is set to equal to or smaller than 50 nm.

In the projection exposure apparatus according to the fourth aspect, the radiation transmissive optical member may have a plane parallel plate. In this case, the plane-parallel plate may be so provided as to be exchangeable.

In the projection exposure apparatus according to the fourth aspect, the full width half maximum of the illumination radiation may be equal to or smaller than 20 pm.

In the projection exposure apparatuses according to the third and fourth aspects, all the lens elements and the concave reflecting mirror constituting the projection optical system may be disposed along a common optical axis.

In the projection exposure apparatuses according to the third and fourth aspects, the projection optical system may be constructed of only one concave reflecting mirror, a plurality of lens elements and one or a plurality of flat reflecting mirrors.

In the projection exposure apparatuses according to the third and fourth aspects, the full width half maximum of the illumination radiation may be 2 pm or smaller.

In the projection exposure apparatuses according to the third and fourth aspects, the projection optical system may include a first image forming optical system for forming a primary image of the pattern on the basis of radiation beams from the mask, and a second image forming optical system for forming a secondary image of the pattern on the workpiece on the basis of radiation beams from the primary image. In this case, the projection exposure apparatus may be constructed to satisfy the following condition:

$$0.7 < h1/h2 < 1.4$$

where h1 is a maximum clear aperture diameter of the lens of said first image forming optical system, and h2 is a maximum clear aperture diameter of the lens of said second image forming optical system.

To accomplish the fourth object, according to a fifth aspect of the present invention, a projection exposure apparatus comprises an illumination optical system for illuminating a mask formed with a pattern with beams of radiation, a catadioptric type projection optical system for forming an image of the pattern on a workpiece on the basis of the beams from the mask, a first image forming optical system, composed of a concave reflecting mirror and a refracting optical member that are disposed along a first optical axis, for forming an intermediate image of the pattern, a second image forming optical system, having a refracting optical member disposed along a second optical axis, for forming a reduced image of the intermediate image on the workpiece, a first optical path folding member disposed between the first image forming optical system and the second image forming optical system, and a second optical path folding member disposed between the first optical path folding member and the second image forming optical system. The first and second optical axes are parallel to each other, and the refracting optical member is not interposed between the first and second optical path folding members.

According to the fifth aspect, the reduced image may be formed in parallel to the pattern surface, and the first and second optical axes may be positioned substantially in parallel to a direction of gravity.

An exposure method of illuminating a mask with an exposure radiation and projecting a pattern on the mask on a workpiece through a projection optical system, comprises a step of forming an image of the mask pattern on the workpiece by use of the projection exposure apparatus according to the first or third or fourth or fifth aspect.

BRIEF DESCRIPTION OF THE DRAWINGS

FIG. 4A shows a lens layout of the projection optical system in the first embodiment, and is a sectional view taken along the plane perpendicular to a mask surface (object surface), containing an optical axis that connects a concave reflecting mirror M2 to a wafer surface (image surface); FIG. 4B corresponds to FIG. 4A, and is a sectional view taken along the plane parallel to the mask surface, containing the optical axis connecting the concave reflecting mirror M2 to the wafer surface (image surface);

FIGS. 5A to 5C are graphs showing, respectively, a spherical aberration, an astigmatism and a distortion in the first embodiment;

FIGS. 6A to 6D are graphs each showing a lateral aberration (meridional coma) in the first embodiment;

FIG. 7A shows a lens layout of the projection optical system in the second embodiment, and is a sectional view taken along the plane perpendicular to the mask surface (object surface), containing the optical axis that connects the concave reflecting mirror M2 to the wafer surface (image surface); FIG. 7B corresponds to FIG. 7A, and is a sectional view taken along the plane parallel to the mask surface, containing the optical axis connecting the concave reflecting mirror M2 to the wafer surface (image surface);

FIGS. 8A to 8C are graphs showing, respectively, the spherical aberration, the astigmatism and the distortion in the second embodiment;

FIGS. 9A to 9D are graphs each showing the lateral aberration (meridional coma) in the second embodiment;

FIGS. 12A to 12C are graphs showing, respectively, the spherical aberration, the astigmatism and the distortion in the third embodiment;

FIGS. 15A to 15C are graphs showing, respectively, the spherical aberration, the astigmatism and the distortion in the fourth embodiment;

FIGS. 21A to 21C are graphs showing, respectively, the spherical aberration, the astigmatism and the distortion in the sixth embodiment;

FIG. 24 is a flowchart showing one example of an embodiment of a device manufacturing method according to the present invention.

EMBODIMENTS OF THE INVENTION

Figure 1:
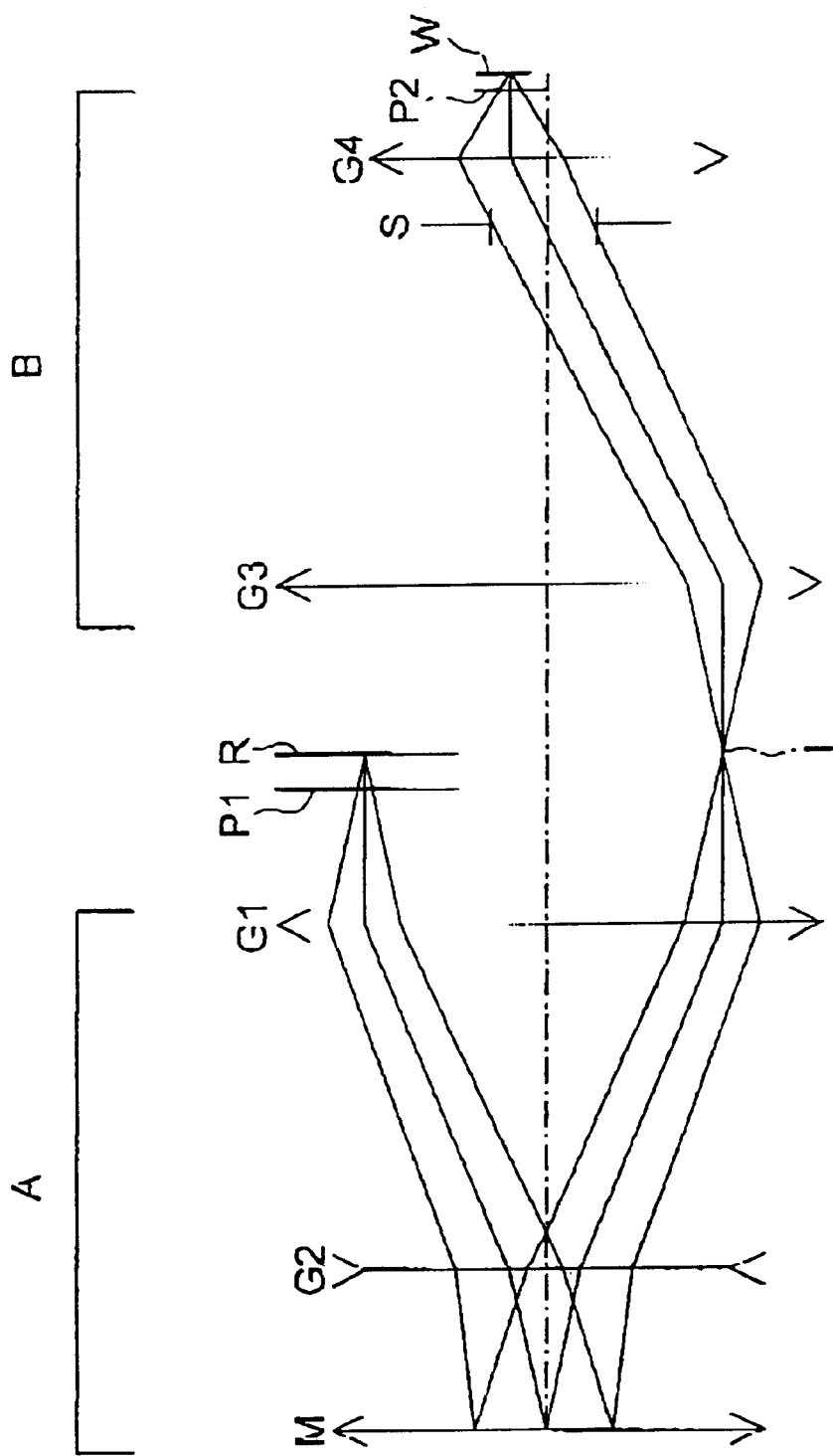
FIG. 1 is an explanatory conceptual view showing an outline of a basic construction of a projection optical system of a projection exposure apparatus in an embodiment of the present invention.

The present invention is based on the premise that the exposure radiation having a wavelength of 180 nm or smaller is used, and, in such a short wavelength region, there is a limited kind of sufficiently usable optical glasses because of radiation absorption. In this case, if a projection optical system is constructed of only a refracting optical system, it is absolutely impossible to correct a chromatic aberration. It is therefore quite difficult to obtain the projection optical system constructed of only the refracting optical system.

By contrast, there are some attempts to construct the projection optical system by use of only a reflecting system.

In this case, however, a multiplicity of reflecting surfaces are required, which leads to a scale-up of the projection optical system and needs to make the reflecting surfaces aspherical. It is, however, extremely difficult to obtain a high-precision aspherical surface in terms of manufacturing. Further, a reflectance of the reflecting surface with respect to the short wavelength region of 180 nm or under, is small, and hence there is a large loss of radiation quantity on the multiplicity of reflecting surfaces, with the result that an exposure speed (throughput) decreases. An image area usable on a photosensitive substrate, i.e., a usable area is narrow, and it is therefore difficult to ensure a rectangle exposure area as an area actually used for the exposure, which seems undesirable.

Such being the case, the present invention adopts a technology by which a reduction projection optical system is constructed of a so-called catadioptric optical system configured by combining a reflecting system with a refracting system, composed of an optical glass usable for a wavelength in use.

Generally speaking, when using an aspherical lens instead of a spherical lens, a degree of freedom for correcting an aberration increases, and the number of lenses for use can be reduced. That is to say, the use of one single aspherical surface in a proper place is capable of correcting surely partially one kind of aberration, and hence the number of lenses for use can be decreased corresponding to this correction. Accordingly, when using a larger number of aspherical surfaces, a larger effect in correcting the aberration is obtained, and it follows that the number of lenses for use decreases.

It may not necessarily be, however, a good option that the multiplicity of aspherical surfaces are used limitlessly. When the aspherical surfaces are applied to a considerable number of surfaces, the effect gradually declines. Further, taking the difficulty of forming the aspherical surface into consideration, it is required that a higher effect be obtained with a smaller number of aspherical surfaces to the greatest possible degree. For attaining this, it is inevitable that an applied place be strictly selected.

Under such circumstances, according to first and second aspects of the present invention, one aspherical surface is provided in the vicinity of an aperture stop in order to correct at first a spherical aberration, and one aspherical surface is provided in the vicinity of the first surface or in the vicinity of an intermediate image in order to correct a distortion next. Further, one aspherical surface provided between the aperture stop and the image in order to correction a coma, and one aspherical surface is provided between the first surface and a concave mirror in order to correct an astigmatism.

Thus, the number of lenses can be reduced by providing at least four aspherical surfaces, and the decrease in the radiation quantity can be minimized.

A curvature-of-field aberration as a final aberration can be completely corrected by such a characteristic of the catadioptric optical system that Potzval sum can be reduced down to zero. Further, another characteristic of the catadioptric optical system is that the chromatic aberration is small, and all the aberrations can be preferably thus corrected.

As discussed above, the aspherical surfaces in configurations suited to the purposes thereof are disposed in at least four places suited to the purposes thereof, whereby almost all the aberrations can be simultaneously corrected. Thus, as will be demonstrated in embodiments of the present invention which will be described later on, it is feasible to obtain a drastically down-sized projection optical system with a remarkably reduced number of lenses. That is, according to the first and second aspects of the present invention, the maximum effect can be obtained by use of the minimum number of aspherical surface elements.

As a matter of course, it is possible to correct residual aberrations such as a high-order coma and astigmatism by providing additional aspherical surfaces over the four aspherical surfaces, whereby the number of lenses can be further decreased.

Now, in the using wavelength region on which the present invention is based as the premise, the categories of the usable lens materials are largely limited, and hence it is desirable that the all refracting lenses be form from the same material in terms of reducing a manufacturing cost.

In this case, the material of the refracting lens is preferably fluorite among the usable lens materials in terms of manufacturing easiness, availability and performance.

As explained above, if all the refracting lenses are form from the same material, it is preferable that an illumination radiation (exposure radiation) supplied by an illumination optical system has a full width half maximum of 10 pm or smaller.

According to the first and second aspects of the present invention, the projection optical system is preferably constructed to include a first image forming optical system, for forming an intermediate image of a mask, disposed on an optical path between the mask and the intermediate image thereof, and a second image forming optical system disposed on an optical path between the intermediate image and a workpiece. It is preferable that at least one of the first and second image forming optical systems includes one concave mirror, and the other includes an aperture stop. In this case, the image forming optical system including the aperture stop be, it is preferable, constructed of a refracting optical system (or the projection optical system includes only one concave mirror).

Over the recent years, σ-value defined as a ratio of a numerical aperture NA of the illumination optical system to a numerical aperture NA of the projection optical system has been set variable corresponding to a type of a pattern on the mask. In this case, if the image forming optical system including the aperture stop is classified as a catadioptric optical system, an effective stop installation area can be taken nowhere.

There has been proposed in recent years a contrivance that a resolution-enhancement is obtained by disposing a pupil filter on a pupil surface of the projection optical system or in the vicinity of the pupil surface. If the image forming optical system including the aperture stop is the catadioptric optical system, however, this pupil filter can not absolutely be disposed.

In the construction described above, it is preferable that at least one concave mirror be positioned in the first image forming optical system, and the aperture stop be positioned in the second image forming optical system. What is constructed in this case is a twice image forming optical system, wherein the first image forming optical system forms an intermediate image of the first surface, the second image forming optical system re-forms the intermediate image on the second surface, a reflecting surface is so provided as to guide radiation beams from the first image forming optical system to the second image forming optical system, and the first image forming optical system is constructed, as a reciprocating optical system, of a concave mirror and a lens unit which transmits both of incident radiation beams upon and reflecting radiation beams from the concave mirror.

According to this type of twice image forming optical system, a diameter of the concave mirror can be reduced, the effective stop installation area can be ensured because of making variable the numerical aperture of the projection optical system, and further a so-called working distance between a wafer and an end surface of an objective lens can be taken long while securing sufficient brightness of the optical system.

In contrast with this construction, in the catadioptric optical system of such a type that the reciprocating optical system having a reciprocation optical path formed by use of a concave mirror is provided on the side of the second surface on a reduction side, the radiation beams are incident diverging upon the concave mirror to ensure required brightness of the optical system, and it is difficult to downsize the concave mirror, which seems unpreferable. Moreover, this type of optical system (in which the second image forming optical system is the reciprocating optical system), after being reflected by the reflecting mirror, a distance to the wafer can not be taken long in terms of a relation with a reduction magnification. Hence, the number of the objective lenses insertable into this optical path is not so large. The obtained brightness of the optical system is inevitably limited, and this is undesirable. Even if the optical system having a high numerical aperture NA is actualized, a large number of optical members are inserted into a limited length, and hence the so-called working distance WD between the wafer and the end surface of the objective lens can not be taken long, which is not preferable.

In the case of adopting the twice image forming optical system described above, it is preferable that a lens exhibiting a positive refracting power be disposed in the reciprocation optical system with the reciprocation optical path formed by use of the concave mirror. Herein if only negative lenses are taken into the reciprocation optical system, it follows that the radiation beams enter in divergence the concave mirror, and therefore a diameter of the concave mirror increases. This is unpreferable.

In the case of adopting the twice image forming optical system explained above, if the reciprocation optical system is constructed as a complete symmetric type, the working distance in the vicinity of the first surface is hard to ensure, and there arises a necessity of using a half prism etc, which is unpreferable.

According to the present invention, it is preferable that there be provided the reflecting mirror for guiding the radiation beams from the first image forming optical system to the second optical system. In the projection optical system having the two image forming optical systems, the optical axis of the optical path is often decentered midways (folding of the optical path). If constructed as described above, however, an operation of adjusting the decentered portion (folded portion of the optical path) of this so-called decentering optical system, can be facilitated, and a high-accuracy system can be easily actualized.

According to the present invention, at least the four aspherical surfaces are preferably one-sided aspherical lenses, wherein only one surface of two lens surfaces of the refracting lens is aspherical. This yields an advantage of facilitating manufacturing the aspherical lens and operations of incorporating the aspherical lens into the projection optical system and adjusting it.

It is extremely difficult to make the reflecting surface aspherical with a high precision in terms of manufacturing, and hence any one of fifteen or less pieces of refracting lenses, it is preferable, be provided with at least the four aspherical surfaces according to the present invention.

Now, in the catadioptric type optical system, an axial chromatic aberration inevitably occurred in the refracting optical system is canceled by a chromatic aberration occurred in the opposite direction by the negative lens in the catadioptric optical system, whereby the chromatic aberration can be preferably corrected. Accordingly, it is required for preferably correcting the chromatic aberration that the chromatic aberration occurred in the refracting optical system be restrained, or the chromatic aberration correcting effect of the negative lens in the catadioptric optical system be enhanced.

According to a paraxial aberration theory, a quantity of occurrence of the axial chromatic aberration is generally proportional to a lens power (refracting power) and also proportional a square of a height of incidence of a paraxial marginal ray. Then, the enhancement of the chromatic aberration correcting effect of the negative lens in the catadioptric optical system, may involve strengthening the power of the negative lens or thickening the radiation beams incident on the negative lens.

If the power of the negative lens is strengthened, however, a radius of curvature of the lens surface decreases, while an angle of incidence of the radiation beam increases. As a result, a high-order aberration may occur, and it is difficult to eliminate the aberration other than the chromatic aberration. The aberration in the case of strengthening the power of the negative lens can be, however, eliminated considerably effectively by introducing the aspherical surfaces.

On the other hand, when thickening the radiation beams of incidence upon the negative lens, the axial chromatic aberration can be relatively easily removed. If the radiation beams of incidence upon the negative lens are thickened, however, an optical element such as the lens and the reflecting mirror increases in size, and it is difficult to manufacture this optical element with a required accuracy. Accordingly, there is a limit in thickening the radiation beams of incidence upon the negative lens.

Next, a contrivance of restraining the axial chromatic aberration in the refracting optical system may be a construction, wherein the lens power is weakened, or the radiation beams of incidence upon the lens are not thickened reversely in the case of the catadioptric optical system. What is disadvantageous for attaining this is an existence of the negative lens by which the radiation beams of incidence on other lens are thickened, and the power of the positive lens needed increases. Therefore the use of the negative lens in the refracting optical system should be restrained. In this case, however, the spherical aberration can not be eliminated only by the spherical lens, and hence there is a necessity of using the aspherical surfaces. When introducing the aspherical surfaces, there is an advantage in which the aberration can be restrained with a less number of lenses than in the spherical system. Even if the aspherical surfaces are introduced, however, Petzval sum can not be adjusted only by the positive lenses, so that a field curvature inevitably occurs. The field curvature can be, however, canceled by the effects of the negative lens and the concave reflecting mirror in the catadioptric optical system.

From the reasons elucidated above, according to a third aspect of the present invention, the catadioptric type projection optical system is used for attaining the correction of the chromatic aberration over a wavelength width in a broadband on the order of 10~20 pm also in a wavelength region as short as 180 nm. Then, the catadioptric type projection optical system is constructed including the concave mirror. It is therefore possible to correct Petzval sum without causing the chromatic aberration by this concave mirror and to enhance the chromatic aberration correcting function of the negative lens in the projection optical system. Moreover, according to the third aspect of the present invention, it is feasible to decrease the number of reflecting surfaces that bring about a loss of the radiation quantity in the wavelength region of 180 nm or under, and hence the decrease in the exposure speed (throughput) can be restrained.

On the other hand, the whole optical system including the mask (reticle) and the wafer is constructed in a gas-proof or air tight state in order to avoid a radiation absorption by the air, and it is preferable that this is replaced with an inert gas such as helium etc. the mask and the wafer are, however, repeatedly moved during the use of he projection exposure apparatus, and it is therefore difficult to construct the entire optical system including the mask and the wafer in the gas-proof state.

This being the case, according to a fourth aspect of the present invention, radiation transmissive optical members are disposed in the vicinity of the mask and in the vicinity of the wafer, and an area extending from the optical member in the vicinity of the mask to the optical member in the vicinity of the wafer, is kept in the gas-proof state in order that other optical members (inclusive of a lens, a concave reflecting mirror, a convex reflecting mirror and a diffractive optical element) having the refracting power are separated from the outside atmosphere.

Generally, the lens is disposed in close proximity to the wafer in the projection optical system, so that the radiation transmissive optical member is added in the vicinity of the mast in the fourth aspect of the present invention. Note that the radiation transmissive optical member may involve the use of a lens or a plane-parallel plate. When using the plane-parallel plate easy to handle and work, this plane-parallel plate can be comparatively easily replaced while keeping a performance of the optical system even if the surface is contaminated. If an interior of the projection optical system is kept in the gas-proof state, where dusts are adhered is limited to a portion exposed to the outside, i.e., the mask-sided plane-parallel plate and the wafer-sided lens. According to the present invention, a durability and a maintainability of the projection optical system can be enhanced by replacing the mask-sided plane-parallel plate to which the dusts are easily adhered.

Further, even after completing an assembly of the projection optical system and a rough adjustment thereof, the various residual aberrations in the projection optical system can be corrected by effecting fine working on the surface of the plane-parallel plate disposed in the vicinity of the mask. Especially in the case of a reduction type projection optical system, the distortion can be effectively corrected by effecting the fine working on the plane-parallel plate disposed in the vicinity of the mask.

Note that the plane-parallel plate may be added in the vicinity of the wafer as the necessity arises. In this case, the spherical aberration and the coma can be effectively corrected by effecting the fine working on the plane-parallel plate disposed in the vicinity of the wafer.

In the fourth aspect described above, it is preferable that the full width half maximum of the illumination radiation be 20 pm or under.

Now, in the projection exposure apparatus according to the third and fourth aspects of the present invention, it is preferable that all the lens elements and the concave reflecting mirror which configure the projection optical system, be disposed along the common optical axis. In this case, it is preferable that the projection optical system be constructed only or only one concave reflecting mirror, a plurality of lens elements and one or a plurality of plane reflecting mirrors.

In the projection exposure apparatus according to the third and fourth aspects of the present invention, it is preferable that the projection optical system includes a first image forming optical system for forming a primary image of the pattern on the basis of the radiation beams from the mask, and a second image forming optical system for forming, on a workpiece, a secondary image of the pattern on the basis of the radiation beams from the primary image.

As described above, in the case of including the first image forming optical system for forming the primary image of the mask pattern and the second image forming optical system for forming the secondary image of the mask pattern on the basis of the radiation beams from this primary image, it is preferable to use an area off the optical axis as the exposure area (or a field area on the mask) defined on the workpiece, i.e., the use in the off-axis optical system is preferable. In this case, as compared with an optical system of such a type that the area containing the optical axis is used as the exposure area (the area of the field of view), there exists inconvenience in which it is relatively difficult that an image areal size is ensured broad. Nevertheless, there are excellent advantages, wherein the decrease in the radiation quantity is small, an image quality is high because of no shielding of the radiation beams for forming the image, and the manufacturing of each of the optical members is easier than other types. Then, in the case of the above-mentioned construction (in the case of the off-axis use), an advantage is that the radiation beam on the optical path toward the concave mirror and the radiation beam on the optical path from the concave mirror, can be split without using a beam splitter. Note that it is difficult to manufacture a prism exhibiting a high transmittance with respect to the radiation having the wavelength as short as 180 nm or under, on which the present invention is based as the premise. It is also difficult to manufacture a wavelength plate and a polarization reflecting film for effecting a polarizing separation with respect to the radiation having the short wavelength of 180 nm or less. Further, in the case of the above-described construction (in the case of the off-axis use), the optical path can be formed without providing an aperture at the center of the reflecting mirror, and hence there might be no possibility in which a fidelity of the pattern image declines due to the fact that some of the image forming radiation beams are shielded by the aperture at the center of the reflecting mirror in the optical path of the image forming optical system. Accordingly, this is advantageous when the circuit pattern is transferred with a high precision.

In the projection exposure apparatus according to the third and fourth aspects of the present invention, it is preferable that the full width half maximum of the illumination radiation supplied from the illumination optical system be equal to or smaller then 2 pm. An advantage of setting the full width half maximum of the illumination radiation to 2 pm or under, is that the number of the lens elements of the projection optical system can be further reduced, a transmittance of the projection optical system itself can be further improved, and the exposure speed (throughput) can be enhanced while restraining the cost for manufacturing the apparatus.

According to a fifth aspect of the present invention, even in a projection optical system having an optical path folding member, all the lens elements therein can be held so that the optical axes are parallel to each other. With this arrangement, it is feasible to substantially prevent the lens element from deforming in asymmetry with respect to the optical axis, and, even when scaling up the optical member with an increases in the number of the apertures in the projection optical system and an expansion of the exposure area, it is feasible to prevent an occurrence of an asymmetric aberration that is corrected with a difficulty when manufactured. Note that the reduced image. It is preferable in the fifth aspect of the present invention, be formed in parallel with the pattern surface and the first and second optical axes be positioned substantially in parallel with the direction of gravity.

In the projection exposure apparatus according to the first, third, fourth and fifth aspects of the present invention, it is preferable that the exposure area defined on the photosensitive substrate through the projection optical system takes a rectangular shape.

Next, each of embodiments will be described with reference to the drawings.

FIG. 1 is a conceptual explanatory diagram showing a basic layout of the projection optical system in each of the embodiments.

As illustrated in FIG. 1, the projection optical system in each of the embodiments is constructed of a catadioptric optical system A on the front side (the mask side) and a refracting optical system B on the rear side (the wafer side), with an intermediate image I being interposed therebetween. That is, the intermediate image I is formed by the first image forming optical system composed of the catadioptric optical system A on the basis of the radiation beams from the mask R. A mask pattern image is formed on a wafer W by the second image forming optical system composed of the refracting optical system B on the basis of the radiation beams from the intermediate image I.

Although it happens that the optical axis of the projection optical system is deflected back by the concave reflecting mirror or deflected by a reflecting surface (not shown in FIG. 1) disposed for a separation of the optical path, all the reflecting optical members and refracting optical members excluding the reflecting surface of the separation of the optical path, are disposed on the optical axis. In the following discussion on the catadioptric optical system A and the refracting optical system B, it is assumed that the reflecting surface of folding the optical path is removed.

The catadioptric optical system A is constructed of the plurality of lenses (G1, G2), and one concave reflecting mirror (M). The optical axis of the catadioptric optical system A is folded back by the concave reflecting mirror M. A mask R's surface defined as an object surface is required to be set off the optical axis (decentered) is order to avoid an interference of the radiation beams due to the folding-back of the optical path at the concave reflecting mirror M, i.e., for separating the radiation beams incident upon the concave reflecting mirror M from the radiation beams exiting the concave reflecting mirror M. Further, the surface of the wafer W is also required to be decentered from the optical axis corresponding the eccentricity of the mask R from the optical axis.

The concave reflecting mirror M is disposed in the vicinity of a position corresponding to the aperture stop of the catadioptric optical system A, and it is preferable that the optical system be constructed substantially in symmetry about the concave reflecting mirror M and having substantially an equal power in order to restrain well an occurrence of the aberration.

A lens unit G2 exhibiting a negative refracting power as a whole is disposed in a position closest to the concave reflecting mirror M in the catadioptric optical system A. Note that the lens unit connoted in this specification is a concept broad enough to embrace one single lens. This negative lens unit G2 corrects well the on-axis chromatic aberration occurred in the refracting optical system B. It is desirable for correcting well the chromatic aberration in a broadband in the projection optical system having a broad field of view that the negative lens unit G2 involves the use of an aspherical lens or a plurality of lenses.

A positive lens unit (constructed of at least one piece of positive lens) C1 exhibiting a positive refracting power as a whole, is disposed in the optical path between the negative lens unit G2 and the mask R. The positive lens unit G1 incorporates a function of giving a telecentricity to the radiation beams from the mask R, whereby a resistivity against a fluctuation of focus on the object side (mask side) is given. The positive lens unit G1 is useful for eliminating the distortion and preventing an over-occurrence of a curvature-of-field aberration in the intermediate image I.

It is preferable that the various aberrations excluding the chromatic aberration be well corrected in the intermediate image I formed by the catadioptric optical system A. If decreasing the number of the lenses constituting the catadioptric optical system A, however, it is inevitable that the aberration such as the field curvature aberration remains uncorrected to some extent in the intermediate image I.

On the other hand, the refracting optical system B is constructed of a positive lens unit G3 disposed on the mask side and a positive lens unit G4 disposed on the wafer side, with an aperture stop S being interposed therebetween. That is, the refracting optical system B is classified as an optical system constructed of only a refracting optical member such as a lens without including the concave reflecting mirror. In the catadioptric optical system A, the aperture stop can not be disposed in the optical path because the optical path being folded back by the concave reflecting mirror, and therefore the aperture stop S in the projection optical system is disposed in the optical path of the refracting optical system B.

As discussed above, it is advantageous for restraining well the occurrence of the axial chromatic aberration in the refracting optical system B that the radiation beams incident on the lens do not become to thick. In this case also, however, the variety of aberrations occur due to the strengthened lens power, and hence it is preferable that a size of clear aperture diameter of the lens satisfies the following conditional formula (1)

$$0.7 > h1/h2 > 1.4 \qquad (1)$$

where H1 is a maximum clear aperture diameter of the lens of the catadioptric optical system A defined as the first image forming optical system, and h2 is a maximum clear aperture diameter of the lens of the refracting optical system B defined as the second image forming optical system.

If under a lower limit value in the conditional formula (1), a value given by h1/h2 becomes too small, and it is difficult to eliminate the chromatic aberration, which is unpreferable.

Whereas if over an upper limit value in the conditional formula (1), the value given by h1/h2 becomes too large, and the refracting optical system B becomes hard to correct the spherical aberration etc, or the manufacturing falls into difficulty because of the optical members of the catadioptric optical system A becoming too large, which is also unpreferable.

Note that even if falling within a range that meets the conditional formula (1), it is advantageous to use he aspherical surface in order to correct the aberration in the refracting optical system B.

Figure 2:
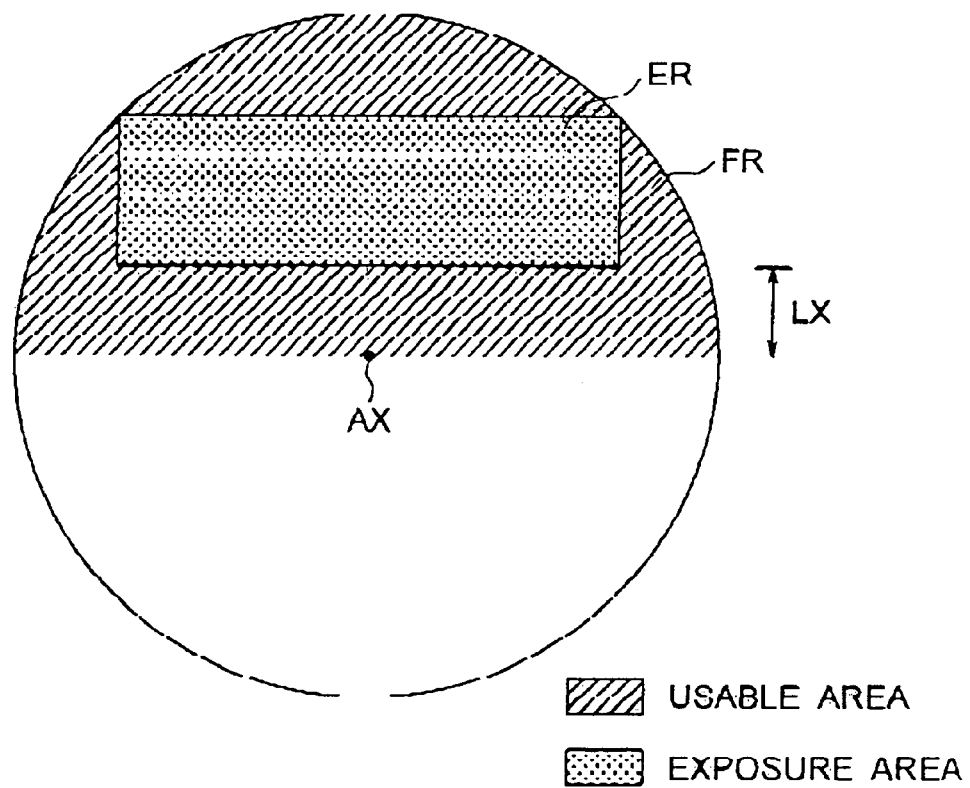
FIG. 2 is a view showing an area usable for forming an image on a wafer W in the embodiment of the present invention, i.e., a usable area FR and an exposure area ER used for an actual exposure.

As discussed above, in the projection optical system, shown in FIG. 1, of the present invention, there exists a necessity of separating the radiation beams incident upon the concave reflecting mirror M from the mask R in the catadioptric optical system A from the radiation beams reflected by the concave reflecting mirror M and traveling toward the refracting optical system B. As a result, an area usable for forming the image on the surface of the wafer W. viz., a usable area FR is, as shown in FIG. 2, an area that is half a circular area with an optical axis AX being centered, from which the aberration is removed. Then, according to the present invention, an exposure area ER used for an actual exposure is defined as a rectangular area into which a boundary area proximal to the optical axis AX is removed from, e.g., the semicircular usable area FR. Corresponding to a configuration of this exposure area, an area of field of view (illumination area) defined on the mask R through the projection optical system takes also a rectangular shape.

In accordance with the embodiment of the present invention, an optical member P1 exhibiting a radiation transmissivity such as a plane-parallel plate, is disposed in the vicinity of the mask R. To be specific, a spacing between the mask R along the optical axis (or in a direction parallel to the optical axis) of the projection optical system and the plane-parallel plate P1, is set to 50 mm or smaller. A radiation transmissive optical member P2 such as a plane-parallel plate may be disposed in the vicinity of the wafer W as the necessity arises. Accordingly, an interior of the optical system extending from the plane-parallel plate P1 disposed in the vicinity of the mask R to the plane-parallel plate P2 (or a lens closest to the wafer) disposed in the vicinity of the wafer W, is kept in the gas-proof state, and may be filled with an inert gas such as helium (He) and nitrogen ($N_4$) which are hard to absorb the exposure radiation.

That is to say, excluding a narrow optical path between the mask R and the plane-parallel plate P1 and a narrow optical path between the wafer W and the an optical member vicinal to this wafer W, substantially all the optical paths from the mask R down to the wafer W may be filled with the inert gas such as helium etc. that is hard to absorb the radiation. As a result, even when using short wavelength radiation like $F_2$ laser beams for an exposure radiation, the radiation absorption can be effectively avoided, and a transmitting efficiency of the projection optical system can be enhanced.

Herein, in the case of using the short wavelength radiation having a wavelength of 180 nm or under such as the $F_2$ laser beams for the exposure radiation, it follows that the narrow optical path between the mask R and the plane-parallel plate P1 and the narrow optical path between the wafer W and the an optical member vicinal to this wafer W, are filled with the inert gas. On these optical paths, however, a movable mask stage 6 and a movable wafer stage 10 are disposed, and there is a large possibility that a degree of cleanness (a degree of cleanliness) of the inert gas itself becomes lower than a degree of cleanness of the optical path (extending from the plane-parallel plate P1 to the plane-parallel plate P2 or the lens closest to the wafer) inside the projection optical system due to a scatter of grease and dusts given forth from those movable members. Consequently, even if all the optical paths from the mask R down to the wafer W are filled with the inert gas, the optical path exhibiting a low degree of cleanness can be remarkably shortened according to the present invention, in other words, it is feasible to separate the optical path with the low degree of cleanness and therefore further enhance an effect of reducing the loss of the radiation quantity.

Herein, if a spacing between the mask R and the plane-parallel plate P1 (which is an object member for separating the optical member disposed in close proximity to the mask and having the refracting power from the outside atmosphere) in a direction parallel to the optical axis, $1s$ long enough to exceed 50 mm, as described above, the optical path exhibiting the low degree of cleanness becomes too long, and there might increase a possibility of augmenting the lost-of-radiation quantity. This is an unpreferable aspect.

If the spacing between the mask R and the plane-parallel plate P1 in the direction parallel to the optical axis is 1 mm or smaller, it is quite difficult to a design the mask stage so as not to interfere the mask stage with the plane-parallel plate P1, and it is also difficult to enhance the accuracy of the mask stage itself, which is not preferable. If the spacing between the mask R and the plane-parallel plate P1 in the direction parallel to the optical axis is 5 mm or smaller, there is required a design for preventing the interference between the mask stage and the plane-parallel plate P1, which is also unpreferable. If the spacing between the mask R and the plane-parallel plate P1 in the direction parallel to the optical axis is 20 mm or smaller, a small-scale improvement of the existing mask stage is not sufficient for preventing the interference between the mask R and the plane-parallel plate P1. This is also unpreferable.

As explained above, the durability and the maintainability of the projection optical system are ameliorated by use of the plane-parallel plate, and the residual aberration can be corrected after assembling the projection optical system.

Embodiments of the present invention with respect to numerical values will hereinafter be described.

First Embodiment and Second Embodiment

Figure 3:
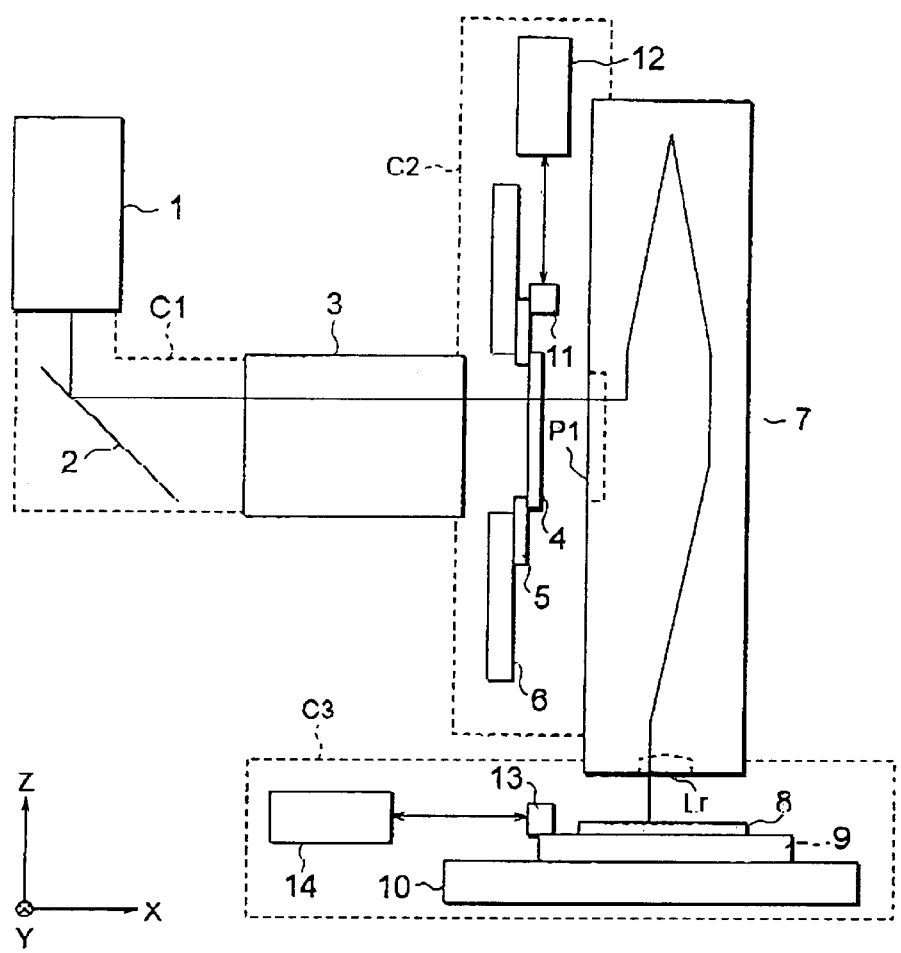
FIG. 3 is a view showing an outline of a whole construction of the projection exposure apparatus in first and second embodiments of the present invention.

FIG. 3 is a view showing an outline of a whole construction of the projection exposure apparatus in first and second embodiments of the present invention. Incidentally, referring to FIG. 3, the Z-axis is set in a direction of normal line of the wafer surface, the X-axis is set in parallel to the sheet surface in FIG. 3, and the Y-axis is set perpendicularly to the sheet surface. Referring again in FIG. 3, the direction of gravity is the same as the direction of the Z-axis.

In the projection exposure apparatus illustrated therein, beams emitted in the Z-direction from the $F_2$ laser 1 (of which an oscillation center wavelength is 157.6 nm), are deflected in the X-direction by a deflection mirror 2, and thereafter a mask 4 is uniformly illuminated with these deflected beams through an illumination optical system 3.

Note that only the single deflection mirror 2 is illustrated in the optical path from a radiation source 1 down to the illumination optical system 3 in FIG. 3, however, in fact, if the radiation source 1 is separated from the projection exposure apparatus body, there are disposed optical systems such as an auto tracking unit for orienting the $F_2$ laser beams from the radiation source 1 always towards the projection exposure apparatus body, a beam profile adjusting optical system for adjusting a beam profile of the $F_2$ laser beams from the radiation source 1 to a predetermined size and a predetermined configuration, and a radiation quantity adjusting unit. Further, the illumination optical system 3 shown in FIG. 3 includes optical systems such as an optical integrator, constructed of, e.g., a fly's eye lens and an internal reflection type integrator, for forming a planar radiation source (a surface illuminant) having a predetermined size and a predetermined configuration, a field stop for defining a size and a shape of an illumination area on the mask 4, and a field stop imaging optical system for projecting an image of this field stop on the mask. In an example shown in FIG. 3, a space between the radiation source 1 and the illumination optical system 3 is sealed by a casing C1, and a space extending from the radiation source 1 down to an optical member closest to the mask R in the illumination optical system 3 is replaced with an inert gas such as a helium gas. Note that the way of how the optical path is folded is not limited to the mode shown in FIG. 3, and, as a matter of course, may properly be changed corresponding to a design of the apparatus.

The mask 4 is held in parallel to the Y Z plane on the mask stage 6 by a mask holder 5. The mask 4 is formed with a pattern that should be transferred, and a rectangular pattern area having a long side along the Z-direction and a short side along the Y-direction in the whole pattern data, is illuminated with the laser beams.

The mask stage 6 is two-dimensionally movable along the mask surface (i.e., along the Y-Z plane) by operating an unillustrated drive system, and a mechanism is that position coordinates thereof are measured and controlled by an interferometer 12 using a mask movable mirror 11.

The beams from the pattern formed on the mask 4 form a mask pattern image on the wafer 8 classified as a photo-sensitive substrate through a projection optical system 7. The wafer 8 is held by a wafer holder 9 in parallel to the X-Y plane on the wafer stage 10. Then, a pattern image is formed in a rectangular exposure area having a long side along the X-direction and a short side along the Y-direction on the wafer 8 so as to optically correspond to the rectangular illumination area on the mask 4.

The wafer stage 10 is two-dimensionally movable along the wafer surface (i.e., along the X-Y plane) by operating an unillustrated drive system, and a mechanism is that position coordinates thereof are measured and controlled by an interferometer 14 using a wafer movable mirror 13.

In the illustrated projection exposure apparatus, an interior of the projection optical system 7 between the plane-parallel plate P1 disposed closest to the mask and a lens Lr disposed closest to the wafer among the optical members constituting the projection optical system 7, is kept in a gas-proof state. As gas existing inside the projection optical system 7 is replaced with the helium gas exhibiting a low absorption rate of the exposure radiation. Similarly, an interior of the optical path extending from the radiation source 1 to the illumination optical system 3 is replaced with the helium gas.

Then, the mask 4 and the mask stage 6 are disposed on the narrow optical path between the illumination optical system 3 and the plane-parallel plate P1. However, an interior of a casing C2 encasing the mask 4 and the mask stage 6 by sealing, is filled with the inert gas such as nitrogen and helium gas, whereby the interior of the optical path between the illumination optical system 3 and the plane parallel plate P1 is replaced with the inert gas. Further, the wafer 8 and the wafer stage 10 are disposed on the narrow optical path between the lens Lr and the wafer 8. However, an interior of a casing C3 encasing the wafer 8 and the wafer stage 10 by sealing, is filled with the inert gas such as nitrogen and helium gas, whereby the interior of the optical path between the lens Lr and the wafer 8 is replaced with the inert gas. The mechanically movable members (the mask stage 6, the wafer stage 10 etc) are, however, disposed on those optical paths, and it is therefore inevitable that a degree of cleanness of the gas declines due to the movements of those movable members.

Incidentally, it is preferable that a robot arm for exchanging the mask and a robot arm for exchanging the wafer be encased in a casing different from the casings C2, C3 in order to increase the degree of cleanness of each of those optical paths, however, even if thus encased, the degree of cleanness tends to be lower than a degree or cleanness of the gas inside the projection optical system 7.

As described above, where the exposure radiation passes through the gas exhibiting the low degree of cleanness along the optical paths from the radiation source 1 to the wafer 8, may be the narrow optical path between the illumination optical system 3 and the mask 4, the narrow optical path between the mask 4 and the plane-parallel plate P1, and the narrow optical path between the lens Lr and the wafer 8.

As discussed above, the area of field or view (illumination area) on the mask 4 and the projection area (exposure area) on the wafer 8, which are defined by the projection optical system 7, each takes the rectangular shape with the short side extending in the Y-direction. Accordingly, the mask stage 6 and the wafer stage 10, more essentially, the mask 4 and the wafer 8 are synchronously moved (scanned) in a direction of the short side of each of the rectangular exposure area and of the illumination area, i.e., in the Y-direction while controlling the positions of the mask 4 and of the wafer 8 by use of the drive systems and the interferometers (12, 14), whereby the mask pattern is scanned over an area having a width equal to the long side of the exposure area and a length corresponding to a scan quantity (moving quantity) on the wafer 8, thus exposing this area to the beams of the mask pattern. As discussed above, in the first and second embodiments, the mask surface and the wafer surface are orthogonal to each other, however, the scan direction thereof is set in the horizontal direction.

In respective embodiments (including third through sixth embodiments which will hereinafter be described), all the lens elements and the plane parallel plate, which configure the projection optical system 7, involve the use of fluorite ($CaF_2$ crystal).

The oscillation center wavelength of the $F_2$ laser beams for the exposure radiation is 157.6 nm, and a refractive index of $CaF_2$ changes at a rate of $-2.4 \times 10^{-6}$ per +1 pm as a wavelength variation and at a rate of $+2.4 \times 10^{-6}$ per $-1$ pm as a wavelength variation in the vicinity of 157.6 nm. Moreover, an exposure are ER on the wafer assumes a rectangular shape defined by 25 mm×6.6 mm, and a distance LX from the optical axis AX to the exposure area ER is 4 mm (see FIG. 2). That is, the exposure area ER through the projection optical system in each of the embodiments exists in the position eccentric from the optical axis AX.

Further, in each embodiment, the aspherical surface is expressed by the following mathematical expression (a):

$$Z(y) = \frac{y^2/r}{1+\sqrt{1-(1+\kappa)y^2/r^2}} |C_4 y^4| C_6 y^6 |C_8 y^8 + C_{10} y^{10} \quad (a)$$

where y is a height in the direction perpendicular to the optical axis, Z(y) is a distance (sag quantity) along the optical axis from a tangential plane at an apex of the aspherical surface to a position on the aspherical surface at the height y, r is a radius of curvature of the apex, κ is a cone coefficient, and Cn is a coefficient of an n-order aspherical surface.

In each embodiment, the cone coefficients κ or the respective aspherical surfaces are all 0. Further, a mark * is put on a right side of a surface number of the lens surface formed as the aspherical surface.

First Embodiment

FIG. 4A shows a layout of the lenses of the projection optical system in a first embodiment, and is a sectional view taken along the plane perpendicular to the mask surface (object surface), including an optical axis connecting a concave reflecting mirror M2 to the wafer surface (image surface). Further, FIG. 4B corresponds to FIG. 4A and is a sectional view taken along the plane parallel to the mask surface, including the optical axis connecting the concave reflecting mirror M2 to the wafer surface (image surface). In FIG. 4B, however, for simplifying the illustration, the reflecting mirror M1 is omitted, and the optical paths from the reflecting mirror M1 to the mask R (corresponding to the reference numeral 4 in FIG. 3), are developed on the sheet surface. In the first embodiment, the present invention is applied to the projection optical system in which the variety aberrations containing the chromatic aberration are corrected with respect to the exposure radiation of which the center wavelength is 157.6 nm and the full width half maximum is 2 pm.

In the projection optical system illustrated in FIG. 4, a separation of the optical paths is ensured by removing the reflecting mirror disposed in the vicinity of the position formed with the intermediate image out of the optical system disclosed in Japanese Patent Application Laid Open Publication No. 8-334695, disposing, instead of this removed reflecting mirror, the reflecting mirror M1 just behind the plane-parallel plate P1 disposed in the vicinity of the mask R, and then folding the optical axis. In the case of the projection optical system in the first embodiment, except the plane parallel plate P1 disposed in the vicinity of the mask R and the reflecting mirror M1 disposed just behind P1, the lens elements and the concave reflecting mirror M2 that constitute the catadioptric optical system A and the refracting optical system B are all disposed on the same optical axis, and hence there is yielded an advantage of facilitating an assembly and an adjustment of the optical system.

The projection optical system in the first embodiment includes the plane-parallel plate P1 disposed in close proximity to the mask R, and the flat reflecting mirror M1 for reflecting the beams coming from the mask R through this plane-parallel plate P1 and guiding the reflected beams to the catadioptric optical system A. The catadioptric optical system A is constructed of, sequentially from the incident side of the beams from the mask R, a positive meniscus lens L1 with a convex surface toward the incident side, a positive meniscus lens L2 with a convex surface toward the incident side, a negative meniscus lens L3 with a convex surface toward the incident side, a negative meniscus lens L4 with a concave surface toward the incident side, and a concave reflecting mirror M2 with a concave surface toward the incident side. Accordingly, the beams coming from the mask R penetrate the plane parallel plate P1 and, after being reflected by the flat reflecting mirror M1, enter the catadioptric optical system A. The beams having entered the catadioptric optical system A are incident upon a concave reflecting mirror M2 through the four pieces of lens elements L1–L4. The beams reflected by the concave reflecting mirror M2 form an intermediate image of the mask pattern through the four lens elements L4–L1.

The beams from the intermediate image of the mask pattern are guided to the refracting optical system B. The refracting optical system B is constructed of, sequentially from the incident side of the beams from the intermediate image, a positive meniscus lens L5 with a convex surface toward the incident side, a biconvex lens L6, a biconcave lens L7, a positive meniscus lens L8 with a concave surface toward the incident side, a positive meniscus lens L9 with a convex surface toward the incident side, a positive meniscus lens L10 with a convex surface toward the incident side, a positive meniscus lens L11 with a convex surface toward the incident side, a biconvex lens L12, a negative meniscus lens L13 with a concave surface toward the incident side, and a biconvex lens L14. Note that an aperture stop S is disposed on an optical path between the positive meniscus lens L10 and the positive meniscus lens L11.

Hence, the beams entering the refracting optical system B from the intermediate image of the mask pattern, form a reduced image of the mask pattern in the exposure area on the wafer W (corresponding to a reference numeral 8 in FIG. 3) via the respective lens elements L5–L14.

It is to be noted that, as explained above, the concave reflecting mirror M2 and all the lens elements L1–l14 on the optical path extending from the concave reflecting mirror M2 to the biconvex lens L14, are disposed along the common optical axis AX.

Note that the flat mirror M1 is provided on the optical path between the catadioptric optical system A and the reflecting optical system B and is inclined at 45° to the optical axis in a position that does not contain the optical axis of these two optical systems A and B in the projection optical system in accordance with the first embodiment. Accordingly, the beams traveling from the catadioptric optical system A toward the reflecting optical system B pass through an air space on the side opposite to the flat mirror M1 with the optical axis being interposed therebetween.

The next Table 1 shows values of various items of data of the projection optical system in the first embodiment. In Table 1, λ represents a central wavelength of the exposure radiation, FWHM is a full width half maximum of the exposure radiation, β is a projection magnification, and NA is a numerical aperture on the image side, respectively. Further, a surface number indicates a sequence of the surfaces from the mask side along a direction in which the beams travel toward the wafer surface defined as an image surface from the mask surface as an object surface, r indicates a radius of curvature (radius of curvature at apex in the case of the aspherical surface) of each surface, d is an axial interval between the respective surfaces, i.e., a surface-to-surface interval, and n denotes a refractive index with respect to the center wavelength.

Note that a sign of the surface interval d shall be changed whenever reflected. Consequently, the sign of the surface interval d is negative throughout the optical path from the flat reflecting mirror M1 to the concave reflecting mirror M2, and is positive throughout other optical paths. Then, on the optical path where the surface interval d is positive, the radius of curvature of the convex surface toward the incident side of the beams is positive, and the radius of curvature of the concave surface is negative. Reversely, on the optical path where the surface interval d is negative, the radius of curvature of the concave surface toward the incident side of the beams is positive, and the radius of curvature of the convex surface is negative.

TABLE 1

(General Data)
λ = 157.6 nm
FWHM: 2 pm
β = 1/4
NA = 0.65
(Data of Optical Member)

| Surface Number | r | d | n | |
|---|---|---|---|---|
|  | (Mask Surface) | 20.000000 |  |  |
| 1 | ∞ | 10.000000 | 1.5600000 | (P1) |
| 2 | ∞ | 95.000000 |  |  |
| 3 | ∞ | 147.362588 |  | (M1) |
| 4 | −429.08398 | −30.000000 | 1.5600000 | (L1) |
| 5* | −745.13029 | −1.333333 |  |  |
| 6 | −322.10303 | −40.000000 | 1.5600000 | (L2) |
| 7* | −1467.70271 | −167.804804 |  |  |
| 8 | −1453.48942 | −30.000000 | 1.5600000 | (L3) |
| 9* | −499.97211 | −270.398999 |  |  |
| 10* | 169.56369 | −24.634368 | 1.5600000 | (L4) |
| 11 | 1553.82168 | 29.845669 |  |  |
| 12 | 270.33617 | 29.845669 |  | (M2) |
| 13 | 1553.82168 | 24.634368 | 1.5600000 | (L4) |
| 14* | 169.56369 | 270.398999 |  |  |
| 15* | −499.97211 | 30.000000 | 1.5600000 | (L3) |
| 16 | −1453.48942 | 167.804804 |  |  |
| 17* | −1467.70271 | 40.000000 | 1.5600000 | (L2) |
| 18 | −322.16303 | 1.333333 |  |  |
| 19* | 745.13029 | 30.000000 | 1.5600000 | (L1) |
| 20 | −429.08398 | 367.362588 |  |  |
| 21 | 251.44318 | 56.000000 | 1.5600000 | (L5) |
| 22* | 331.45187 | 0.100000 |  |  |
| 23 | 242.35691 | 64.000000 | 1.5600000 | (L6) |
| 24* | −435.60082 | 41.312455 |  |  |
| 25 | −888.72254 | 85.200000 | 1.5600000 | (L7) |
| 26* | 234.88821 | 351.340242 |  |  |
| 27* | −368.96810 | 35.200000 | 1.5600000 | (L8) |
| 28 | −213.21187 | 0.100000 |  |  |
| 29 | 222.15200 | 38.214400 | 1.5600000 | (L9) |
| 30* | 644.25611 | 105.254071 |  |  |
| 31 | 344.34732 | 34.000000 | 1.5600000 | (L10) |
| 32 | 670.73134 | 14.613691 |  |  |
| 33 | ∞ | 22.968043 |  | (S) |
| 34 | 194.20796 | 25.000000 | 1.5600000 | (L11) |
| 35 | 1066.41016 | 39.793405 |  |  |
| 36 | 269.58088 | 47.757164 | 1.5600000 | (L12) |
| 37* | −250.46386 | 1.151770 |  |  |
| 38 | −252.91748 | 20.000000 | 1.5600000 | (L13) |
| 39* | −5180.17804 | 0.684288 |  |  |
| 40* | 115.59157 | 52.925003 | 1.5600000 | (L14) |
| 41 | −306.38001 | 5.000940 |  |  |

(Wafer Surface)
(Data of Aspherical Surface)

| r | κ | C4 |
|---|---|---|
| 5th Surface −745.13029 | 0.00000 | −0.366339 × 10$^{-8}$ |
| 19th Surface C6 | C8 | C10 |
| 0.457313 × 10$^{-13}$ | 0.205872 × 10$^{-16}$ | 0.184274 × 10$^{-21}$ |
| r | κ | C4 |
| 7th Surface −1467.70271 | 0.00000 | 0.846545 × 10$^{-9}$ |
| 17th surface C6 | C8 | C10 |
| −0.116191 × 10$^{12}$ | −0.199473 × 10$^{16}$ | −0.341653 × 10$^{21}$ |
| r | κ | C4 |
| 9th Surface −499.97211 | 0.00000 | −0.976158 × 10$^{-8}$ |
| 15th Surface C6 | C8 | C10 |
| −0.415843 × 10$^{-13}$ | 0.162351 × 10$^{-16}$ | 0.411877 × 10$^{-21}$ |
| r | κ | C4 |
| 10th Surface 169.56369 | 0.00000 | −0.133118 × 10$^{-7}$ |
| 14th Surface C6 | C8 | C10 |
| −0.346654 × 10$^{-12}$ | −0.781223 × 10$^{-17}$ | −0.342202 × 10$^{-21}$ |
| r | κ | C4 |
| 22nd Surface 331.45187 | 0.00000 | 0.767965 × 10$^{-8}$ |
| C6 | C8 | C10 |
| 0.101485 × 10$^{-12}$ | 0.496639 × 10$^{-17}$ | 0.112498 × 10$^{-22}$ |
| r | κ | C4 |
| 24th Surface −435.60082 | 0.00000 | 0.751565 × 10$^{-8}$ |
| C6 | C8 | C10 |

TABLE 1-continued (General Data)
λ = 157.6 nm
FWHM: 2 pm
β = 1/4
NA = 0.65
(Data of Optical Member)

| | | |
|---|---|---|
| 0.347171 × 10$^{-12}$ | −0.222122 × 10$^{-16}$ | 0.414382 × 10$^{-21}$ |
| r | κ | C4 |
| 26th Surface 234.88821 | 0.00000 | 0.330921 × 10$^{-8}$ |
| C6 | C8 | C10 |
| −0.496173 × 10$^{-12}$ | 0.642966 × 10$^{-16}$ | 0.215905 × 10$^{-20}$ |
| r | κ | C4 |
| 27th Surface −368.96810 | 0.00000 | −0.772938 × 10$^{-8}$ |
| C6 | C8 | C10 |
| −0.292091 × 10$^{-12}$ | 0.455626 × 10$^{-17}$ | −0.159769 × 10$^{-21}$ |
| r | κ | C4 |
| 30th Surface 644.25611 | 0.00000 | 0.121898 × 10$^{-7}$ |
| C6 | C8 | C10 |
| −0.203227 × 10$^{-12}$ | 0.838252 × 10$^{-17}$ | −0.132361 × 10$^{-21}$ |
| r | κ | C4 |
| 37th Surface 250.46386 | 0.00000 | 0.100880 × 10$^{-6}$ |
| C6 | C8 | C10 |
| 0.464133 × 10$^{-11}$ | −0.276297 × 10$^{-14}$ | 0.186151 × 10$^{18}$ |
| r | κ | C4 |
| 39th Surface −5180.17894 | 0.00000 | −0.212613 × 10$^{-7}$ |
| C6 | C8 | C10 |
| −0.222172 × 10$^{-10}$ | 0.137730 × 10$^{-13}$ | −0.124632 × 10$^{-17}$ |
| r | κ | C4 |
| 40th Surface 115.59157 | 0.00000 | −0.432337 × 10$^{-7}$ |
| C6 | C8 | C10 |
| −0.741893 × 10$^{-11}$ | 0.488072 × 10$^{14}$ | 0.112316 × 10$^{17}$ |

FIGS. 5A to 5C are graphs showing the spherical aberration, the astigmatism and the distortion in the second embodiment. Further, FIGS. 6A to 6D are views each showing a lateral aberration (meridional coma) in the first embodiment.

In the respective aberration graphs, NA represents a numerical aperture on the image side, Y is an image high, the solid line indicates a center wavelength of 157.6 nm, a broken line indicates 157.6 nm+1.3 pm, and one-dotted chain line indicates 157.6 nm−1.3 pm, respectively. Further, referring to the aberration graph showing the astigmatism, S denotes a sagittal image surface, and M represents a meridional image surface.

As obvious from the respective aberration graphs, in the first embodiment, it can be understood that the various aberrations including the chromatic aberration can be well corrected for the exposure radiation of which the center wavelength is 157.6 nm and the full width half maximum is 2 pm.

Second Embodiment

FIG. 7A shows a lens layout of the projection optical system in a second embodiment, and is a sectional view taken along the plane perpendicular to the mask surface (object surface), including the optical axis which connects the concave reflecting mirror M2 to the wafer surface (image surface). Further, FIG. 7B corresponds to FIG. 7A and is a sectional view taken along the plane parallel to the mask surface, including the optical axis connecting the concave reflecting mirror M2 to the wafer surface (image surface). Referring to FIG. 7A, however, for simplifying the illustration, the reflecting mirror M1 is omitted, and the optical paths extending from the reflecting mirror M1 down to the mask R are developed on the sheet surface. In the second embodiment, the present invention is applied to the projection optical system in which the various aberrations including the chromatic aberration are corrected for the exposure radiation of which the center wavelength is 157.6 nm and the full width half maximum is 10 pm.

Note that the projection optical system in the second embodiment has a construction similar to that in the first embodiment. The followings are, however, basic differences of the second embodiment from the first embodiment. The full width half maximum of the exposure radiation is 2 pm in the first embodiment, while the full width half maximum of the exposure radiation is 10 pm in the second embodiment. The catadioptric optical system A has the four lens elements in the first embodiment, while the catadioptric optical system A has five pieces of lens elements corresponding to an increase in the full width half maximum of the exposure radiation in the second embodiment. The second embodiment will hereinafter be discussed focusing on the different points from the first embodiment.

The projection optical system in the second embodiment includes the plane-parallel plate P1 disposed in close proximity to the mask R, and the flat reflecting mirror M1 for reflecting the beams from the mask R via the plane-parallel plate P1 and guiding the beams to the catadioptric optical system A. The catadioptric optical system A is constructed of, sequentially from the incident side of the beams coming from the mask R, a negative meniscus lens L1 with a convex surface toward the incident side, a biconvex lens L2, a negative meniscus lens L3 with a convex surface toward the incident side, a negative meniscus lens L4 with a concave surface toward the incident side, a negative meniscus lens L5 with a concave surface toward the incident side, and a concave reflecting mirror M2 with a concave surface toward the incident side. Accordingly, the beams coming from the mask R penetrate the plane-parallel plate P1 and, after being reflected by the flat reflecting mirror M1, enter the catadioptric optical system A. The beams having entered the catadioptric optical system A are incident upon the concave reflecting mirror M2 through the five pieces of lens elements L1–L5. The beams reflected by the concave reflecting mirror M2 form an intermediate image of the mask pattern through the five lens elements L5–L1.

The beams from the intermediate image of the mask pattern are guided to the refracting optical system B. The refracting optical system B is constructed of, sequentially from the incident side of the beams from the intermediate image, a biconvex lens L6, a biconvex lens L7, a biconcave lens L8, a biconcave lens L9, a positive meniscus lens L10 with a concave surface toward the incident side, a positive meniscus lens L11 with a convex surface toward the incident side, a positive meniscus lens L12 with a convex surface toward the incident side, a negative meniscus lens L13 with a convex surface toward the incident side, a biconvex lens L14, and a biconvex lens L15. Note that the aperture stop S is disposed in the vicinity of the positive meniscus lens L12 in an optical path between the positive meniscus lens L12 and the negative meniscus lens L13.

Hence, the beams entering the refracting optical system B from the intermediate image of the mask pattern, form a reduced image of the mask pattern in the exposure area on the wafer W via the respective lens elements L6–L15.

Note that the concave reflecting mirror M2 and all the lens elements L1–L15 are disposed along the common optical axis AX in the optical paths extending from the concave reflecting mirror M2 to the biconvex lens L15.

The next Table 2 shows values of various items of data of the projection optical system in the second embodiment. In Table 2, $\lambda$ represents a central wavelength of the exposure radiation, FWHM is a full width half maximum of the exposure radiation, $\beta$ is a projection magnification, and NA is a numerical aperture on the image side, respectively.

Further, a surface number indicates a sequence of the surfaces from the mask side along a direction in which the beams travel toward the wafer surface defined as an image surface from the mask surface as an object surface, r indicates a radius of curvature (radius of curvature of apex in the case of the aspherical surface) of each surface, d is an on-axis interval between the respective surfaces, i.e., a surface-to-surface interval, and n denotes a refractive index with respect to the center wavelength.

Note that a sign of the surface interval d shall be changed whenever reflected. Accordingly, the sign of the surface interval d is negative throughout the optical path from the flat reflecting mirror M1 to the concave reflecting mirror M2, and is positive throughout other optical paths. Then, on the optical path where the surface interval d is positive, the radius of curvature of the convex surface toward the incident side of the beams is positive, and the radius of curvature of the concave surface is negative. Reversely, on the optical path where the surface interval d is negative, the radius of curvature of the concave surface toward the incident side of the beams is positive, and the radius of curvature of the convex surface is negative.

TABLE 2

(General Data)
$\lambda$ = 156 nm
FWHM: 10 pm
$\beta$ = 1/4
NA = 0.65
(Data of Optical Member)

| Surface Number | r | d | n | |
|---|---|---|---|---|
| | (Mask Surface) | 20.000000 | | |
| 1 | ∞ | 10.000000 | 1.5600000 | (P1) |
| 2 | ∞ | 95.000000 | | |
| 3 | ∞ | −149.717330 | | (M1) |
| 4 | −682.92265 | −30.000000 | 1.5600000 | (L1) |
| 5* | −588.26859 | −1.333333 | | |
| 6 | −430.94316 | −40.000000 | 1.5600000 | (L2) |
| 7* | 1484.17685 | −150.777176 | | |
| 8 | −267.06519 | −30.000000 | 1.5600000 | (L3) |
| 9* | −264.72399 | −271.803380 | | |
| 10* | 280.88127 | −40.000000 | 1.5600000 | (L4) |
| 11 | 430.96701 | −47.259520 | | |
| 12* | 173.49424 | −24.634368 | 1.5600000 | (L5) |
| 13 | 875.59639 | −23.962719 | | |
| 14 | 283.82726 | 23.962719 | | (M2) |
| 15 | 875.59639 | 24.634368 | 1.5600000 | (L5) |
| 16* | 173.49424 | 47.259520 | | |
| 17 | 430.96701 | 40.000000 | 1.5600000 | (L4) |
| 18* | 280.88127 | 271.803380 | | |
| 19* | −264.72399 | 30.000000 | 1.5600000 | (L3) |
| 20 | −267.06519 | 150.777176 | | |
| 21* | 1484.17685 | 40.000000 | 1.5600000 | (L2) |
| 22 | −430.94316 | 1.333333 | | |
| 23* | −588.26859 | 30.000000 | 1.5600000 | (L1) |
| 24 | −682.92265 | 369.717330 | | |
| 25 | 238.57662 | 60.000000 | 1.5600000 | (L6) |
| 26* | −1018.49483 | 0.100000 | | |
| 27 | 537.43794 | 60.000000 | 1.5600000 | (L7) |
| 28* | −1553.84088 | 5.862119 | | |
| 29 | −871.09012 | 33.333333 | 1.5600000 | (L8) |
| 30* | 889.60239 | 20.205850 | | |
| 31 | −485.37887 | 35.200000 | 1.5600000 | (L9) |
| 32* | 370.25580 | 345.890970 | | |
| 33* | −374.83682 | 35.200000 | 1.5600000 | (L10) |
| 34 | −212.27674 | 0.100000 | | |
| 35 | 252.25212 | 34.214400 | 1.5600000 | (L11) |
| 36* | 1101.27714 | 41.001563 | | |
| 37 | 158.00018 | 48.110144 | 1.5600000 | (L12) |
| 38* | 426.66235 | 11.751647 | | |
| 39 | ∞ | 71.207488 | | (S) |
| 40 | 261.87894 | 49.757164 | 1.5600000 | (L13) |
| 41* | 129.89231 | 5.696443 | | |

TABLE 2-continued (General Data)
$\lambda$ = 156 nm
FWHM: 10 pm
$\beta$ = 1/4
NA = 0.65
(Data of Optical Member)

| 42 | 111.81396 | 20.000000 | 1.5600000 | (L14) |
|---|---|---|---|---|
| 43* | −713.41458 | 0.684288 | | |
| 44* | 139.86748 | 53.916336 | 1.5600000 | (L15) |
| 45 | −390.69540 | 5.000000 | | |

(Wafer Surface)
(Data of Aspherical Surface)

| r | $\kappa$ | C4 |
|---|---|---|
| 5th Surface −588.26859 | 0.00000 | −0.231151 × 10⁻⁸ |
| 23rd Surface C6 | C8 | C10 |
| −0.107657 × 10⁻¹² | 0.679561 × 10⁻¹⁷ | 0.200076 × 10⁻²¹ |
| r | $\kappa$ | C4 |
| 7th Surface 1484.17685 | 0.00000 | 0.208708 × 10⁻⁸ |
| 21st Surface C6 | C8 | C10 |
| 0.101520 × 10⁻¹² | −0.936224 × 10⁻¹⁷ | −0.109080 × 10⁻²¹ |
| r | $\kappa$ | C4 |
| 9th Surface −264.72899 | 0.00000 | −0.596956 × 10⁸ |
| 19th Surface C6 | C8 | C10 |
| −0.804409 × 10⁻¹³ | 0.594035 × 10⁻¹⁷ | −0.511225 × 10⁻²² |
| r | $\kappa$ | C4 |
| 10th Surface 280.88127 | 0.00000 | −0.270202 × 10⁻⁸ |
| 15th Surface C6 | C8 | C10 |
| −0.165650 × 10⁻¹² | −0.319705 × 10⁻¹⁷ | −0.722147 × 10⁻²¹ |
| r | $\kappa$ | C4 |
| 12th Surface 178.49424 | 0.00000 | −0.896367 × 10⁻⁸ |
| 16th Surface C6 | C8 | C10 |
| −0.112007 × 10⁻¹² | −0.376263 × 10⁻¹⁸ | 0.205581 × 10⁻²² |
| r | $\kappa$ | C4 |
| 26th Surface −1018.49483 | 0.00000 | −0.161303 × 10⁻⁸ |
| C6 | C8 | C10 |
| −0.132885 × 10⁻¹³ | 0.112230 × 10⁻¹⁶ | −0.279049 × 10²¹ |
| r | $\kappa$ | C4 |
| 28th Surface −1558.84088 | 0.00000 | 0.178392 × 10⁻⁸ |
| C6 | C8 | C10 |
| 0.484443 × 10⁻¹³ | −0.385332 × 10⁻¹⁶ | 0.135532 × 10⁻²⁰ |
| r | $\kappa$ | C4 |
| 30th Surface 889.60239 | 0.00000 | 0.252762 × 10⁻⁷ |
| C6 | C8 | C10 |
| 0.592624 × 10¹² | 0.146825 × 10¹⁶ | −0.127357 × 10²⁰ |
| r | $\kappa$ | C4 |
| 32nd Surface 370.255800 | 0.00000 | −0.427239 × 10⁻⁸ |
| C6 | C8 | C10 |
| −0.252857 × 10⁻¹² | 0.611208 × 10⁻¹⁶ | 0.198023 × 10⁻²¹ |
| r | $\kappa$ | C4 |
| 33rd Surface −374.83682 | 0.00000 | −0.713446 × 10⁻⁸ |
| C6 | C8 | C10 |
| −0.358473 × 10⁻¹² | 0.976519 × 10⁻¹⁷ | −0.144877 × 10⁻²¹ |
| r | $\kappa$ | C4 |
| 36th Surface 1101.27714 | 0.00000 | 0.813610 × 10⁻⁸ |
| C6 | C8 | C10 |
| −0.519537 × 10⁻¹² | 0.103493 × 10⁻¹⁶ | 0.452136 × 10⁻²² |
| r | $\kappa$ | C4 |
| 38th Surface 426.66235 | 0.00000 | 0.202344 × 10⁷ |
| C6 | C8 | C10 |
| 0.486990 × 10⁻¹² | −0.709243 × 10⁻¹⁷ | 0.198192 × 10⁻²¹ |
| r | $\kappa$ | C4 |
| 41st Surface 129.80231 | 0.00000 | 0.379939 × 10⁻⁷ |
| C6 | C8 | C10 |
| 0.248170 × 10⁻¹⁰ | 0.278364 × 10⁻¹⁴ | 0.221665 × 10⁻¹⁸ |
| r | $\kappa$ | C4 |
| 43rd Surface −713.41458 | 0.000000 | −0.142506 × 10⁷ |
| C6 | C8 | C10 |
| −0.128262 × 10⁻¹¹ | 0.598993 × 10⁻¹⁵ | 0.779998 × 10⁻¹⁹ |
| r | $\kappa$ | C4 |
| 44th Surface 139.86748 | 0.00000 | −0.921480 × 10⁻⁷ |
| C6 | C8 | C10 |
| 0.175784 × 10⁻¹⁰ | 0.573035 × 10⁻¹⁴ | 0.703403 × 10⁻¹⁸ |

FIGS. 8A to 8C are graphs showing the spherical aberration, the astigmatism and the distortion in the second embodiment. Further, FIGS. 9A to 9D are views each showing a lateral aberration (meridional coma) in the second embodiment.

In the respective aberration graphs, NA represents a numerical aperture on the image side, Y is an image height, the solid line indicates a center wavelength of 157.6 nm, a broken line indicates 157.6 nm+8.6 pm, and one-dotted chain line indicates 157.6 nm−8.6 pm, respectively. Further, referring to the aberration graph showing the astigmatism, S denotes a sagittal image surface, and M represents a meridional image surface.

As obvious from the respective aberration graphs, in the second embodiment, it can be understood that the various aberrations including the chromatic aberration can be well corrected for the exposure radiation of which the center wavelength is 157.6 nm and the full width half maximum is 10 pm.

In the first and second embodiments, neither the concave mirror nor the lens elements including the optical axis non-parallel to the direction of gravity. Accordingly, an asymmetric deformation due to the gravity is not caused in the lens elements and the concave mirror, and it is possible to sufficiently restrain a decline of an image forming performance even when trying to increase the numerical aperture of the projection optical system and enlarging the exposure area.

Third Embodiment and Fourth Embodiment

Figure 10:
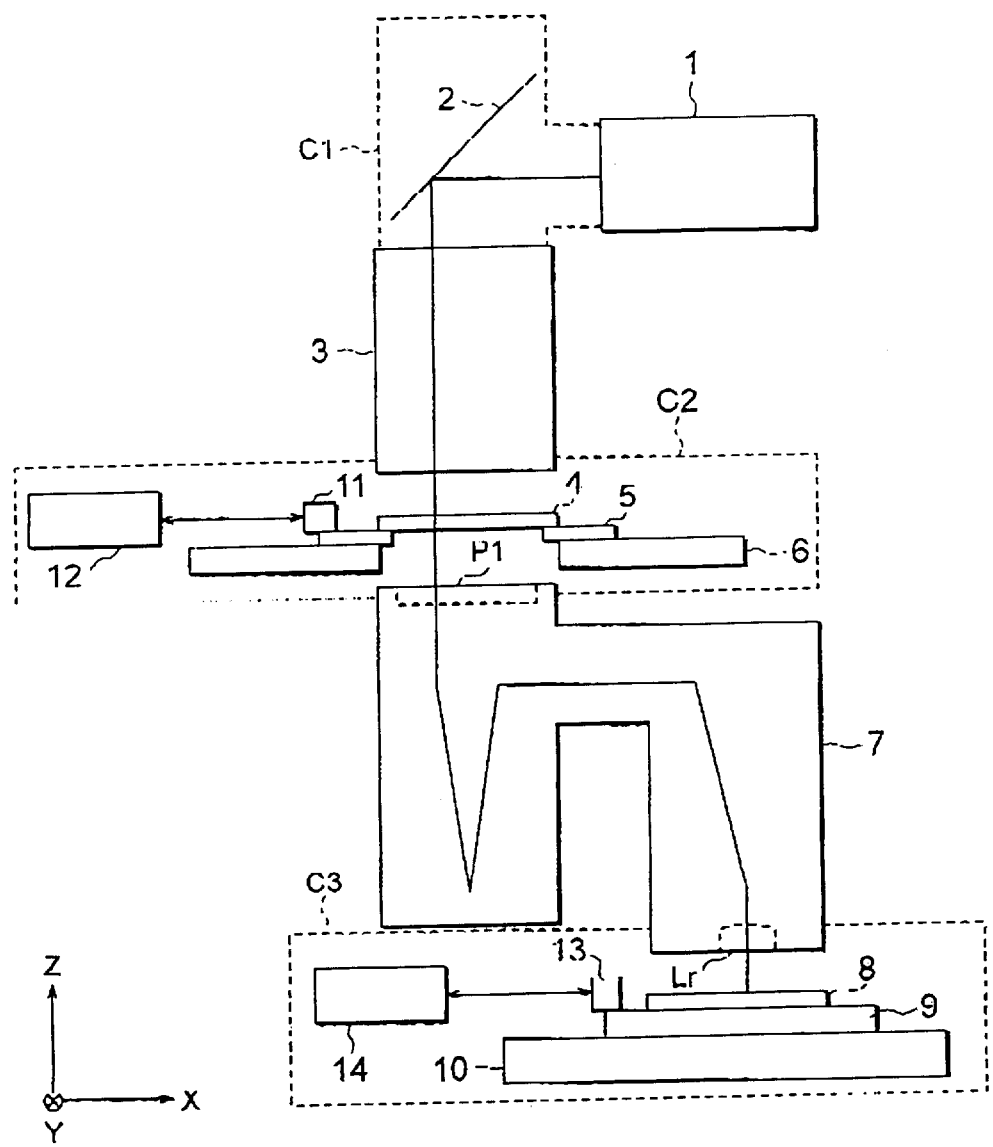
FIG. 10 is a view showing an outline of a whole construction of the projection exposure apparatus in third and fourth embodiments of the present invention.

FIG. 10 is a view showing an outline of a whole construction of the projection exposure apparatus in third and fourth embodiments of the present invention, incidentally, referring to FIG. 10, the Z-axis is set in a direction of normal line of the wafer surface, the X-axis is set in parallel to the sheet surface in FIG. 10, and the Y-axis is set perpendicularly to the sheet surface. Referring again to FIG. 10, the direction of gravity is the same as the direction of the Z axis.

The third and fourth embodiments have similar constructions as those in the first and second embodiments, however, the construction of the projection optical system is basically different from those in the first and second embodiments. The third and fourth embodiments will hereinafter be discussed focusing on the different points from the first and second embodiments.

In the projection exposure apparatus illustrated therein, the beams omitted in the X direction from the $F_2$ laser 1 (of which an oscillation center wavelength is 157.6 nm), are deflected in the Z-direction by the deflection mirror 2, and thereafter a mask 4 is uniformly illuminated with these deflected beams through the illumination optical system 3.

Note that only the single deflection mirror 2 is illustrated in the optical path from the radiation source 1 down to the illumination optical system in FIG. 10, however, in fact, as in the example shown in FIG. 3, there are disposed optical systems such as an auto tracking unit, a beam profile adjusting optical system and a radiation quantity adjusting unit. Further, the illumination optical system 3 shown in FIG. 10 includes, as in the example shown in FIG. 3, optical systems such as an optical integrator, a field stop, and a field stop imaging optical system. In the example shown in FIG. 10 also, a space between the radiation source 1 and the illumination optical system 3 is, as in the example shown in FIG. 3, sealed by a casing C1, and an air space extending from the radiation source 1 down to an optical member closest to the mask R in the illumination optical system 3 is replaced with an inert gas such as a helium gas. Note that the way of how the optical path is folded is not limited to the mode shown in FIG. 10, and, as a matter of course, may properly be changed corresponding to a design of the apparatus.

The mask 4 is held in parallel to the X—X plane on the mask stage 6 by the mask holder 5. The mask 4 is formed with a pattern that should be transferred, and a rectangular pattern area having a long side along the Y-direction and a short side along the X-direction in the whole pattern area, is illuminated with the laser beams.

The mask stage 6 is two-dimensionally movable along the mask surface (i.e., along the X-Y plane) by operating an unillustrated drive system, and a mechanism is that position coordinates thereof are measured and controlled by the interferometer 12 using the mask movable mirror 11.

The beams from the pattern formed on the mask 4 form a mask pattern image on the wafer 8 classified as a photosensitive substrate through a projection optical system 7. The wafer 8 is held by the wafer holder 9 in parallel to the X-Y plane on the wafer stage 10. Then, a pattern image is formed in a rectangular exposure area having a long side along the Y-direction and a short side along the X-direction on the wafer 8 so as to optically correspond to the rectangular illumination area on the mask 4.

The wafer stage 10 is two-dimensionally movable along the wafer surface (i.e., along the X-Y plane) by operating an unillustrated drive system, and a mechanism is that position coordinates thereof are measured and controlled by the interferometer 14 using the wafer movable mirror 13.

In the illustrated projection exposure apparatus, an interior of the projection optical system 7 between the plane-parallel plate P1 disposed closest to the mask and the lens Lr disposed closest to the wafer among the optical members constituting the projection optical system 7, is kept in a gas-proof state. A gas existing inside the projection optical system 7 is replaced with the helium gas exhibiting a low absorption rate of the exposure radiation. Similarly, an interior of the optical path extending from the radiation source 1 to the illumination optical system 3 is replaced with the helium gas.

Then, the mask 4 and the mask stage 6 are disposed on the narrow optical path between the illumination optical system 3 and the plane-parallel plate P1. However, the interior of the casing C2 encasing the mask 4 and the mast stage 6 by sealing, is filled with the inert gas such as nitrogen and helium gas, whereby the interior of the optical path between the illumination optical system 3 and the plane-parallel plate P1 is replaced with the inert gas. The wafer 8 and the wafer stage 10 are disposed on the narrow optical path between the lens Lr and the wafer 8. However, the interior of the casing C3 encasing the wafer 8 and the wafer stage 10 by sealing, is filled with the inert gas such as nitrogen and helium gas, whereby the interior of the optical path between the lens Lr and the wafer 8 is replaced with the inert gas. The mechanically movable members (the mask stage 6, the wafer stage 10 etc.) are, however, disposed on those optical paths, and it is therefore inevitable that a degree of cleanness of the gas declines due to the movements of those movable members.

Incidentally, it is preferable that the robot arm for exchanging the mask and the robot arm for exchanging the wafer be encased in a casing different from the casings C2, C3 in order to increase the degree of cleanness of each of those optical paths, however, even if thus encased, the degree of cleanness tends to be lower than a degree of cleanness of the gas inside the projection optical system 7.

As described above, where the exposure radiation passes through the gas exhibiting the low degree of cleanness along the optical paths from the radiation source 1 to the wafer 8, may be the narrow optical path between the illumination optical system 3 and the mask 4, the narrow optical path between the mask 4 and the plane-parallel plate P1, and the narrow optical path between the lens Lr and the wafer 8.

As discussed above, the area of field of view (illumination area) on the mask 4 and the projection area (exposure area) on the wafer 8, which are defined by the projection optical system 7, each takes the rectangular shape with the short side extending in the X-direction. Accordingly, the mask stage 6 and the wafer stage 10, more essentially, the mask 4 and the wafer 8 are synchronously scanned in a direction of the short side of each of the rectangular exposure area and of the illumination area, i.e., in the x-direction while controlling the positions of the mask 4 and of the wafer 8 by use of the drive systems and the interferometers (12, 14), whereby the mask pattern is scanned over an area having a width equal to the long side of the exposure area and a length corresponding to a scan quantity on the wafer 8, thus exposing this area to the beams of the mask pattern. As discussed above, in the third and fourth embodiments, the mask surface and the wafer surface are parallel to each other, and the scan direction thereof is set in the horizontal direction.

Third Embodiment

Figure 11:
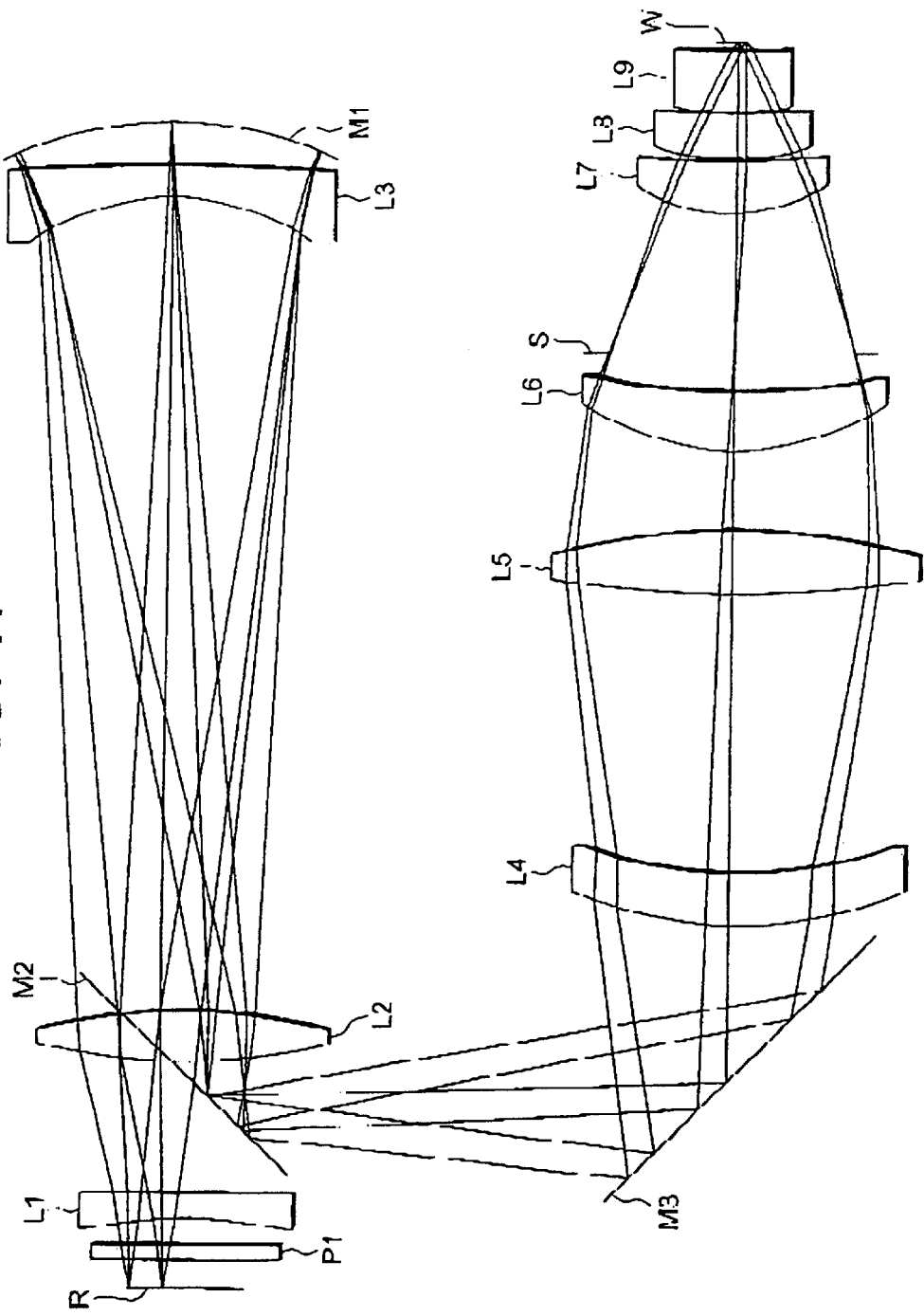
FIG. 11 shows a lens layout of the projection optical system in the third embodiment, and is a sectional view taken along the plane containing an optical axis AX1 of a catadioptric optical system A and an optical axis AX2 of a refracting optical system B.
Figure 13A:
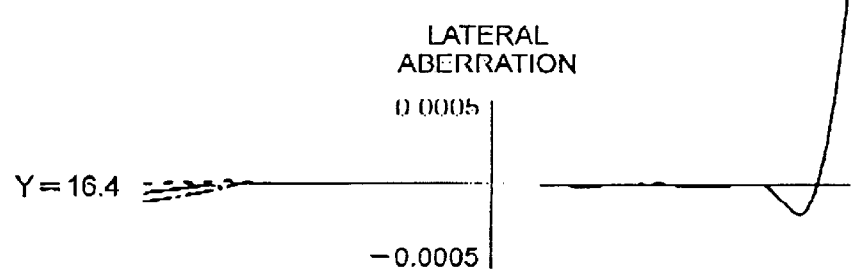
FIGS. 13A to 13D are graphs each showing the lateral aberration (meridional coma) in the third embodiment.
Figure 13B:
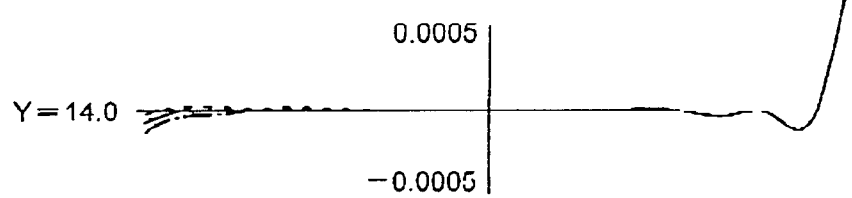
Figure 13C:
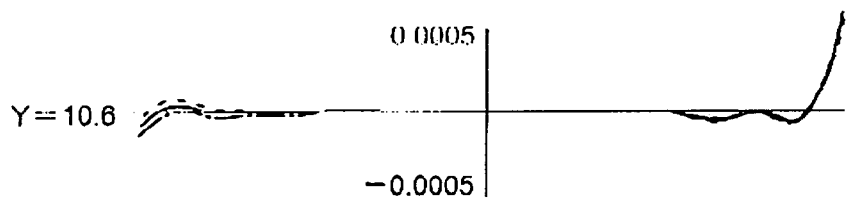
Figure 13D:
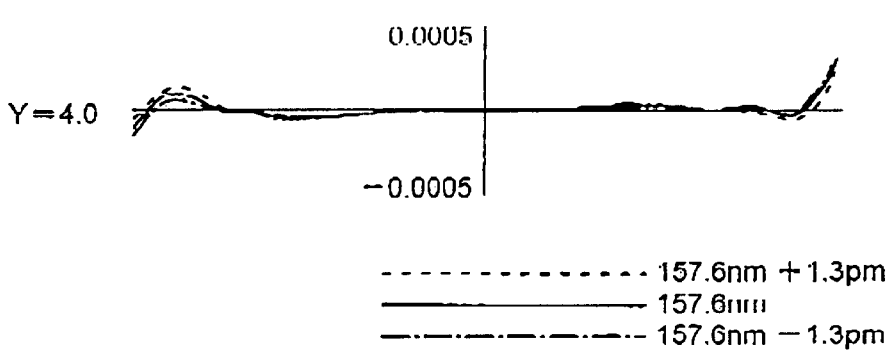

FIG. 11 shows a lens layout of the projection optical system in a third embodiment, and is a sectional view taken along the plane including an optical axis AX1 of the catadioptric optical system A and an optical axis AX2 of the refracting optical system B. In the third embodiment, the present invention is applied to the projection optical system in which the various aberrations including the chromatic abberration are corrected for the exposure radiation of which the center wavelength is 157.6 nm and the full width half maximum is 2 pm.

In the projection optical system illustrated therein is of the same type as the optical system disclosed in Japanese Patent Application Laid-Open Publication No. 8-334695. That is, in the projection optical system according to the third embodiment, the flat reflecting mirror M2 with a reflecting surface inclined at 45 degrees to the optical axis AX1 of the catadioptric optical system A, is disposed in a position where the beams are thinned in the vicinity of the position formed with an intermediate image. For optically connecting the refracting optical system B including the optical axis AX2 parallel to the optical axis AX1 of the catadioptric optical system A to the catadioptric optical system A, there is disposed a flat reflecting mirror M3 with a reflecting surface inclined at 45 degrees to the optical axis AX2 of the refracting optical system B and orthogonal to the reflecting surface of the flat reflecting mirror M2.

Consequently, in the case of the projection optical system in the third embodiment, the plane-parallel plate P1 disposed in the vicinity of the mask R (corresponding to the reference numeral 4 in FIG. 10), all the lens elements constituting the catadioptric optical system A and the concave reflecting mirror M1, are disposed on the optical axis AX1, and all the lens elements constituting the refracting optical system B are disposed on the optical axis AX2 parallel to the optical axis AX1. Then, as shown in FIG. 10, when horizontally supporting the mask 4 and the wafer 8, it follows that all the lens elements constituting the projection optical system 7 are likewise horizontally supported, and there is yielded an advantage that the lens elements are hard to receive an adverse influence by the gravity. Another advantage is that the catadioptric optical system A and the refracting optical system B are disposed along the two optical axes AX1, AX2 parallel to each other, and hence a lens barrel does not The projection optical system in the third embodiment has the plane-parallel plate P1 disposed in the vicinity of the mask R, and the beams coming from the mask R and penetrating this plane-parallel plate P1 enter the catadioptric optical system A. The catadioptric optical system A is constructed of, sequentially from the incident side of the beams coming from the mask R, a biconcave lens L1, a biconvex lens L2, a negative meniscus lens L3 with a concave surface toward the incident side, and a concave reflecting mirror M1 with a concave surface toward the incident side. Consequently the beams coming from the mask R, after penetrating the plane-parallel plate P1, enter the catadioptric optical system A. The beams entering the catadioptric optical system A are incident upon the concave reflecting mirror M1 via three pieces of lens element L1–L3. The beams reflected by the concave reflecting mirror M1 form an intermediate image of the mask pattern in the vicinity of the flat reflecting mirror M2 via the two lens elements L3, L2.

The beams from the intermediate image of the mask pattern are incident on the refracting optical system D via the flat reflecting mirrors M2, M3. The refracting optical system B is constructed of, sequentially from the incident side of the beams from the intermediate image, a positive meniscus lens L4 with a convex surface toward the incident side, a biconvex lens L5, a positive meniscus lens L6 with a convex surface toward the incident side, a positive meniscus lens L7 with a convex surface toward the incident side, a positive meniscus lens L8 with a convex surface toward the incident side, and a biconvex lens L9. Note that the aperture stop S is disposed on an optical path between the positive meniscus lend L6 and the positive meniscus lens L7.

Hence, the beams entering the refracting optical system B from the intermediate image of the mask pattern, form a reduced image of the mask pattern in the exposure area on the wafer W (corresponding to a reference numeral 8 in FIG. 10) via the respective lens elements L4–L9.

The next Table 3 shows values of various items of data of the projection optical system in the third embodiment. In Tables 3, λ represents a central wavelength of the exposure radiation, FWHM is a full width half maximum of the exposure radiation, β is a projection magnification, and NA is a numerical aperture on the image side, respectively. Further, a surface number indicates a sequence of the surfaces from the mask side along a direction in which the beams travel toward the wafer surface defined as an image surface from the mask surface as an object surface, r indicates a radius of curvature (radius of curvature at apex in the case of the aspherical surface) of each surface, d is an axial interval between the respective surfaces, i.e., a surface-to-surface interval, and n denotes a refractive index with respect to the center wavelength.

Note that a sign of the surface interval d shall be changed whenever reflected. Consequently, the sign of the surface interval d is negative throughout the optical path from the concave reflecting mirror M1 to the flat reflecting mirror M2 and also negative throughout the optical path from the flat reflecting mirror M3 to the wafer surface, and is positive throughout other optical paths. Then, on the optical path where the surface interval d is positive, the radius of curvature of the convex surface toward the incident side of the beams is positive, and the radius of curvature of the concave surface is negative. Reversely, on the optical path where the surface interval d is negative, the radius of curvature of the concave surface toward the incident side of the beams is positive, and the radius of curvature of the convex surface is positive.

TABLE 3

(General Data)
λ = 157.6 nm
FWHM: 2 pm
β = 1/4
NA = 0.65
(Data of Optical Member)

| Surface Number | r | d | n | |
|---|---|---|---|---|
| | (Mask Surface) | 20.000000 | | |
| 1 | ∞ | 10.000000 | 1.5600000 | (P1) |
| 2 | ∞ | 21.056466 | | |
| 3* | −410.25845 | 19.200000 | 1.5600000 | (L1) |
| 4 | 7622.04648 | 97.814420 | | |
| 5 | 442.05840 | 38.000000 | 1.5600000 | (L2) |
| 6* | −460.79557 | 637.333293 | | |
| 7* | −181.36058 | 24.000000 | 1.5600000 | (L3) |
| 8 | −2202.85929 | 34.559790 | | |
| 9 | −295.90836 | −34.559790 | | (M1) |
| 10 | −2202.35929 | −24.000000 | 1.5600000 | (L3) |
| 11* | −181.86058 | −637.888298 | | |
| 12* | −460.79557 | −38.000000 | 1.5600000 | (L2) |
| 13 | 442.05840 | −8.600000 | | |
| 14 | ∞ | 410.000000 | | (M2) |
| 15 | ∞ | −107.846514 | | (M3) |
| 16* | −271.59461 | −40.000000 | 1.5600000 | (L4) |
| 17 | −294.15246 | −221.080055 | | |
| 18 | −736.15276 | −50.000000 | 1.5600000 | (L5) |
| 19* | 534.11818 | −68.960648 | | |
| 20 | −178.13615 | −46.000000 | 1.560000 | (L6) |
| 21* | −558.07630 | −31.709633 | | |
| 22 | ∞ | −107.125047 | | (S) |
| 23 | −124.45291 | −40.000000 | 1.5600000 | (L7) |
| 24* | −701.01490 | −2.857325 | | |
| 25 | −187.95248 | −35.000000 | 1.5600000 | (L8) |
| 26 | −535.34602 | −0.651637 | | |
| 27 | −195.99609 | −40.806762 | 1.5600000 | (L9) |
| 28* | 7665.52661 | 6.232089 | | |

(Wafer Surface)
(Data of Aspherical Surface)

| r | κ | C4 |
|---|---|---|
| 3rd Surface −410.25845 | 0.00000 | −0.464328 × $10^{-8}$ |
| C6 | C8 | C10 |
| 0.289652 × $10^{-12}$ | 0.876203 × $10^{-17}$ | −0.101393 × $10^{-21}$ |
| r | κ | C4 |
| 6th Surface 460.79557 | 0.00000 | 0.655550 × $10^{-8}$ |
| 12th Surface C6 | C8 | C10 |
| 0.750690 × $10^{-18}$ | −0.375816 × $10^{-18}$ | −0.275978 × $10^{-23}$ |
| r | κ | C4 |
| 7th Surface −181.36058 | 0.00000 | 0.947631 × $10^{-8}$ |
| 11th Surface C6 | C8 | C10 |
| 0.247890 × $10^{-12}$ | 0.374299 × $10^{-17}$ | 0.263940 × $10^{-21}$ |
| r | κ | C4 |
| 16th Surface 271.59461 | 0.00000 | 0.427427 × $10^{-8}$ |
| C6 | C8 | C10 |
| 0.411417 × $10^{-13}$ | 0.204209 × $10^{-18}$ | −0.710805 × $10^{-23}$ |
| r | κ | C4 |
| 19th Surface 534.11318 | 0.00000 | 0.564196 × $10^{-8}$ |
| C6 | C8 | C10 |
| −0.362399 × $10^{-15}$ | −0.263491 × $10^{-17}$ | 0.420225 × $10^{-22}$ |
| r | κ | C4 |
| 21st Surface −558.07630 | 0.00000 | −0.314496 × $10^{-7}$ |
| C6 | C8 | C10 |
| 0.185759 × $10^{-13}$ | −0.161021 × $10^{-17}$ | −0.415788 × $10^{-21}$ |
| r | κ | C4 |
| 24th Surface −701.01400 | 0.00000 | −0.337626 × $10^{-7}$ |
| C6 | C8 | C10 |
| 0.160965 × $10^{-12}$ | −0.735123 × $10^{-17}$ | 0.441992 × $10^{-21}$ |
| r | κ | C4 |
| 28th Surface 7665.52661 | 0.00000 | −0.152895 × $10^{6}$ |
| C6 | C8 | C10 |
| −0.665509 × $10^{-10}$ | 0.988785 × $10^{-13}$ | −0.520573 × $10^{-16}$ |

FIGS. 12A to 12C are graphs showing the spherical aberration, the astigmatism and the distortion in the third embodiment. Further, FIGS. 13A to 13D are views each showing a lateral aberration (meridional coma) in the third embodiment.

In the respective aberration graphs, NA represents a numerical aperture on the image side, Y is an image height, the solid line indicates a center wavelength of 157.6 nm, a broken line indicates 157.6 nm+1.3 pm, and one-dotted chain line indicates 157.6 nm−1.3 pm, respectively. Further, referring to the aberration graph showing the actigmatism, S denotes a sagittal image surface, and M represents a meridional image surface.

As obvious from the respective aberration graphs, in the third embodiment, it can be understood that the various aberrations including the chromatic aberration can be well corrected for the exposure radiation of which the center wavelength is 157.6 nm and the full width half maximum is 2 pm.

Fourth Embodiment

Figure 14:
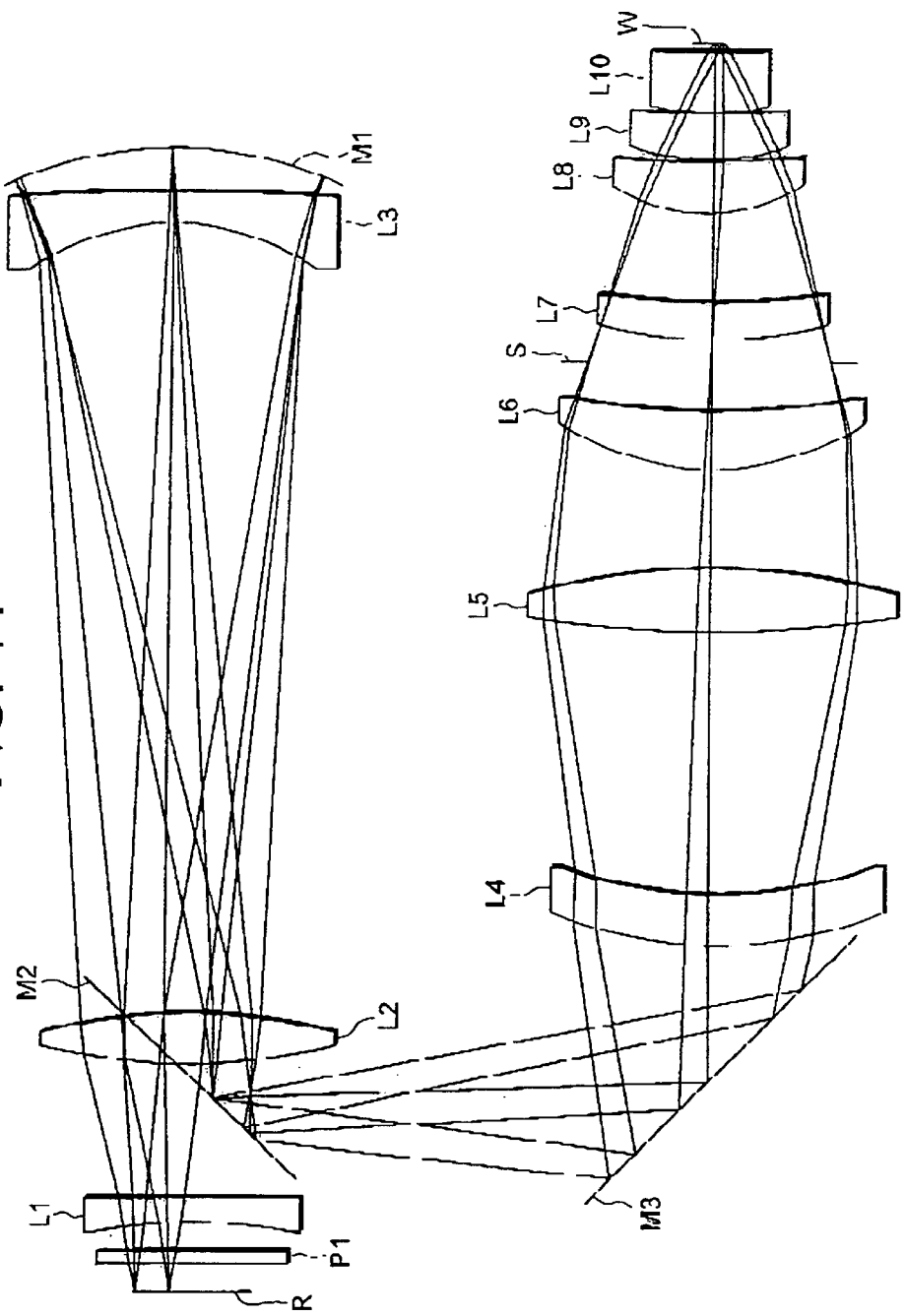
FIG. 14 shows a lens layout of the projection optical system in the fourth embodiment, and is a sectional view taken along the plane containing the optical axis AX1 of the catadioptric optical system A and the optical axis AX2 of the refracting optical system B.
Figure 16A:
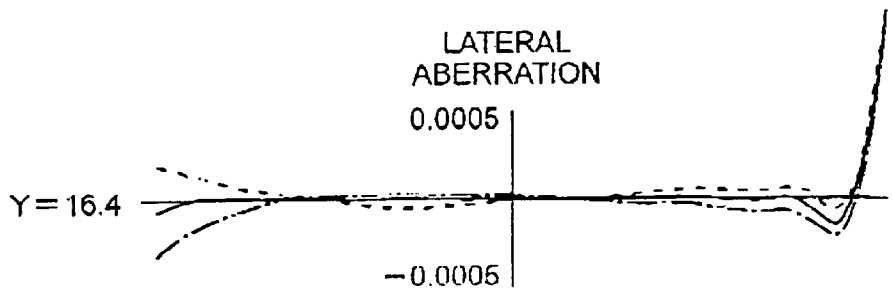
FIGS. 16A to 16D are graphs each showing the lateral aberration (meridional coma) in the fourth embodiment.
Figure 16B:
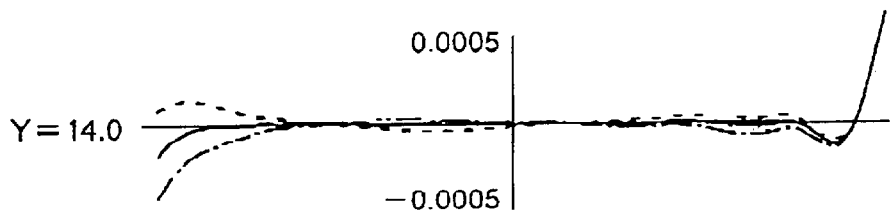
Figure 16C:
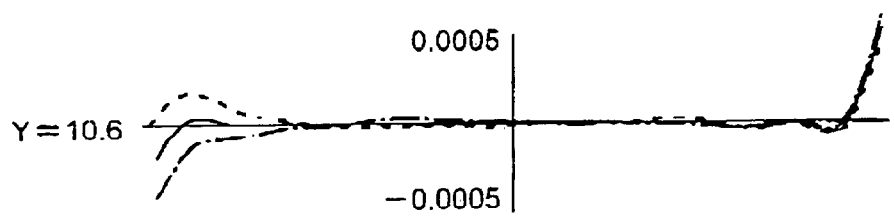
Figure 16D:
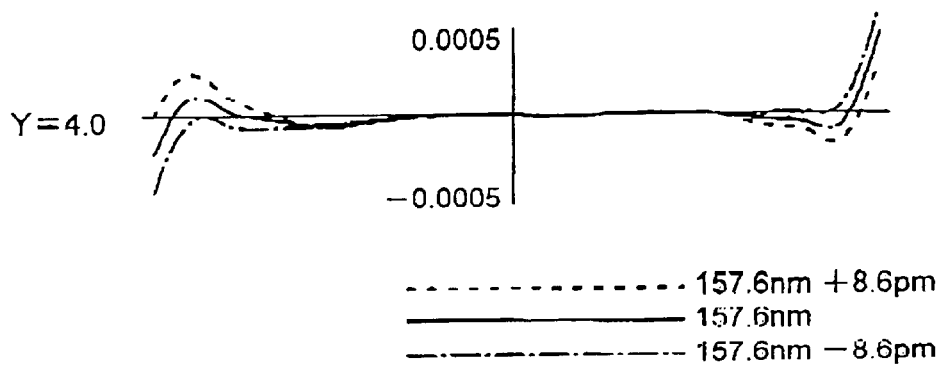

FIG. 14 shows a lens layout of the projection optical system in a fourth embodiment, and is a sectional view taken along the plane including the optical axis AX1 of the catadioptric optical system A and the optical axis AX2 of the refracting optical system B. In the fourth embodiment, the present invention is applied to the projection optical system in which the various aberrations including the chromatic aberration are corrected for the exposure radiation of which the center wavelength is 157.6 nm and the full width half maximum is 10 pm.

The projection optical system in the fourth embodiment has a construction similar to that in the third embodiment. The followings are, however, basic differences of the fourth embodiment from the third embodiment. The full width half maximum of the exposure radiation is 2 pm in the third embodiment, while the full width half maximum of the exposure radiation is 10 pm in the fourth embodiment. The refracting optical system B has the six lens elements in the third embodiment, while the refracting optical system B has seven pieces of lens elements corresponding to an increase in the full width half maximum of the exposure radiation in the fourth embodiment. The fourth embodiment will hereinafter be discussed focusing on the different points from the third embodiment.

The projection optical system in the fourth embodiment has the plane-parallel plate P1 disposed in the vicinity of the mask R, and the beams coming from the mask R and penetrating this plane-parallel plate P1 enter the catadioptric optical system A. The catadioptric optical system A is constructed of, sequentially from the incident side of the beams coming from the mask R, a biconcave lens L1, a biconvex lens L2, a negative meniscus lens L3 with a concave surface toward the incident side, and a concave reflecting mirror M1 with a concave surface toward the incident side. Consequently, the beams coming from the mask R, after penetrating the plane-parallel plate P1, enter the catadioptric optical system A. The beams entering the catadioptric optical system A are incident upon the concave reflecting mirror M1 via three pieces of lens elements L1–L3. The beams reflected by the concave reflecting mirror M1 form an intermediate image of the mask pattern in the vicinity of the flat reflecting mirror M2 via the two lens elements L3, L2.

The beams from the intermediate image of the mask pattern are incident on the refracting optical system B via the flat reflecting mirrors M2, M3. The refracting optical system B is constructed of, sequentially from the incident side of the beams from the intermediate image, a positive meniscus lens L4 with a convex surface toward the incident side, a biconvex lens L5, a positive meniscus lens L6 with a convex surface toward the incident side, a positive meniscus lens L7 with a convex surface toward the incident side, a positive meniscus lens L8 with a convex surface toward the incident side, a positive meniscus lens L9 with a convex surface toward the incident side, and a biconvex lens L10. Note that the aperture stop S is disposed on an optical path between the positive meniscus lens L6 and the positive meniscus lens L7.

Hence, the beams entering the refracting optical system B from the intermediate image of the mask pattern, form a reduced image of the mask pattern in the exposure area on the wafer W via the respective lens elements L4–L10.

The next Table 4 shows values of various items of data of the projection optical system in the fourth embodiment. In Table 4, λ represents a central wavelength of the exposure radiation, FWHM is a full width half maximum of the exposure radiation, β is a projection magnification, and NA is a numerical aperture on the image side, respectively. Further, a surface number indicates a sequence of the surfaces from the mask side along a direction in which the beams travel toward the wafer surface defined as an image surface from the mask surface as an object surface, r indicates a radius of curvature (radius of curvature at apex in the case of the aspherical surface) of each surface, d is an axial interval between the respective surfaces, i.e., a surface-to-surface interval, and n denotes a refractive index with respect to the center wavelength.

Note that a sign of the surface interval d shall be changed whenever reflected. Consequently, the sign of the surface interval d is negative throughout the optical path from the concave reflecting mirror M1 to the flat reflecting mirror M2 and also negative throughout the optical path from the flat reflecting mirror M3 to the wafer surface, and is positive throughout other optical paths. Then, on the optical path where the surface interval d is positive, the radius of curvature of the convex surface toward the incident side of the beams is positive, and the radius of curvature of the concave surface is negative. Reversely, on the optical path where the surface interval d is negative, the radius of curvature of the concave surface toward the incident side of the beams is positive, and the radius of curvature of the convex surface is positive.

TABLE 4

(General Data)
λ = 157.6 nm
FWHM: 10 pm
β = 1/4
NA = 0.65
(Data of Optical Member)

| Surface Number | r | d | n | |
|---|---|---|---|---|
| | (Mask Surface) | 20.000000 | | |
| 1 | ∞ | 10.000000 | 1.5600000 | (P1) |
| 2 | ∞ | 8.000000 | | |
| 3* | −372.48390 | 19.200000 | 1.5600000 | (L1) |
| 4 | 2824.40505 | 107.691386 | | |
| 5 | 441.56209 | 38.000000 | 1.5600000 | (L2) |
| 6* | −467.54839 | 632.035292 | | |
| 7* | 181.16467 | 24.000000 | 1.5600000 | (L3) |
| 8 | −2171.42785 | 34.485069 | | |

TABLE 4-continued (General Data)
$\lambda = 157.6$ nm
FWHM: 10 pm
$\beta = 1/4$
NA = 0.65
(Data of Optical Member)

| | | | | |
|---|---|---|---|---|
| 9 | −295.94748 | −34.485069 | | (M1) |
| 10 | −2171.42736 | −24.000000 | 1.5600000 | (L3) |
| 11* | −181.16467 | −632.035292 | | |
| 12* | −467.54839 | −38.000000 | 1.5600000 | (L2) |
| 13 | 441.56209 | −8.600000 | | |
| 14 | ∞ | 410.000000 | | (M2) |
| 15 | ∞ | 96.164001 | | (M3) |
| 16* | −248.89382 | −40.000000 | 1.5600000 | (L4) |
| 17 | −270.80367 | −211.283468 | | |
| 18 | −1633.27164 | −50.000000 | 1.5600000 | (L5) |
| 19* | 439.76407 | −84.131385 | | |
| 20 | 187.72487 | −42.000000 | 1.5600000 | (L6) |
| 21* | −508.63497 | −38.738249 | | |
| 22 | ∞ | −19.402019 | | (S) |
| 23 | −312.42160 | −30.000000 | 1.5600000 | (L7) |
| 24 | −545.38881 | −68.496963 | | |
| 25 | −133.13377 | −40.000000 | 1.5600000 | (L8) |
| 26* | 678.53406 | 2.925194 | | |
| 27 | −186.00220 | −85.000000 | 1.5600000 | (L9) |
| 28 | −305.28790 | −0.100000 | | |
| 29 | −145.48941 | −46.223784 | 1.5600000 | (L10) |
| 30* | 4767.12784 | −6.000000 | | |

(Wafer Surface)
(Date of Aspherical Surface)

| r | κ | C4 |
|---|---|---|
| 3rd Surface −372.48390 | 0.00000 | −0.540343 × 10⁻⁸ |
| C6 | C8 | C10 |
| 0.256808 × 10⁻¹² | 0.290465 × 10⁻¹⁷ | −0.427034 × 10⁻²² |
| r | κ | C4 |
| 6th Surface −467.54839 | 0.00000 | 0.622527 × 10⁻⁸ |
| 12th Surface C6 | C8 | C10 |
| 0.649449 × 10¹³ | −0.506658 × 10¹⁸ | 0.357490 × 10²⁴ |
| r | κ | C4 |
| 7th Surface −181.16467 | 0.00000 | 0.943076 × 10⁻⁸ |
| 11th Surface C6 | C8 | C10 |
| 0.256514 × 10⁻¹² | 0.303718 × 10⁻¹⁷ | 0.242059 × 10⁻²¹ |
| r | κ | C4 |
| 16th Surface −248.89382 | 0.00000 | 0.609993 × 10⁻⁸ |
| C6 | C8 | C10 |
| 0.765145 × 10⁻¹⁸ | 0.840211 × 10⁻¹⁸ | 0.188482 × 10⁻²² |
| r | κ | C4 |
| 19th Surface 439.76407 | 0.00000 | 0.481334 × 10⁻⁸ |
| C6 | C8 | C10 |
| 0.266384 × 10⁻¹³ | −0.149214 × 10⁻¹⁷ | 0.265666 × 10⁻²² |
| r | κ | C4 |
| 21st Surface −508.63497 | 0.00000 | −0.270625 × 10⁻⁷ |
| C6 | C8 | C10 |
| −0.130088 × 10⁻¹² | 0.121888 × 10⁻¹⁸ | −0.440102 × 10⁻²¹ |
| r | κ | C4 |
| 26th Surface −678.53406 | 0.00000 | −0.463518 × 10⁻⁸ |
| C6 | C8 | C10 |
| −0.381221 × 10⁻¹² | 0.150702 × 10⁻¹⁶ | −0.489031 × 10⁻²¹ |
| r | κ | C4 |
| 30th Surface 4767.12784 | 0.00000 | −0.195812 × 10⁻⁶ |
| C6 | C8 | C10 |
| 0.241786 × 10⁻¹⁰ | −0.201056 × 10⁻¹³ | 0.142658 × 10⁻¹⁶ |

FIGS. 15A to 15C are graphs showing the spherical aberration, the astigmatism and the distortion in the fourth embodiment. Further, FIGS. 16A to 16D are views each showing a lateral aberration (meridional coma) in the fourth embodiment.

In the respective aberrations graphs, NA represents a numerical aperture of the image side, Y is a height of the image, the solid line indicates a center wavelength of 157.6 nm, a broken line indicates 157.6 nm+8.6 pm, and one dotted chain line indicates 157.6 nm−8.6 pm, respectively. Further, referring to the aberration graph showing the astigmatism, S denotes a sagittal image surface, and M represents a meridional image surface.

As obvious from the respective aberration graphs, in the fourth embodiment, it can be understood that the various aberrations including the chromatic aberration can be well corrected for the exposure radiation of which the center wavelength is 157.6 nm and the full width half maximum is 10 pm.

As discussed above, the projection exposure apparatus according to each of the above first through fourth embodiments includes the catadioptric type projection optical system in which the chromatic aberration is well corrected for the exposure radiation of which the center wavelength is 180 nm or smaller and the full width half maximum is 10 pm or under, and hence the $F_2$ laser structured to attain a narrow band by a comparatively simple method can be used as the radiation source for exposure. With this construction, a large exposure power can be obtained, and a cost for maintenance of the laser radiation source decreases. It is therefore feasible to actualize the projection exposure apparatus that is low of the cost required for the laser radiation source and exhibits a high productivity.

As explained above, in the case of the $F_2$ laser, it may be considered that the band can be narrowed down to such a degree that the full width half maximum is on the order or 2 pm. As demonstrated in the first and third embodiments, a larger number of the lens elements constituting the projection optical system can be reduced in the case of using the $F_2$ laser with the full width half maximum being on the order of 2 pm as shown in the first and third embodiments than by using $F_2$ laser with the full width half maximum being on the order of 10 pm as shown in the second and fourth embodiments. Fluorite (i.e., $CaF_2$ crystal) used as a glass material is expensive and induces a loss of radiation quantity on the lens surface, which is large enough not to be ignorable in the short wavelength of 180 nm or smaller. Therefore, the effect yielded by decreasing the number of lens elements is large with respect to a transmitting efficiency of the projection optical system.

Note that all the lens elements constituting the projection optical system and the concave reflecting mirror are disposed along the optical axis excluding the plane parallel plate disposed in the vicinity of the mask and the flat reflecting mirror for separating the optical paths in the projection optical system in the first and second embodiments. As a result, all the lens elements and the concave reflecting mirror can be incorporated into one single lens barrel, and it is therefore possible to easily assemble and adjust the catadioptric optical system.

In the projection optical system according to the third and fourth embodiments, all the lens elements constituting the projection optical system and the concave reflecting mirror are disposed along the two optical axes parallel to each other, excluding the flat reflecting mirror for separating the optical paths. As a consequence, some of the lens elements and the concave reflecting mirror can be incorporated into the first lens barrel, and the remaining lens elements can be incorporated into the second lens barrel disposed in parallel to the first lens barrel. Thus, the assembly and the adjustment can be made independently respectively in the two lens barrels, and a mutual positional relation between the two lens barrels is simplified, whereby the assembly and the adjustment of the optical system can be relatively easily carried out.

Moreover, in each of the embodiments discussed above, the exposure area takes the rectangular shape (slit-like shape), and hence this is more advantageous in terms of designing and manufacturing the illumination optical system than in the apparatus with the exposure area formed in an annular shape. This configuration also enables the construction of the illumination optical system to be simplified.

In each of the embodiments discussed above, the radiation transmissive optical member such as the plane-parallel plate is disposed in close proximity to the mask, whereby substantially all the optical paths from the mask to the wafer excluding the narrow optical path between the mask and the plane-parallel plate and the narrow optical path between the wafer and the optical member proximal to the wafer, can be filled with the inert gas such as the helium gas exhibiting a high degree of cleanness. As a result, even when using the short wavelength beams such as the $F_4$ laser beams for the exposure radiation, it is feasible to effectively avoid the optical absorption and enhance the transmitting efficiency of the projection optical system. The durability and the maintainability of the projection optical system can be improved by use of the plane-parallel plate, and the residual aberration can be corrected after assembling the projection optical system.

Fifth Embodiment and Sixth Embodiment

Fifth and Sixth embodiments have constructions similar to those of the third and fourth embodiments.

Figure 17:
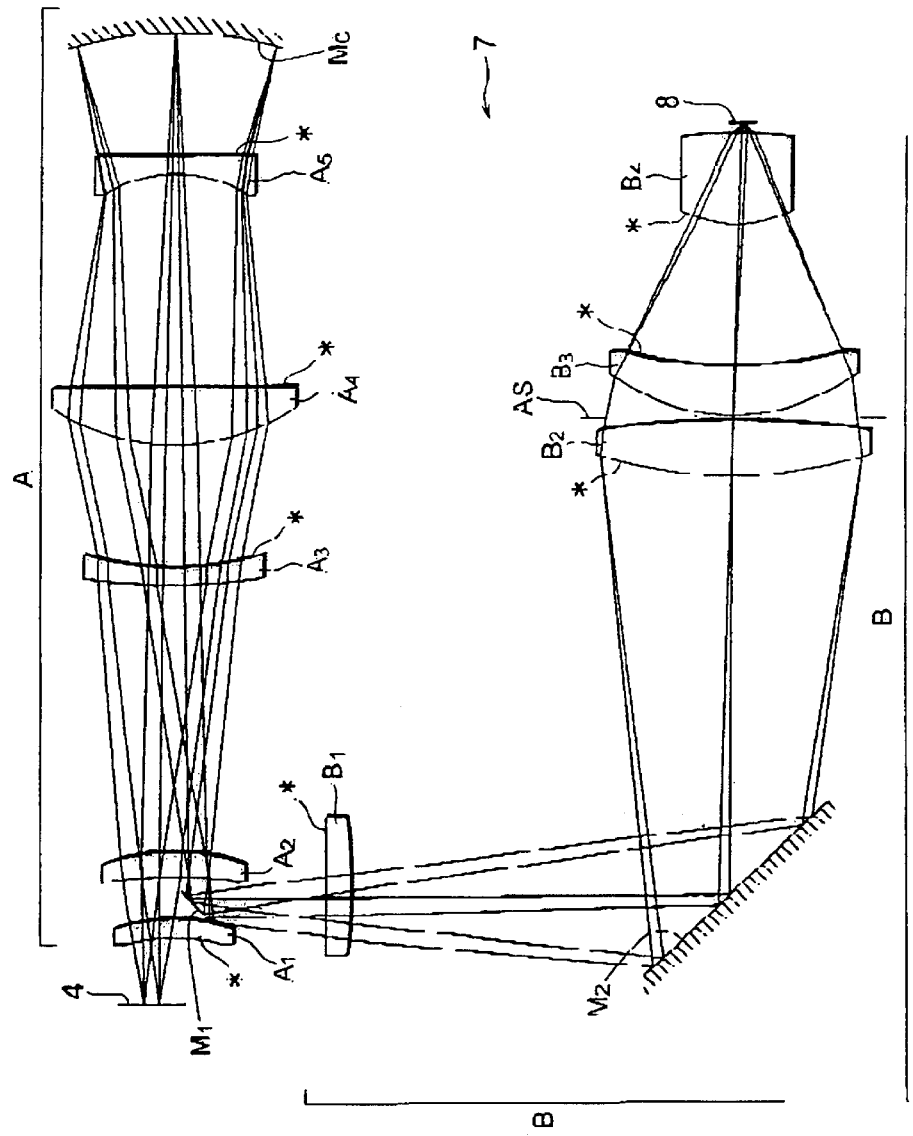
FIG. 17 is a sectional view illustrating a fifth embodiment of the catadioptric optical system according to the present invention.
Figure 20:
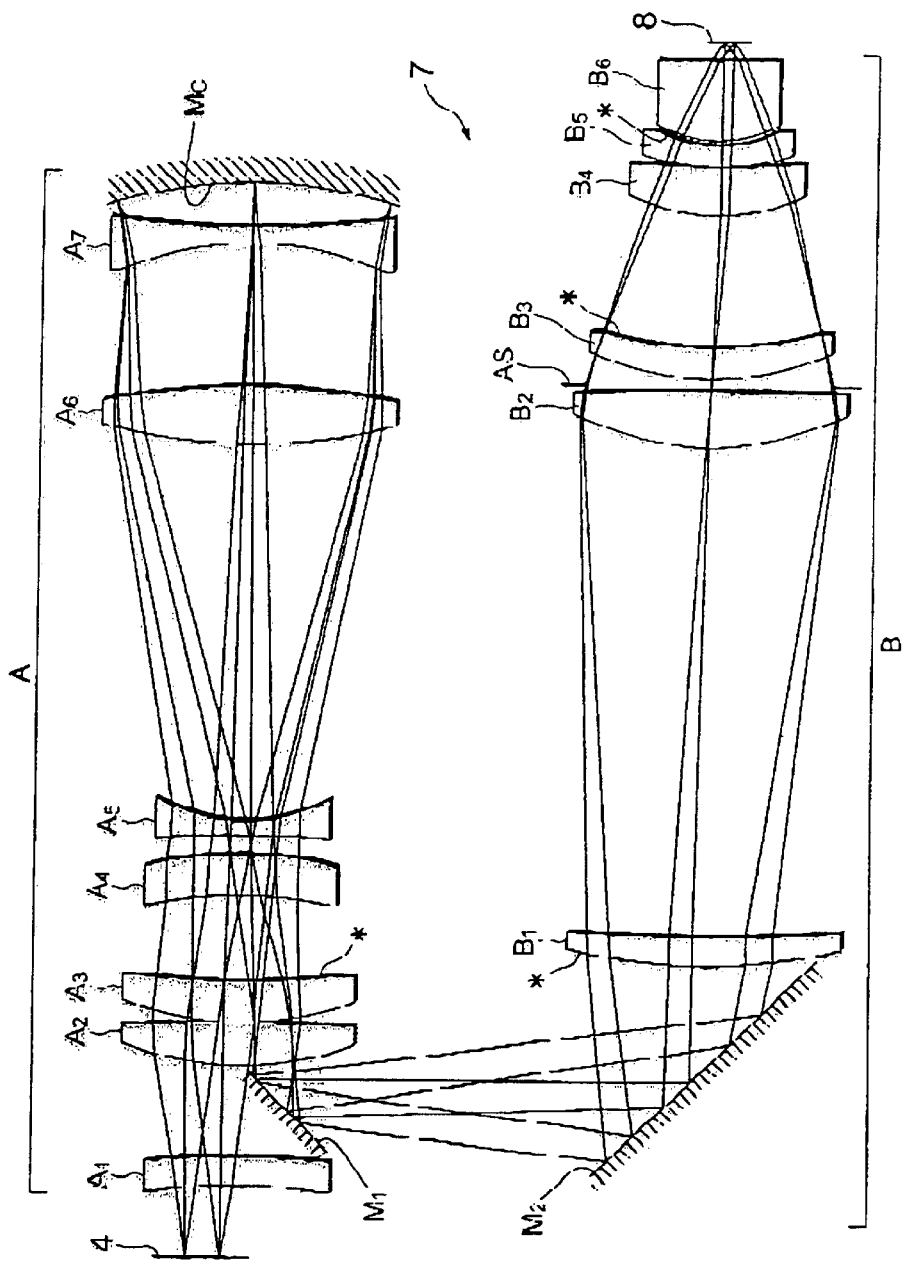
FIG. 20 is a sectional view illustrating a sixth embodiment of the catadioptric optical system according to the present invention.
Figure 22A:
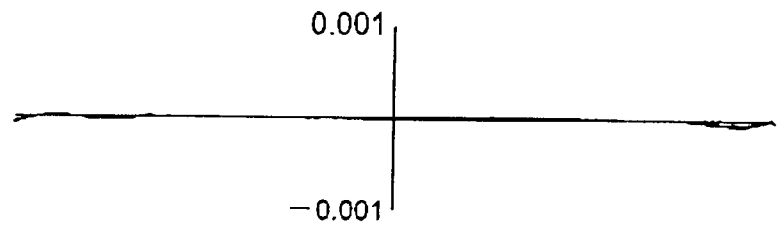
FIGS. 22A to 22D are graphs each showing the lateral aberration in the sixth embodiment.
Figure 22B:
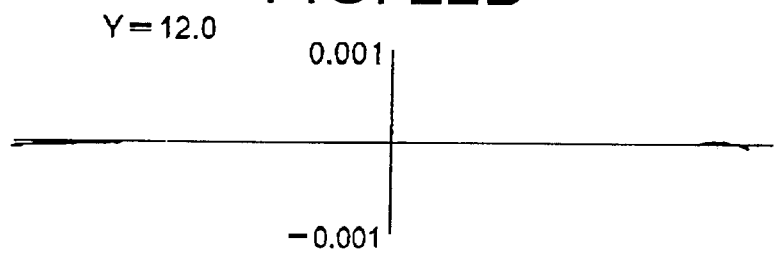
Figure 22C:
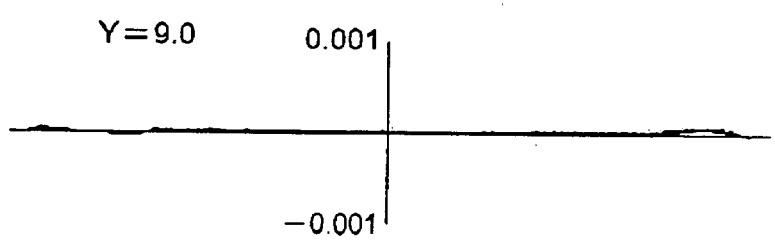
Figure 22D:
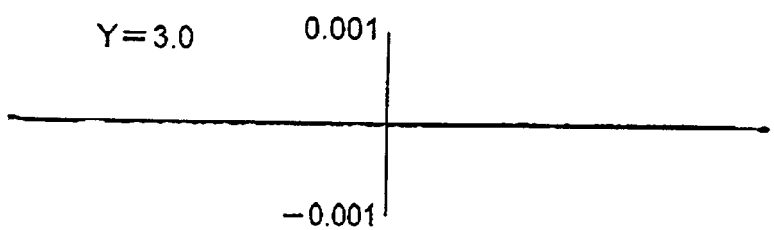
Figure 23A:
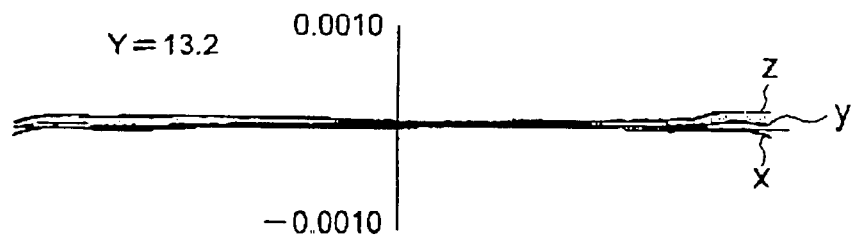
FIGS. 23A to 23D are graphs showing the lateral aberrations in a plurality of wavelengths in the sixth embodiment.
Figure 23B:
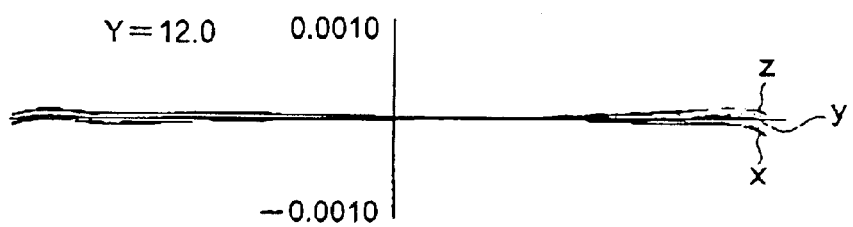
Figure 23C:
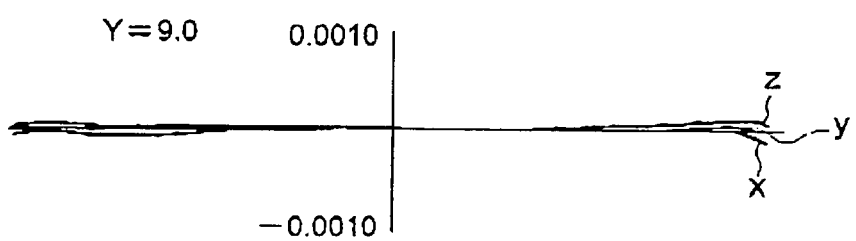
Figure 23D:
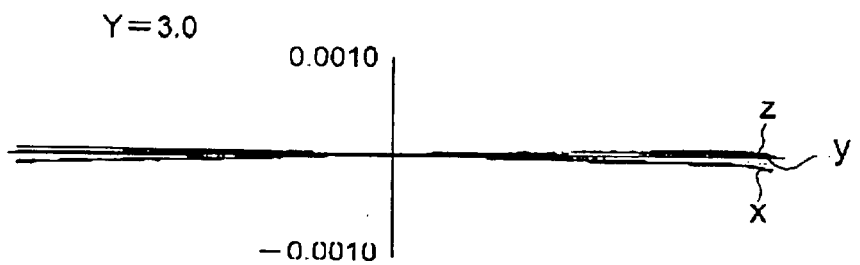

FIGS. 17 and 20 illustrate the fifth and sixth embodiments of the catadioptric optical system serving as the projection optical system of the projection exposure apparatus shown in FIG. 10. The catadioptric optical system in both of the fifth and sixth embodiments is what the present invention is applied to the projection optical system for transferring with reduction magnification, on the wafer 8 defined as a second surface, a circuit pattern on the mask (reticle) 4 defined as a first surface. This projection optical system comprises a first image forming optical system A for forming an intermediate image of the pattern on the mask 4, and a second image forming optical system B for re-imaging the intermediate image on the wafer 8. The fist image forming optical system A has a concave mirror Mc, while the second image forming optical system B has an aperture stop AS. A first reflecting surface $M_1$ for folding the optical axis at 90° is provided in the vicinity of the intermediate image so as to guide the beams from the first image forming optical system A to the second image forming optical system B. A second reflecting surface $M_2$ for further folding the optical axis at 90° is provided between the first reflecting surface $M_1$ and the aperture stop AS so that the optical axis on the reticle R is parallel to the optical axis on the wafer 8. The second reflecting surface $M_2$ may not, however, be provided.

The general data of the fifth and sixth embodiments are as follows:

Working Wavelength:157 nm ($F_2$ laser)
Magnification:¼
Image-sided numerical aperture:0.6
Maximum image height:13.2 mm In this projection optical system, the first reflecting surface $M_1$ separates the beams arriving at the concave mirror Mc from the beams coming from the concave mirror Mc, and therefore an area containing the optical axes on the mask 4 and on the wafer 8 is not a use area. That is, as in the first through fourth embodiments discussed above, the slit-like area containing no optical axis serves as an illumination area of the mask 4 and also as an exposure area of the wafer 8. Then, the slit-like use area is scanned in a short-side direction of the slit, thereby transferring an image of the mask pattern in a range elongated in the scan direction onto the wafer 8.

When the exposure area on the wafer 8 is formed in a rectangle defined by, e.g., 4.6×20 mm, there is used a range defined such as Y=4.0–13.2 mm, where Y is the image height. When the exposure area is set to 5×20 mm, there is used a range of Y=3.6–13.2 mm. When the exposure area is set to 5.6×20 mm, there is used a range of Y=3.0–13.2 m.

The configuration of the slit is not, however, necessarily the rectangle and may be, e.g., a shape of an area configured when an arbitrary straight line or curved line (e.g., circular arc)is moved in the scan direction such as a trapezoid, a hexagon, a circular arc etc.

The first image forming optical system A in the fifth embodiment illustrated in FIG. 17 is constructed of a negative meniscus lens A1 with a concave surface toward the mask 4, a positive meniscus lens A2 with a concave surface toward the mask 4, a negative meniscus lens A3 with a concave surface toward the concave mirror Mc, a biconvex lens A4, a biconcave lens A5, and a concave mirror Mc. A first reflecting surface M1 is disposed between the lenses A1 and A2.

The second image forming optical system B is constructed of a positive meniscus lens B1 with a concave surface toward the first reflecting surface M1, a biconvex lens B2, a positive meniscus lens B3 with a concave surface toward the wafer 8, and a biconvex lens B1. A second reflecting surface M2 is disposed between the lenses B1 and B2, and an aperture stop AS is disposed between the lenses B3 and B3.

Among these optical elements, a mask-sided lens surface r1 of the lens A1, a concave-mirror-sided lens surface r6 of the lens A3, a concave-mirror-sided lens surface r8 of the lens A4, a concave-mirror-sided lens surface r10 of the lens A5, a first surface r21 of the lens B1, a first surface r24 of the lens B2, a second surface r28 of the lens B3 and a first surface r29 of the lens B4, are formed as aspherical surfaces. Referring to FIG. 17, a mark "*" represents the aspherical surface. That is, the number of the lens elements used is decreased to merely 9 by adopting the eight aspherical surfaces for a technical convenience, which is a reduction down to approximately ⅓ the number of lens elements used in the projection optical system using only the spherical lenses.

The first image forming optical system A in the sixth embodiment illustrated in FIG. 20 is constructed of a negative meniscus lens A1 with a concave surface toward the mask 4, a biconvex lens A2, a positive meniscus lens A3 with a concave surface toward the concave mirror Mc, a positive meniscus lens A4 with a concave surface toward the mask 4, a biconcave lens A6, a biconvex lens A6, a biconcave lens A7, and the concave mirror Mc. The first reflecting mirror M1 is disposed between the lenses A1 and A2, and the second reflecting surface M2 is disposed subsequent to the first reflecting surface M1.

The second image forming optical system D is constructed or a positive meniscus lens B1 with a concave surface toward the wafer 8, a biconvex lens B2, two pieces of meniscus lenses B3, B4 with concave surfaces toward the wafer 8, a negative meniscus lens B5 with a concave surface toward the wafer 8, and a biconvex lens B6. The aperture stop AS is disposed between the lenses B2 and B3.

Among these optical elements, a concave mirror sided lens surface r6 of the lens A3, a first surface r30 or the lens B1, a second surface r36 of the lens B3 and a second surface r40 of the lens B5, are formed aspherical. Namely, the number of the lens elements used is decreased to merely 13 by adopting the tour aspherical surfaces which is a reduction down to approximately ½ the number of lens elements used in the projection optical system using only the spherical lenses.

Note that only the lens surfaces are formed aspherical in both of the fifth and sixth embodiments, however, the reflecting mirrors M1, M2 may also be formed aspherical.

The following Tables 5 and 6 show data in the fifth and sixth embodiments.

In each of the fifth and sixth embodiments, a glass material of all the lenses is fluorite ($CaF_2$). A refractive index of $CaF_2$ in use wavelength (157 nm) is 1.56000. Further, the optical surface with its No. marked with "*" in the first column is the aspherical surface, and the second column r on the aspherical surface indicates a radius of curvature at apex. A configuration of this aspherical surface is expressed by the above formula (a), and aspherical surface coefficients C4, C6. C8, C10 are given in [Data of Aspherical Surface]. A value of cone coefficient κ with respect to any aspherical surface is given such as κ–0.0.

TABLE 5

[Data of Optical Member]

| No | r | d | |
|---|---|---|---|
| 0 | ∞ | 83.472420 | 4 |
| * 1 | −231.87193 | 20.000000 | $A_1$ |
| 2 | −244.79824 | 50.000000 | |
| 3 | −513.72470 | 30.000000 | $A_2$ |
| 4 | −258.44409 | 826.710153 | |
| 5 | 1231.09312 | 20.000000 | $A_3$ |
| * 6 | 360.37184 | 153.952382 | |
| 7 | 247.93778 | 70.000000 | $A_4$ |
| * 8 | −3176.57963 | 258.163716 | |
| 9 | −160.72124 | 20.000000 | $A_5$ |
| *10 | 47747.21102 | 142.114876 | |
| 11 | −465.25991 | −142.114876 | $M_0$ |
| *12 | 47747.20963 | −20.000000 | $A_5$ |
| 13 | −160.72124 | −258.163716 | |
| *14 | −8176.57963 | −70.000000 | $A_4$ |
| 15 | 247.93778 | −153.952382 | |
| *16 | 360.87184 | −20.000000 | $A_3$ |
| 17 | 1231.09312 | −326.710153 | |
| 18 | −258.44409 | −30.000000 | $A_2$ |
| 19 | −513.72470 | −7.000000 | |
| 20 | ∞ | 175.000000 | $M_1$ |
| *21 | −4661.49096 | 30.000000 | $B_1$ |
| 22 | −698.03846 | 447.687777 | |
| 23 | ∞ | 498.922351 | $M_2$ |
| *24 | −411.54200 | −70.000000 | $B_2$ |
| 25 | 816.05499 | −3.000000 | |
| 26 | — | −5.000000 | A S |
| 27 | −221.06022 | −60.000000 | $B_3$ |
| *28 | 586.68226 | −173.028510 | |
| *29 | −141.10262 | −104.386800 | $B_4$ |
| 30 | 772.99694 | −14.234034 | |
| 31 | ∞ | | 8 |

[Data of Aspherical Surface]

| No — 1 | C4 — $0.777914 \times 10^{-8}$ | C6 — $0.267640 \times 10^{-12}$ |
| | C8 = $0.749968 \times 10^{-17}$ | C10 = $0.170456 \times 10^{-21}$ |
| No = 6(16) | C4 = $-0.161751 \times 10^{-8}$ | C6 = $-0.421807 \times 10^{-13}$ |
| | C8 = $0.355946 \times 10^{-18}$ | C10 = $0.665954 \times 10^{-23}$ |
| No = 8(14) | C4 = $0.206937 \times 10^{-8}$ | C6 = $0.395989 \times 10^{-13}$ |
| | C8 = $-0.856301 \times 10^{-19}$ | C10 — $-0.286013 \times 10^{-23}$ |
| No = 10(12) | C4 = $-0.199929 \times 10^{-8}$ | C6 = $0.348648 \times 10^{-13}$ |
| | C8 — $0.335332 \times 10^{-18}$ | C10 — $0.286698 \times 10^{-22}$ |
| No = 21 | C4 = $-0.126585 \times 10^{-7}$ | C6 = $-0.159095 \times 10^{-12}$ |
| | C8 = $-0.132303 \times 10^{-17}$ | C10 = $-0.213107 \times 10^{-22}$ |
| No = 24 | C4 = $0.387097 \times 10^{-8}$ | C6 = $0.124414 \times 10^{-13}$ |
| | C8 = $0.795736 \times 10^{19}$ | C10 = $-0.948948 \times 10^{24}$ |
| No = 28 | C4 = $-0.320229 \times 10^{-8}$ | C6 = $0.180878 \times 10^{-13}$ |
| | C8 — $-0.925279 \times 10^{-20}$ | C10 — $-0.800264 \times 10^{-23}$ |
| No = 29 | C4 = $0.320579 \times 10^{-7}$ | C6 = $0.265320 \times 10^{-11}$ |
| | C8 = $0.183993 \times 10^{-15}$ | C10 = $0.751169 \times 10^{-20}$ |

TABLE 6

[Data of Optical Member]

| No | r | d | |
|---|---|---|---|
| 0 | ∞ | 52.408660 | 4 |
| 1 | −377.54368 | 20.000000 | $A_1$ |
| 2 | −709.61847 | 66.700681 | |
| 3 | 247.34124 | 30.000000 | $A_2$ |
| 4 | −943.28430 | 0.081000 | |
| 5 | 251.77574 | 30.000000 | $A_3$ |
| * 6 | 1233.12732 | 60.735167 | |
| 7 | −816.07403 | 30.000000 | $A_4$ |
| 8 | −279.83058 | 14.320073 | |
| 9 | −641.14096 | 11.809800 | $A_5$ |
| 10 | 129.96846 | 276.475471 | |
| 11 | 434.42877 | 40.000000 | $A_6$ |
| 12 | −468.82151 | 103.196386 | |
| 13 | −224.16905 | 12.000000 | $A_7$ |
| 14 | 704.94761 | 30.977827 | |
| 15 | −820.24325 | −30.977827 | $M_0$ |
| 16 | 704.94761 | −12.000000 | |
| 17 | −224.16905 | −103.196386 | $A_7$ |
| 18 | −468.82151 | −40.000000 | $A_6$ |
| 19 | 434.42877 | −276.475471 | |
| 20 | 129.96846 | −11.809800 | $A_6$ |
| 21 | −641.14096 | −14.820078 | |
| 22 | −279.83058 | −30.000000 | $A_4$ |
| 23 | −316.07403 | −60.785167 | |
| *24 | 1233.12732 | −30.000000 | $A_2$ |
| 25 | 251.77574 | 0.081000 | |
| 26 | −943.28480 | −30.000000 | $A_2$ |
| 27 | 247.34124 | 3.000000 | |
| 28 | ∞ | 325.000000 | $M_1$ |
| 29 | ∞ | −74.935940 | $M_2$ |
| *30 | −420.87713 | −20.000000 | $B_1$ |
| 31 | −1292.53566 | −359.132456 | |
| 32 | 218.22714 | 40.000000 | $B_2$ |
| 33 | 6480.13829 | −8.000000 | |
| 34 | — | −5.000000 | A S |
| 35 | −191.90312 | −25.000000 | $B_3$ |
| *36 | −411.42156 | −93.480977 | |
| 37 | −151.40359 | −35.000000 | $B_4$ |
| 38 | −1731.60232 | −0.100000 | |
| 39 | −199.23988 | −15.000000 | $B_5$ |
| *40 | −95.56739 | −8.000000 | |
| 41 | −85.50345 | −56.459841 | $B_6$ |
| 42 | 772.99694 | −12.890860 | |
| 43 | ∞ | | 8 |

[Data of Aspherical Surface]

| No = 6(24) | C4 = $0.112095 \times 10^7$ | C6 = $0.256500 \times 10^{13}$ |
| | C8 — $0.415981 \times 10^{-17}$ | C10 = $0.129899 \times 10^{-22}$ |
| No — 30) | C4 — $-0.147271 \times 10^{-8}$ | C6 — $0.163160 \times 10^{-13}$ |
| | C8 = $0.800473 \times 10^{-18}$ | C10 = $-0.529681 \times 10^{-23}$ |
| No = 36 | C4 = $-0.110105 \times 10^{-7}$ | C6 = $-0.285259 \times 10^{-14}$ |
| | C8 = $0.428853 \times 10^{18}$ | C10 = $0.122213 \times 10^{-21}$ |
| No = 40 | C4 — $0.284666 \times 10^{-7}$ | C6 — $0.250172 \times 10^{-11}$ |
| | C8 = $0.828472 \times 10^{-15}$ | C10 = $-0.680282 \times 10^{-19}$ |

Figure 18A:
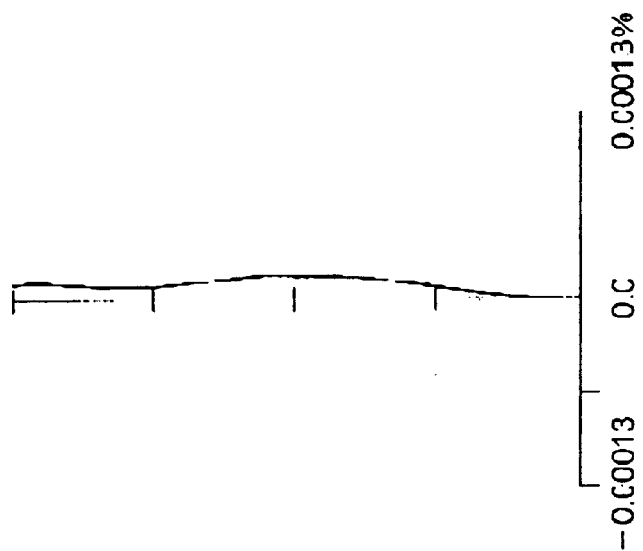
FIGS. 18A to 18C are graphs showing, respectively, the spherical aberration, the astigmatism and the distortion in the fifth embodiment.
Figure 18B:
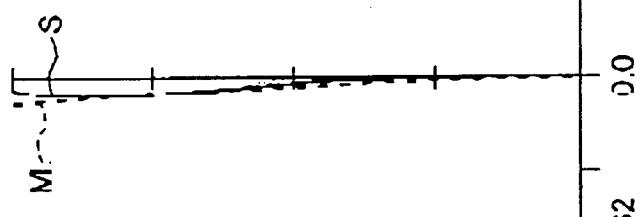
Figure 18C:
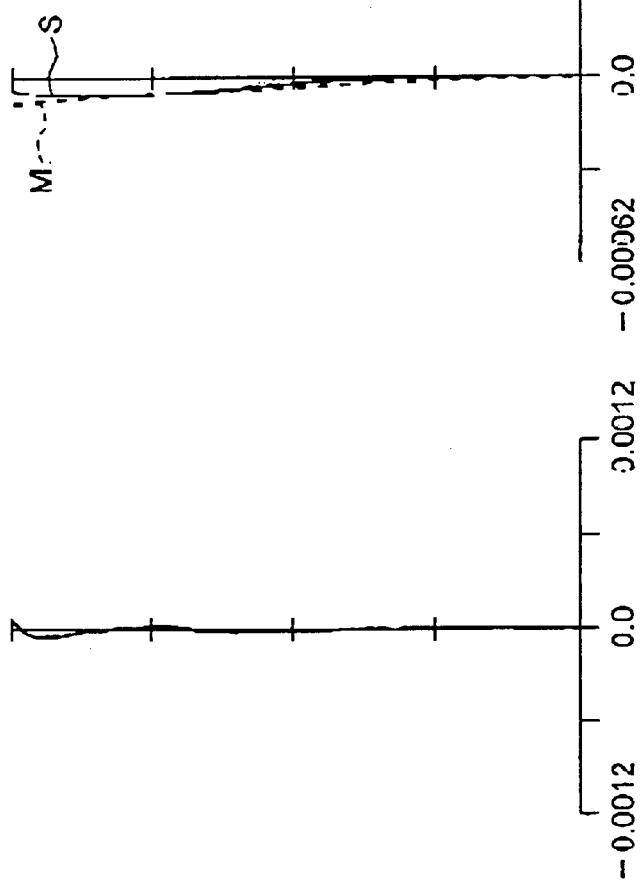
Figure 19A:
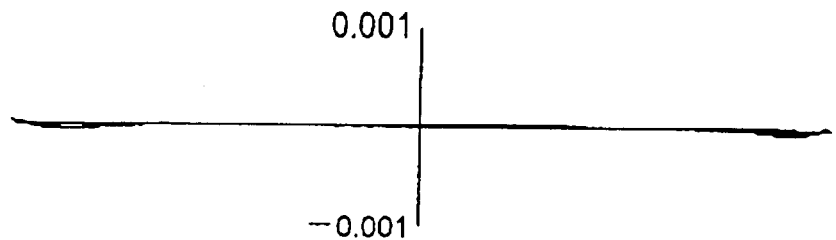
FIGS. 19A to 19D are graphs each showing the lateral aberration in the fifth embodiment.
Figure 19B:
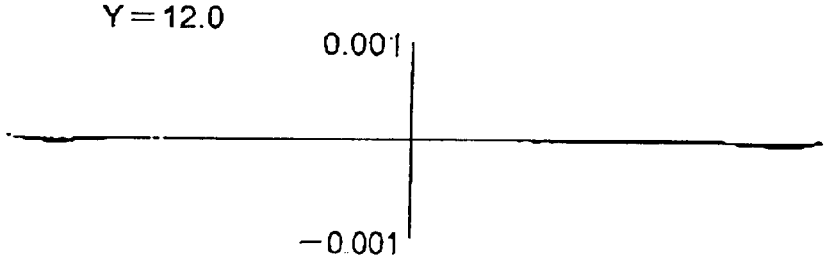
Figure 19C:
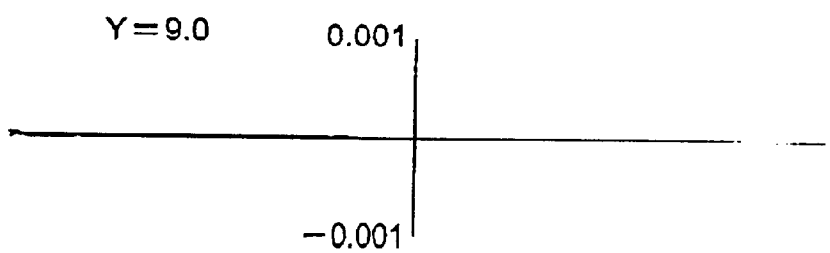
Figure 19D:
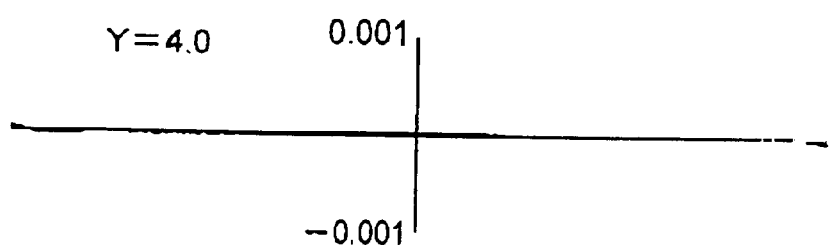

FIGS. 18A to 18C are graphs showing the spherical aberration, the astigmatism and the distortion in the fifth embodiment, and FIGS. 19A to 19D each show a lateral aberration in the fifth embodiment. Similarly, FIGS. 21A to 21C and FIGS. 22A to 22D show various aberrations in the sixth embodiment. In each of the aberration graphs, NA represents an image-sided numerical aperture, Y denotes an image height. Further, in the graph of the astigmatism, a dotted line M represents a meridional image surface, and a solid line indicates a sagittal image surface. As obvious from the respective graphs, it can be understood that each embodiment exhibits an excellent performance in which the aberration is well corrected in a state of causing almost no aberration.

Now, the full width half maximum of the $F_2$ laser is a wavelength width as narrow as 1~1.5 pm at natural oscillations (without narrowing the band) and can be therefore used by slightly narrowing the band or without narrowing the band. As shown in FIGS. 23A to 23D hereunder, the embodiment of the present invention demonstrates that the chromatic aberration is corrected within a range of ±0.5 pm (width in 1 pm). Note that the refractive index of CaF$_2$ in the vicinity of 157 nm, as explained above, changes at a rate of −2.4×10$^{−6}$ per wavelength change of +1 pm, and changes at a rate of +2.4×10$^{−6}$ per wavelength change of −1 pm. Accordingly, supposing that the refractive index of CaF$_2$ in the standard wavelength be 1.5600000, the refractive index becomes 1.5599988 in a wavelength of the standard wavelength +0.5 pm, and becomes 1.5600012 in a wavelength of the standard wavelength −0.5 pm. Referring to FIGS. 23A to 23D, Y represents a height of image, x denotes an aberration curve in the wavelength of the standard wavelength +0.5 pm, y represents an aberration curve in the standard wavelength, z indicates an aberration curve in the wavelength of the standard wavelength −0.5 pm.

As apparent from FIGS. 23A to 23D, it can be comprehended that the correction of the chromatic aberration is attained within the range of at least 1 pm in the catadioptric optical system in accordance with the embodiment of the present invention. Note that the correction of the chromatic aberration can be attained with a range of the wavelength width on the order of 10 pm if further optimization is carried out.

As discussed above, the aspherical surfaces in configurations suited to the purposes thereof are disposed in at least four places suited to the purposes thereof, whereby almost all the aberrations can be simultaneously corrected. As a result, it is feasible to eventually obtain a drastically downsized catadioptric optical system with a remarkably reduced number of lenses. Hence, it is possible to minimize the decrease in the loss of the radiation quantity while attaining the high resolution even when using the exposure radiation having the wavelength of 180 nm or under. The pattern can be transferred onto the workpiece (wafer) with a high throughput under a resolution on a sub-micron order or smaller by applying the catadioptric system of the present invention to the projection exposure apparatus.

Thus, according to the embodiments of the present invention, the maximum effect can be obtained by use of the minimum number of aspherical surface elements. As a matter of course, it is possible to obtain a further downsized catadioptric optical system with a smaller number of lens elements by providing additional aspherical surfaces over the four aspherical surfaces.

In the third, fourth and sixth embodiments, no lens element exists between the flat mirror M1 serving as a first optical path folding member and the flat mirror M2 as a second optical path folding member, i.e., there exists no lens element having the optical axis non-parallel to the direction of gravity. Hence, an asymmetric deformation caused by the gravity is brought about neither in the lens elements nor in the concave mirror, and a decline of the image forming performance can be sufficiently restrained even when trying to increase the numerical aperture of the projection optical system and enlarging the exposure area.

Now, the projection exposure apparatus in accordance with the embodiments discussed above can be manufactured by the method which follows.

What is at first prepared is the illumination optical system for illuminating the pattern on the mask with the illumination radiation of which the center wavelength is shorter than 180 nm. To be specific, there is prepared the illumination optical system for illuminating the mask pattern with the F$_2$ laser beams of which the center wavelength is 157.6 nm. At this time, the illumination optical system is constructed to supply the illumination radiation having a spectral width within a full width half maximum of 20 pm. Incidentally, what supplies the illumination radiation having a spectral width within a full width half maximum of 2 pm may also be applied.

Subsequently, the projection optical system for forming an image or the mask pattern on a photosensitive surface of a photosensitive substrate is prepared. The preparation of the projection optical system includes preparing and assembling a plurality of refracting optical elements. Then, the illumination optical system and the projection optical system are electrically, mechanically or optically connected to each other in order to attain the functions described above, thereby making it feasible to manufacture the projection exposure apparatus in each of the embodiments.

Next, one example of an operation when forming a predetermined circuit pattern on the wafer by use of the projection exposure apparatus in the embodiments discussed above, will be explained with reference to a flowchart in FIG. 24.

To start with, in step 101 in FIG. 24, a metal layer is vapor-deposited on a 1-lot wafer. In next step 102, a photo resist is coated on the metal layer on this 1-lot wafer. Thereafter, in step 103, an image of the pattern on the mask (projection original plate) 4 is sequentially transferred by exposure onto each of shot areas on the 1-lot wafer (workpiece) through the projection optical system 7 by use of the projection exposure apparatus shown in FIG. 3 that includes the projection optical system 7 in the first embodiment (FIGS. 4A and 4D). Thereafter, in step 104, a photo resist on the 1-lot wafer is developed. After this step, in step 105, etching is executed with the resist pattern serving as a mask on the 1-lot wafer. whereby a circuit pattern corresponding to the pattern on the mask 4 is formed in each shot area on each wafer. Thereafter, a circuit pattern on a higher layer is formed and so on, thereby manufacturing a device such as a semiconductor device etc. Note that the, projection optical system in the first embodiment is used in the discussion made above, however, any one of the projection optical systems in accordance with the second through sixth embodiments may also be used instead of the former projection optical system.

Now, in each of the embodiments discussed above, the projection optical system is composed of the refracting optical members, and CaF$_2$ (calcium fluoride) is used as a material of this optical member. In addition to or instead of CaF$_2$, however, there may be used, for example, crystalline materials of fluorides such as barium fluoride (BaF), lithium fluoride (LiF), , magnesium fluoride (MgF$_2$), lithium calcium aluminum fluoride (LiCaAlF$_6$) and lithium, strontium aluminum fluoride (LiSrAlF$_6$), silica doped with fluorine and quartz doped with germanium. Incidentally, it is preferable in the above description that the refracting optical member (lens element and plane parallel plate) in the projection optical system be composed of at least one kind of material among the crystalline materials or the fluorides such as calcium fluoride (CaF$_2$), , barium fluoride (BaF), lithium calcium, aluminum fluoride (L1CaAlF$_6$) and lithium strontium aluminum fluoride (LiSrAlF$_6$). Herein, lithium fluoride (LiF) is usable in terms of a transmissivity with respect to the exposure radiation of 180 nm or under but is not preferable because of having deliquescence. Magnesium fluoride (MgF$_2$) has birefringence and is therefore unpreferable for use in the projection optical system. In the illumination optical system, however, there is no problem it having the birefringence to some extent. Hence, magnesium fluorine (MgF$_2$) may be used in the illumination optical system. Silica doped with fluorine is hard to enhance uniformity of the refractive index in the material and is therefore unpreferable for use in the projection optical system.

If the illumination radiation for illuminating the mask needs to narrow the band, it is preferable that the projection optical system be composed of a single kind of optical material. Moreover, taking easiness of and a cost for manufacturing the projection optical system into consideration, it is preferable that the projection optical system be composed of only CaF$_2$.

In each of the embodiments discussed above, the exposure area is net in an off axis position for enhancing an image quality by eliminating cut-off of the beams for forming the image, and may also be set in a position containing the optical axis in order to sufficiently ensure abroad exposure area. Note that there might occur a possibility in which the image forming beams are more or less cut off and a loss of radiation (light) quantity is induced in this case, however, these phenomena do not become problems if within such a range as to be ignorable in terms of utility.

Note that the optical paths extending from the radiation source to the wafer are replaced with the helium gas, however, a part or the whole or the optical paths may also be replaced with the nitrogen (N$_2$) gas in each of the embodiments described above.

The radiation source involves the use of the F2 laser. and the spectral width is narrowed by the band narrowing device in each of the embodiments discussed above. Instead, however, there may be used high-harmonics of a solid-state laser such as a YAG laser having an oscillation spectrum in 157 mm. There may also be used high-harmonics obtained by amplifying single wavelength laser beams in an infrared region or a visible region, which are oscillated from a DFB semiconductor laser or a fiber laser, by a fiber amplifier doped with, e.g., erbium (or both of erbium and yttrium) and executing wavelength-conversion into ultraviolet beams by use of a non-linear optical crystal.

For instance, if the oscillation wavelength or the single wavelength laser beams is set within a range of 1.51~1.59 µm, 10-fold high harmonics of which an occurrence wavelength falls within a range of 151~159 nm, are outputted. In particular, if the oscillation wavelength is set within a range of 1.57~1.58 µm, there are obtained 10-fold high-harmonics of which the occurrence wavelength falls within a range of 157~158 nm, i.e., the ultraviolet beams having substantially the same wavelength as the F2 laser beams. If the oscillation wavelength is set within a range of 1.03~1.12 µm, 7-fold high harmonics of which an occurrence wavelength falls within a range of 146~160 nm, are outputted. In particular, if the oscillation wavelength is set within a range of 1.099~1.106 µm, there are obtained 7-fold high-harmonics of which the occurrence wavelength falls within a range of 157~158 nm, i.e., the ultraviolet beams having substantially the came wavelength an the F2 laser beams. Note that the yttrium-doped fiber laser is used as the single wavelength oscillation laser.

Thus, in the ease of using the high-harmonics from the laser radiation source, the high-harmonics themselves have a spectral width (e.g., on the order of 0.01 pm) with a sufficiently narrowed band. And hence this is usable as a substitute for the radiation source 1 in each of the embodiments discussed above.

If the wavelength width of the F$_2$ laser is on the order of 1~1.5 pm at natural oscillations, the band may not be narrowed.

Instead of the F2 laser, a Kr$_2$ laser for supplying a radiation having a wavelength of 147 nm, an ArKr laser for supplying a radiation having a wavelength of 135 nm and an Ar$_1$ laser for supplying a radiation having a wavelength of 126 nm, are usable as radiation sources.

Now, the present invention can be applied to both of a step and repeat method (batch exposure method) of repeating a step of batchwise transferring the mask pattern image onto one shot area on the wafer, and thereafter batchwise transferring the mask pattern image onto a next shot area by sequentially two-dimensionally moving the wafer within the plane orthogonal to the optical axis of the projection optical system, and a step-and-scan method (scan exposure method) of synchronously scanning the mask and the wafer through the projection optical system when exposing each shot area on the wafer to the radiation, wherein a projection magnification β is act as a speed ratio. It is to be noted that according to the stop-and-scan method, it is enough to obtain a preferable image forming characteristic within a slit-shaped (long and thin rectangular) exposure area, and it is therefore feasible to expose a broader shot area on the wafer to the radiation without scaling up the projection optical system.

In each of the embodiments discussed above, the rectangular exposure area is used, however, a circular are exposure area may also be used By the way, in each of the embodiments described above, the reduction type projection optical system is used, however, the projection optical system is not limited to the reduction system and may involve the use of an unit-magnification system or an enlargement system (e.g., an exposure apparatus for manufacturing liquid crystal display etc). The present invention can be further applied to not only the exposure apparatus used for manufacturing the semiconductor device but also an exposure apparatus for transferring a device pattern onto a glass plate, an exposure apparatus, used for manufacturing a thin-film magnetic head, for transferring the device pattern onto a ceramic wafer, and an exposure apparatus used for manufacturing an imaging device (CCD and so on). The present invention can be applied to an exposure for transferring a circuit pattern onto a glass substrate or a silicon wafer for manufacturing a reticle or mask.

Note that the present invention is not limited to the embodiments discussed above and can, as a matter of course, take a variety of constructions within the scope of the present invention without departing from the gist of the present invention.

What is claimed is:

1. A projection exposure apparatus for transferring a pattern on a mask onto a workpiece, comprising:

an illumination optical system, arranged to supply radiation to the mask, for supplying the radiation having a center wavelength of 180 nm or smaller; and a projection optical system, arranged in an optical path between the mask and the workpiece, including at least a concave mirror, from one to fifteen pieces of refracting lenses, and four or more aspherical surfaces.

2. A projection exposure apparatus according to claim 1, wherein said refracting lenses are all composed of the same material.

3. A projection exposure apparatus according to claim 2, wherein the material of said refracting lenses is fluorite.

4. A projection exposure apparatus according to claim 2, wherein said illumination optical system supplies the illumination radiation having a center wavelength on the order of 180 nm or smaller and a full width half maximum of 10 pm or smaller.

5. A projection exposure apparatus according to claim 1, wherein each said refracting lens contains fluorite.

6. A projection exposure apparatus according to claim 1, wherein said projection optical system forms an intermediate image of said mask, and includes a first image forming optical system disposed on an optical path between said mask and the intermediate image and a second image forming optical system disposed on an optical path between the intermediate image and said workpiece, and one of said first and second image forming optical systems includes at least one concave mirror, and said other image forming optical system includes an aperture stop.

7. A projection exposure apparatus according to claim 6, wherein at least one concave mirror is positioned in said first image forming optical system, and said aperture stop is positioned in said second image forming optical system.

8. A projection exposure apparatus according to claim 6, further comprising a reflecting mirror for guiding the beams from said first image forming optical system to said second image forming optical system.

9. A projection exposure apparatus according to claim 1, wherein only one of two lens surfaces possessed by one said refracting lens is formed as an aspherical surface.

10. An exposure method of illuminating a mask with an exposure radiation and projecting a pattern on said mask onto a workpiece through a projection optical system, comprising:

a step of forming an image of said mask pattern on said workpiece by use of a projection exposure apparatus according to claim 1.

11. A catadioptric optical system for forming an image of a first surface onto a second surface, comprising:

a first image forming system, including a concave mirror, for forming an intermediate image of the first surface;

a second image forming system, including an aperture stop, for re-imaging the intermediate image onto the second surface; and a reflecting surface, arranged in an optical path between the first surface and the second surface, for guiding a beam from the first surface toward the second image forming system;

wherein the catadioptric optical system includes from one to fifteen pieces of refracting lenses and four or more aspherical surfaces.

12. A catadioptric optical system according to claim 11, wherein said refracting lenses are all composed of the same glass material.

13. A projection exposure apparatus for transferring a pattern on a mask onto a workpiece, comprising:

an illumination optical system, arranged to supply radiation to the mask, for supplying the radiation having a center wavelength of 180 nm or smaller and a full width half maximum of 20 pm or smaller; and a catadioptric projection optical system, arranged in an optical path between said mask and said workpiece, including lens elements and a concave reflecting mirror;

wherein said lens elements and said concave reflecting mirror are so positioned as to correct substantially a chromatic aberration of said projection optical system with respect to the illumination radiation.

14. A projection exposure apparatus according to claim 13, wherein all said lens elements and said concave reflecting mirror of said projection optical system are disposed along a common optical axis.

15. A projection exposure apparatus according to claim 14, wherein said projection optical system is constructed of only one concave reflecting mirror, a plurality of lens elements and one or a plurality of flat reflecting mirrors.

16. A projection exposure apparatus according to claim 15, wherein the full width half maximum of the illumination radiation is 2 pm or smaller.

17. A projection exposure apparatus according to claim 16, wherein said projection optical system includes a first image forming optical system for forming a primary image of the pattern on the basis of beams from said mask, and a second image forming optical system for forming a secondary image of the pattern on said workpiece on the basis of beams from the primary image.

18. A projection exposure apparatus according to claim 17, wherein said projection exposure apparatus is constructed to satisfy the following condition:

$$0.7 < h1/h2 < 1.4$$

where h1 is a maximum clear aperture diameter of a lens of said first image forming optical system, and h2 is a maximum clear aperture diameter of a lens of said second image forming optical system.

19. A projection exposure apparatus according to claim 14, wherein said projection optical system includes a first image forming optical system for forming a primary image of the pattern on the basis of beams from said mask, and a second image forming optical system for forming a secondary image of the pattern on said workpiece on the basis of beams from the primary image.

20. A projection exposure apparatus according to claim 13, wherein said projection optical system is constructed of only one concave reflecting mirror, a plurality of lens elements and one or a plurality of flat reflecting mirrors.

21. A projection exposure apparatus according to claim 13, wherein the full width half maximum of the illumination radiation is 2 pm or smaller.

22. A projection exposure apparatus according to claim 21, wherein all said lens elements and said concave reflecting mirror of said projection optical system are disposed along a common optical axis.

23. A projection exposure apparatus according to claim 22, wherein said projection optical system includes a first image forming optical system for forming a primary image of the pattern on the basis of beams from said mask, and a second image forming optical system for forming a secondary image of the pattern on said workpiece on the basis of beams from the primary image.

24. A projection exposure apparatus according to claim 21, wherein said projection optical system includes a first image forming optical system for forming a primary image of the pattern on the basis of beams from said mask, and a second image forming optical system for forming a secondary image of the pattern on said workpiece on the basis of beams from the primary image.

25. A projection exposure apparatus according to claim 13, wherein said projection optical system includes a first image forming optical system for forming a primary image of the pattern on the basis of beams from said mask, and a second image forming optical system for forming a secondary image of the pattern on said workpiece on the basis of beams from the primary image.

26. A projection exposure apparatus according to claim 25, wherein said projection exposure apparatus is constructed to satisfy the following condition:

$$0.7 < h1/h2 < 1.4$$

where h1 is a maximum clear aperture diameter of a lens of said first image forming optical system, and h2 is a maximum clear aperture diameter of a lens of said second image forming optical system.

27. A projection optical system for transferring a pattern on a mask onto a workpiece, comprising:
   an illumination optical system, arranged to supply radiation to the mask, for supplying the radiation having a center wavelength of 180 nm or smaller and a full width half maximum of 20 pm or smaller; and
   a catadioptric projection optical system, arranged in an optical path between the mask and the workpiece, including an optical member with refracting power, and a radiation transmissive optical member, disposed in close to said mask, for separating said optical member with refracting power from an outside atmosphere;
      wherein a spacing, along a direction parallel to the optical axis of said catadioptric projection optical system, between said mask and said radiation transmissive optical member is set to equal to or smaller than 50 mm.

28. A projection exposure apparatus according to claim 27, wherein said radiation transmissive optical member has a plane-parallel plate.

29. A projection exposure apparatus according to claim 28, wherein said plane-parallel plate is so provided as to be exchangeable.

30. A projection exposure apparatus according to claim 27, wherein the full width half maximum of the illumination radiation is equal to or smaller than 20 pm.

31. A projection exposure apparatus according to claim 30, wherein said optical member with refracting power and a concave reflecting mirror of said projection optical system are disposed along a common optical axis.

32. A projection exposure apparatus according to claim 31, wherein said projection optical system includes a first image forming optical system for forming a primary image of the pattern on the basis of beams from said mask, and a second image forming optical system for forming a secondary image of the pattern on said workpiece on the basis of beams from the primary image.

33. A projection exposure apparatus according to claim 31, wherein said projection optical system is constructed of only one concave reflecting mirror, a plurality of lens elements and one or a plurality of flat reflecting mirrors.

34. A projection exposure apparatus according to claim 30, wherein said projection optical system includes a first image forming optical system for forming a primary image of the pattern on the basis of beams from said mask, and a second image forming optical system for forming a secondary image of the pattern on said workpiece on the basis of beams from the primary image.

35. A projection exposure apparatus according to claim 34, wherein said projection exposure apparatus is constructed to satisfy the following condition:

$$0.7 < h1/h2 < 1.4$$

where h1 is a maximum clear aperture diameter of a lens of said first image forming optical system, and h2 is a maximum clear aperture diameter of a lens of said second image forming optical system.

36. A projection exposure apparatus according to claim 27, wherein the full width half maximum of the illumination radiation is 2 pm or smaller.

37. A projection exposure apparatus according to claim 36, wherein said projection optical system includes a first image forming optical system for forming a primary image of the pattern on the basis of beams from said mask, and a second image forming optical system for forming a secondary image of the pattern on said workpiece on the basis of beams from the primary image.

38. A projection exposure apparatus according to claim 36, wherein all lens elements and a concave reflecting mirror of said projection optical system are disposed along a common optical axis.

39. A projection exposure apparatus according to claim 27, wherein a spacing between said mask along a direction parallel to the optical axis of said projection optical system and said radiation transmissive optical member, is set to equal to or smaller than 20 mm.

40. A projection exposure apparatus according to claim 27, wherein a spacing between said mask along a direction parallel to the optical axis of said projection optical system and said radiation transmissive optical member, is set to equal to or smaller than 5 mm.

41. A projection exposure apparatus according to claim 27, wherein a spacing between said mask along a direction parallel to the optical axis of said projection optical system and said radiation transmissive optical member, is set to equal to or smaller than 1 mm.

42. A projection exposure apparatus according to claim 27, wherein an internal atmosphere of said catadioptric projection optical system has an inert gas, and
   the internal atmosphere of said catadioptric projection optical system exhibits a higher degree of cleanness than that of an atmosphere peripheral to said mask.

43. A projection exposure apparatus according to claim 42, further comprising:
   a casing for encasing said mask by sealing.

44. A projection exposure apparatus according to claim 27, wherein an internal atmosphere of said catadioptric projection optical system has an inert gas, and
   the internal atmosphere of said catadioptric projection optical system exhibits a higher degree of cleanness than that of an atmosphere peripheral to said workpiece.

45. A projection exposure apparatus according to claim 44, wherein the internal atmosphere of said catadioptric projection optical system exhibits a higher degree of cleanness than that of an atmosphere peripheral to said mask.

46. An exposure method for illuminating a mask with an exposure radiation and projecting a pattern on the mask onto a workpiece through a projection optical system, comprising:
   a step of forming an image of the mask pattern onto the workpiece by use of a projection exposure apparatus according to claim 13.

47. An exposure method for illuminating a mask with an exposure radiation and projecting a pattern on the mask onto a workpiece through a projection optical system, comprising:
   a step of forming an image of the mask pattern onto the workpiece by use of a projection exposure apparatus according to claim 27.

48. A projection exposure apparatus according to claim 13, wherein said projection optical system defines a rectangular exposure area on said workpiece.

49. A projection exposure apparatus according to claim 27, wherein said projection optical system defines a rectangular exposure area on said workpiece.

50. An exposure method for illuminating a mask with an exposure radiation and projecting a pattern on the mask onto a workpiece through a projection optical system, comprising:

a step of forming an image of the mask pattern onto the workpiece by use of a projection exposure apparatus according to claim 48.

51. An exposure method for illuminating a mask with an exposure radiation and projecting a pattern on the mask onto a workpiece through a projection optical system, comprising:
    a step of forming an image of the mask pattern onto the workpiece by use of a projection exposure apparatus according to claim 49.

52. A projection exposure apparatus for transferring a pattern on a mask onto workpiece, comprising:
    an illumination optical system, arranged to supply radiation to the mask, for supplying the radiation to the mask; and
    a catadioptric projection optical system arranged in an optical path between the mask and the workpiece;
        wherein the catadioptric projection optical system comprises:
            a first image forming optical system, including a concave reflecting mirror and a refracting optical member that are disposed along a first optical axis, for forming an intermediate image of the pattern,
            a second image forming optical system, including a refracting optical member disposed along a second optical axis, for forming a reduced image of said intermediate image onto the workpiece,
            a first optical path deflecting member disposed between the first image forming optical system and the second image forming optical system, and
            a second optical path deflecting member disposed between the first optical path deflecting member and the second image forming optical system,
                wherein the first optical axis and the second optical axis are parallel to each other, and
                wherein an optical path between the first optical path deflecting member and the second optical path deflecting member has no refractive optical member.

53. A projection exposure apparatus according to claim 52, wherein the reduced image is formed in parallel to the pattern surface, and
    the first and second optical axes are positioned substantially in parallel to a direction of gravity.

54. An exposure method of illuminating a mask with an exposure radiation and projecting a pattern on the mask onto a workpiece through a projection optical system, comprising:
    a step of forming an image of said mask pattern onto the workpiece by use of a projection exposure apparatus according to claim 53.

55. A projection optical system applicable to lithographic apparatus for illuminating a pattern on a mask with a radiation having predetermined wavelength, and transferring the pattern onto a workpiece, the system comprising:
    at least a concave reflecting mirror;
    from one to fifteen refracting lenses; and
    four or more aspherical surfaces,
        wherein the projection optical system is optimized to radiation from an $F_2$ laser.

56. A projection optical system according to claim 55, wherein all refracting lenses among said refracting lenses are formed of the same material.

57. A projection optical system according to claim 56, wherein said material includes fluorite.

58. A projection optical system according to claim 56, wherein said refracting lenses and said concave reflecting mirror arranged so as to correct a chromatic aberration of said projection optical system caused by said radiation.

59. A projection optical system according to claim 55, and which includes:
    a catadioptric first imaging optical system; and
    a dioptric second imaging optical system.

60. A projection optical system according to claim 59, wherein said first imaging optical system is disposed in an optical path between the mask and the second imaging optical system.

61. A projection optical system according to claim 59, wherein said first imaging optical system includes a plurality of lenses and an optical path deflecting member, and wherein at least one lens among said plurality of lenses is disposed in an optical path between the mask and the optical path deflecting member.

62. A projection optical system according to claim 59, wherein said first image forming optical system includes a negative lens disposed close to the concave reflecting mirror.

63. An exposure apparatus for transferring a pattern on a mask onto workpiece, comprising:
    an illumination optical system, arranged to supply radiation to the mask, for supplying the radiation having a center wavelength of 180 nm or smaller and a full width half maximum of 20 pm or smaller; and
    a projection optical system, arranged in an optical path between the mask and the workpiece, including an optical member with refracting power, and a radiation transmissive optical member for separating said optical member with refracting power from an outside atmosphere;
        wherein an internal atmosphere of said projection optical system has an inert gas, and
        wherein the inert gas within said projection optical system exhibits a higher degree of cleanness than that of an atmosphere peripheral to said mask and said workpiece.

64. An exposure apparatus according to claim 63, further comprising:
    a first casing, arranged so as to encase the mask, for filling an optical path between the illumination optical system and the projection optical system with an inert gas; and
    a second casing, arranged so as to encase the workpiece, for filling an optical path between the projection optical system and the workpiece with an inert gas,
        wherein the inert gas within said projection optical system exhibits a higher degree of cleanness than that of the inert gas within said first and second casing.

65. An exposure apparatus according to claim 63, further comprising:
    a first stage, arranged between said illumination optical system and said projection optical system, for placing the mask thereon;
    a second stage, arranged to a workpiece side of said projection optical system, for placing the workpiece thereon;
    a first casing, arranged so as to encase the first stage, for filling an optical path between the illumination optical system and the projection optical system with an inert gas; and
    a second casing, arranged so as to encase the second stage, for filling an optical path between the projection optical system and the workpiece with an inert gas,
        wherein the inert gas within said projection optical system exhibits a higher degree of cleanness than that of the inert gas within said first casing and the inert gas within said second casing.

66. An exposure apparatus according to claim 63, wherein said illumination optical system includes an F₂ laser.

67. An exposure apparatus according to claim 63, wherein the inert gas within said projection optical system includes a helium gas.

68. An exposure method of illuminating a mask with an exposure radiation and projecting a pattern on the mask onto a workpiece, comprising:
   a step of forming an image of the pattern on the mask onto said workpiece by use of an exposure apparatus according to claim 63.

69. A catadioptric projection optical system for forming an image of a first surface onto a second surface, comprising:
   an area of field of view extended along a predetermined direction;
   an optical path deflecting member arranged in an optical path between the first surface and the second surface;
   a concave reflecting mirror arranged in an optical path between the optical path deflecting member and the second surface; and
   a refracting lens arranged in an optical path between the concave reflecting mirror and the second surface,
      wherein the refracting lens is arranged along a predetermined optical axis,
      wherein the optical path deflecting member is arranged in a space which does not contain the predetermined optical axis, and
      wherein a space passed through by a radiation from the first surface toward the optical path deflecting member and passed through by a radiation reflected by the optical path deflecting member does not include the predetermined optical axis.

70. A catadioptric projection optical system according to claim 69, wherein said area of field of view is rectangular shape.

71. A catadioptric projection optical system according to claim 69, wherein the predetermined optical axis has a portion located between the optical path deflecting element and a radiation from the concave reflecting mirror toward the refractive lens.

72. A catadioptric projection optical system according to claim 71, wherein an intermediate image of the first surface is formed in an optical path between the concave reflecting mirror and the refractive lens.

73. A catadioptric projection optical system according to claim 69, wherein the predetermined optical axis extends along a straight line.

74. A catadioptric projection optical system according to claim 73, wherein the concave reflecting member is arranged along the predetermined optical axis.

75. An exposure apparatus for transferring a pattern on a mask onto a workpiece, comprising:
   an illumination optical system arranged to supply a radiation to said mask; and
   a catadioptric projection optical system according to claim 69, arranged in an optical path between the mask and the workpiece, for projecting an image of the pattern.

76. An exposure apparatus according to claim 75, further comprising:
   a first stage, arranged between said illumination optical system and said projection optical system, for placing the mask thereon and moving along at least a scanning direction; and
   a second stage, arranged to a workpiece side of said projection optical system, for placing the workpiece thereon;
      wherein the predetermined direction of the area of field of view crosses the scanning direction at the first surface.

77. An imaging method comprising:
   a step of forming an image of a first surface onto a second surface by use of the catadioptric projection optical system according to claim 69.

78. A scanner for moving a mask and a workpiece and projecting a pattern on the mask onto the workpiece, comprising:
   an illumination optical system arranged to supply a radiation to the mask;
   a catadioptric projection optical system, arranged in an optical path between a first surface and a second surface, for projecting the pattern onto the workpiece based on the radiation;
   a first stage, arranged between the illumination optical system and the catadioptric projection optical system, for placing the mask on the first surface;
   a second stage, arranged to the second surface side of the catadioptric projection optical system, for placing the workpiece on the second surface,
      wherein the catadioptric projection optical system comprises:
         an optical path deflecting member arranged in an optical path between the first surface and the second surface;
         a concave reflecting mirror arranged in an optical path between the optical path deflecting member and the second surface; and
         a refracting lens arranged in an optical path between the concave reflecting mirror and the second surface,
            wherein the refracting lens is arranged along a predetermined optical axis,
            wherein the optical path deflecting member is arranged in a space which does not contain the predetermined optical axis,
            wherein a radiation from the first surface toward the optical path deflecting member and a radiation reflected by the optical path deflecting member pass through a predetermined space, and
            wherein the predetermined space extends across a moving direction of the mask.

79. A scanner according to claim 78, wherein the predetermined optical axis has a portion located between the optical path deflecting member and a radiation from the concave reflecting mirror toward the refractive lens.

80. A scanner according to claim 79, wherein the catadioptric projection optical system comprises an area of field of view on the first surface, and wherein the area of field of view is of rectangular shape.

81. A scanner according to claim 80, wherein the catadioptric projection optical system forms an intermediate image of the pattern in an optical path between the concave reflecting mirror and the refracting lens.

82. A scanner according to claim 78, wherein the predetermined optical axis extends along a straight line.

83. A scanner according to claim 82, wherein the concave reflecting mirror is arranged along the predetermined optical axis.

84. A scanner according to claim 83, wherein the predetermined space does not include the predetermined optical axis.

85. An exposure method comprising:
a step of forming an image of a pattern on a mask onto a workpiece by use of a scanner according to claim 78.

86. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 4.

87. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 8.

88. An imaging method comprising:
a step of forming an image of a first surface onto a second surface by use of a catadioptric optical system according to claim 11.

89. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 18.

90. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 23.

91. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 24.

92. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 28.

93. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 29.

94. An exposure method of illuminating a mask with an exposure radiation and projecting a pattern on the mask onto a workpiece through a projection optical system, comprising:
a step of forming an image of the mask pattern on the workpiece by use of a projection exposure apparatus according to claim 33.

95. An imaging method comprising:
a step of forming an image of a first surface onto a second surface by use of a projection optical system according to claim 57.

96. An imaging method comprising:
a step of forming an image of a first surface onto a second surface by use of a projection optical system according to claim 58.

97. An imaging method comprising:
a step of forming an image of a first surface onto a second surface by use of a projection optical system according to claim 60.

98. An imaging method comprising:
a step of forming an image of a first surface onto a second surface by use of a projection optical system according to claim 61.

99. An imaging method comprising:
a step of forming an image of a first surface onto a second surface by use of a projection optical system according to claim 62.

100. An exposure method of illuminating a mask with an exposure radiation and projecting a pattern on the mask onto a workpiece through a projection optical system, comprising:
a step of forming an image of the mask pattern on the workpiece by use of an exposure apparatus according to claim 64.

101. An exposure method of illuminating a mask with an exposure radiation and projecting a pattern on the mask onto a workpiece through a projection optical system, comprising:
a step of forming an image of the mask pattern on the workpiece by use of an exposure apparatus according to claim 67.

102. An imaging method comprising:
a step of forming an image of a first surface onto a second surface by use of a catadioptric projection optical system according to claim 72.

103. An exposure method comprising:
a step of forming an image of a first surface onto a second surface by use of a scanner according to claim 81.

104. An exposure method comprising:
a step of forming an image of a first surface onto a second surface by use of a scanner according to claim 84.

* * * * *